(12) United States Patent
McLaurin et al.

(10) Patent No.: US 12,126,143 B2
(45) Date of Patent: Oct. 22, 2024

(54) METHOD OF MANUFACTURE FOR AN ULTRAVIOLET EMITTING OPTOELECTRONIC DEVICE

(71) Applicant: KYOCERA SLD Laser, Inc., Goleta, CA (US)

(72) Inventors: Melvin McLaurin, Santa Barbara, CA (US); James W. Raring, Santa Barbara, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 775 days.

(21) Appl. No.: 17/320,856

(22) Filed: May 14, 2021

(65) Prior Publication Data

US 2021/0273415 A1    Sep. 2, 2021

Related U.S. Application Data

(63) Continuation-in-part of application No. 16/903,188, filed on Jun. 16, 2020, now Pat. No. 11,387,629,
(Continued)

(51) Int. Cl.
*H01S 5/343* (2006.01)
*H01S 5/02* (2006.01)
(Continued)

(52) U.S. Cl.
CPC ........ *H01S 5/34333* (2013.01); *H01S 5/0206* (2013.01); *H01S 5/021* (2013.01);
(Continued)

(58) Field of Classification Search
CPC .. H01S 5/34333; H01S 5/0206; H01S 5/0215; H01S 5/0216; H01S 5/0217
See application file for complete search history.

(56) References Cited

U.S. PATENT DOCUMENTS

| 4,341,592 A | 7/1982 | Shortes et al. |
| 4,860,687 A | 8/1989 | Frijlink |

(Continued)

FOREIGN PATENT DOCUMENTS

| JP | 2007068398 | 3/2007 |
| JP | 2007173467 | 7/2007 |
| WO | 2008041521 | 4/2008 |

OTHER PUBLICATIONS

Ghazai, "Quaternary ultraviolet AlInGaN MQW laser diode performance using quaternary AlInGaN electron blocking layer," May 2011, Optics Express, vol. 19, No. 10, 9245-9254. (Year: 2011).*

(Continued)

*Primary Examiner* — Michael Carter
(74) *Attorney, Agent, or Firm* — Kilpatrick Townsend & Stockton LLP

(57) ABSTRACT

Methods for fabricating ultraviolet laser diode devices include providing substrate members comprising gallium and nitrogen or aluminum and nitrogen, forming an epitaxial material overlying a surface region of the substrate members, patterning the epitaxial material to form epitaxial mesa regions, depositing a bond media on at least one of the epitaxial mesa regions, bonding the bond media on at least one of the epitaxial mesa regions to a handle substrate, subjecting the sacrificial layer to an energy source to initiate release of the substrate member and transfer the at least one of the epitaxial mesa regions to the handle substrate, and processing the at least one of the epitaxial mesa regions to form the ultraviolet laser diode device.

19 Claims, 38 Drawing Sheets epi design for semipolar 300 nm laser diode with PEC etchable sacrificial layer

Related U.S. Application Data which is a continuation of application No. 16/217,359, filed on Dec. 12, 2018, now Pat. No. 10,720,757, which is a continuation of application No. 15/612,897, filed on Jun. 2, 2017, now Pat. No. 10,193,309, which is a continuation of application No. 14/968,710, filed on Dec. 14, 2015, now Pat. No. 9,711,949, which is a continuation of application No. 14/534,636, filed on Nov. 6, 2014, now Pat. No. 9,246,311.

(60) Provisional application No. 63/025,449, filed on May 15, 2020.

(51) Int. Cl.
*H01S 5/0234* (2021.01)
*H01S 5/042* (2006.01)
*H01S 5/22* (2006.01)
*H01S 5/323* (2006.01)
*H01S 5/20* (2006.01)
*H01S 5/30* (2006.01)

(52) U.S. Cl.
CPC .......... *H01S 5/0213* (2013.01); *H01S 5/0215* (2013.01); *H01S 5/0216* (2013.01); *H01S 5/0217* (2013.01); *H01S 5/0218* (2013.01); *H01S 5/0234* (2021.01); *H01S 5/0425* (2013.01); *H01S 5/22* (2013.01); *H01S 5/2214* (2013.01); *H01S 5/222* (2013.01); *H01S 5/32308* (2013.01); *H01S 5/04254* (2019.08); *H01S 5/2009* (2013.01); *H01S 5/2031* (2013.01); *H01S 5/30* (2013.01); *H01S 2301/173* (2013.01)

(56) References Cited

U.S. PATENT DOCUMENTS

| | | | |
|---|---|---|---|
| 4,911,102 | A | 3/1990 | Manabe et al. |
| 5,331,654 | A | 7/1994 | Jewell et al. |
| 5,334,277 | A | 8/1994 | Nakamura |
| 5,366,953 | A | 11/1994 | Char et al. |
| 5,474,021 | A | 12/1995 | Tsuno et al. |
| 5,527,417 | A | 6/1996 | Tida et al. |
| 5,562,127 | A | 10/1996 | Fanselow et al. |
| 5,607,899 | A | 3/1997 | Yoshida et al. |
| 5,632,812 | A | 5/1997 | Hirabayashi |
| 5,696,389 | A | 12/1997 | Ishikawa et al. |
| 5,710,057 | A | 1/1998 | Kenney |
| 5,821,555 | A | 10/1998 | Saito et al. |
| 5,888,907 | A | 3/1999 | Tomoyasu et al. |
| 5,926,493 | A | 7/1999 | O'Brien et al. |
| 5,951,923 | A | 9/1999 | Horie et al. |
| 5,985,687 | A | 11/1999 | Bowers et al. |
| 6,069,394 | A | 5/2000 | Hashimoto et al. |
| 6,147,953 | A | 11/2000 | Duncan |
| 6,153,010 | A | 11/2000 | Kiyoku et al. |
| 6,239,454 | B1 | 5/2001 | Glew et al. |
| 6,379,985 | B1 | 4/2002 | Cervantes et al. |
| 6,451,157 | B1 | 9/2002 | Hubacek |
| 6,489,636 | B1 | 12/2002 | Goetz et al. |
| 6,562,127 | B1 | 5/2003 | Kud et al. |
| 6,586,762 | B2 | 7/2003 | Kozaki |
| 6,635,904 | B2 | 10/2003 | Goetz et al. |
| 6,680,959 | B2 | 1/2004 | Tanabe et al. |
| 6,734,461 | B1 | 5/2004 | Shiomi et al. |
| 6,755,932 | B2 | 6/2004 | Masuda et al. |
| 6,809,781 | B2 | 10/2004 | Setlur et al. |
| 6,814,811 | B2 | 11/2004 | Ose |
| 6,833,564 | B2 | 12/2004 | Shen et al. |
| 6,858,081 | B2 | 2/2005 | Biwa et al. |
| 6,920,166 | B2 | 7/2005 | Akasaka et al. |
| 7,009,199 | B2 | 3/2006 | Hall |
| 7,033,858 | B2 | 4/2006 | Chai et al. |
| 7,053,413 | B2 | 5/2006 | D'Evelyn et al. |
| 7,063,741 | B2 | 6/2006 | D'Evelyn et al. |
| 7,128,849 | B2 | 10/2006 | Setlur et al. |
| 7,220,324 | B2 | 5/2007 | Baker et al. |
| 7,303,630 | B2 | 12/2007 | Motoki et al. |
| 7,312,156 | B2 | 12/2007 | Granneman et al. |
| 7,323,723 | B2 | 1/2008 | Ohtsuka et al. |
| 7,338,828 | B2 | 3/2008 | Imer et al. |
| 7,358,542 | B2 | 4/2008 | Radkov et al. |
| 7,358,543 | B2 | 4/2008 | Chua et al. |
| 7,390,359 | B2 | 6/2008 | Miyanaga et al. |
| 7,470,555 | B2 | 12/2008 | Matsumura |
| 7,483,466 | B2 | 1/2009 | Uchida et al. |
| 7,489,441 | B2 | 2/2009 | Scheible et al. |
| 7,555,025 | B2 | 6/2009 | Yoshida |
| 7,691,658 | B2 | 4/2010 | Kaeding et al. |
| 7,727,332 | B2 | 6/2010 | Habel et al. |
| 7,733,571 | B1 | 6/2010 | Li |
| 7,749,326 | B2 | 7/2010 | Kim et al. |
| 7,806,078 | B2 | 10/2010 | Yoshida |
| 7,858,408 | B2 | 12/2010 | Mueller et al. |
| 7,862,761 | B2 | 1/2011 | Okushima et al. |
| 7,923,741 | B1 | 4/2011 | Zhai et al. |
| 7,939,354 | B2 | 5/2011 | Kyono et al. |
| 7,968,864 | B2 | 6/2011 | Akita et al. |
| 8,017,932 | B2 | 9/2011 | Okamoto et al. |
| 8,044,412 | B2 | 10/2011 | Murphy et al. |
| 8,124,996 | B2 | 2/2012 | Raring et al. |
| 8,126,024 | B1 | 2/2012 | Raring |
| 8,143,148 | B1 | 3/2012 | Raring et al. |
| 8,242,522 | B1 | 8/2012 | Raring |
| 8,247,887 | B1 | 8/2012 | Raring et al. |
| 8,252,662 | B1 | 8/2012 | Poblenz et al. |
| 8,254,425 | B1 | 8/2012 | Raring |
| 8,259,769 | B1 | 9/2012 | Raring et al. |
| 8,294,179 | B1 | 10/2012 | Raring |
| 8,314,429 | B1 | 11/2012 | Raring et al. |
| 8,351,478 | B2 | 1/2013 | Raring et al. |
| 8,355,418 | B2 | 1/2013 | Raring et al. |
| 8,422,525 | B1 | 4/2013 | Raring et al. |
| 8,634,442 | B1 | 1/2014 | Raring et al. |
| 8,723,189 | B1 * | 5/2014 | Liao ............... H01S 5/34333 257/79 |
| 8,847,249 | B2 | 9/2014 | Raring et al. |
| 9,209,596 | B1 | 12/2015 | McLaurin et al. |
| 9,246,311 | B1 * | 1/2016 | Raring ............. H01S 5/0216 |
| 9,362,715 | B2 | 6/2016 | Sztein et al. |
| 9,368,939 | B2 | 6/2016 | McLaurin et al. |
| 9,379,525 | B2 | 6/2016 | McLaurin et al. |
| 9,401,584 | B1 | 7/2016 | McLaurin et al. |
| 9,520,695 | B2 | 12/2016 | Hsu et al. |
| 9,520,697 | B2 | 12/2016 | Steigerwald et al. |
| 9,531,164 | B2 | 12/2016 | Raring et al. |
| 9,543,738 | B2 | 1/2017 | Raring et al. |
| 9,653,642 | B1 | 5/2017 | Raring et al. |
| 9,666,677 | B1 | 5/2017 | Raring et al. |
| 9,711,949 | B1 | 7/2017 | Raring et al. |
| 9,755,398 | B2 | 9/2017 | Sztein et al. |
| 9,762,032 | B1 | 9/2017 | McLaurin et al. |
| 9,774,170 | B2 | 9/2017 | McLaurin et al. |
| 9,871,350 | B2 | 1/2018 | McLaurin et al. |
| 9,882,353 | B2 | 1/2018 | Hsu et al. |
| 10,002,928 | B1 | 6/2018 | Raring et al. |
| 10,141,714 | B2 | 11/2018 | Sztein et al. |
| 10,193,309 | B1 | 1/2019 | Raring et al. |
| 10,367,334 | B2 | 7/2019 | McLaurin et al. |
| 10,439,364 | B2 | 10/2019 | McLaurin et al. |
| 10,566,767 | B2 | 2/2020 | Steigerwald et al. |
| 10,629,689 | B1 | 4/2020 | Raring et al. |
| 10,658,810 | B2 | 5/2020 | Sztein et al. |
| 10,720,757 | B1 | 7/2020 | Raring et al. |
| 10,749,315 | B2 | 8/2020 | McLaurin et al. |
| 10,854,776 | B1 | 12/2020 | Raring et al. |
| 10,854,777 | B1 | 12/2020 | Raring et al. |
| 10,854,778 | B1 | 12/2020 | Raring et al. |
| 10,903,625 | B2 | 1/2021 | McLaurin et al. |
| 11,387,629 | B1 | 7/2022 | Raring et al. |
| 2002/0050488 | A1 | 5/2002 | Nikitin et al. |
| 2002/0085603 | A1 | 7/2002 | Okumura |

(56) References Cited

U.S. PATENT DOCUMENTS

| | | |
|---|---|---|
| 2002/0097962 A1 | 7/2002 | Yoshimura et al. |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0209402 A1 | 10/2004 | Chai et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell, Jr. et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0267238 A1 | 10/2008 | Takeuchi et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0028204 A1 | 1/2009 | Hiroyama et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0166668 A1 | 7/2009 | Shakuda |
| 2009/0173957 A1 | 7/2009 | Brunner et al. |
| 2009/0229519 A1 | 9/2009 | Saitoh |
| 2009/0238227 A1 | 9/2009 | Kubota et al. |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0291518 A1 | 11/2009 | Kim et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0008391 A1 | 1/2010 | Nakagawa et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0059790 A1 | 3/2010 | Takeuchi |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2010/0329297 A1 | 12/2010 | Rumpler et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0204376 A1 | 8/2011 | Su et al. |
| 2011/0216795 A1 | 9/2011 | Hsu et al. |
| 2011/0233587 A1 | 9/2011 | Unno |
| 2011/0247556 A1 | 10/2011 | Raring et al. |
| 2012/0178198 A1 | 7/2012 | Raring et al. |
| 2012/0187412 A1 | 7/2012 | D'Evelyn et al. |
| 2012/0314398 A1 | 12/2012 | Raring et al. |
| 2013/0124284 A1 | 5/2013 | Tai |
| 2013/0214284 A1 | 8/2013 | Holder et al. |
| 2013/0234111 A1 | 9/2013 | Pfister et al. |
| 2013/0313516 A1 | 11/2013 | David et al. |
| 2014/0023102 A1 | 1/2014 | Holder et al. |
| 2015/0111325 A1 | 4/2015 | Hsu et al. |
| 2015/0140710 A1 | 5/2015 | McLaurin et al. |
| 2015/0229100 A1 | 8/2015 | Sztein et al. |

(56) References Cited

U.S. PATENT DOCUMENTS

| | | |
|---|---|---|
| 2015/0229107 A1 | 8/2015 | McLaurin et al. |
| 2015/0229108 A1 | 8/2015 | Steigerwald et al. |
| 2016/0294162 A1 | 10/2016 | McLaurin et al. |
| 2016/0359294 A1 | 12/2016 | Sztein et al. |
| 2016/0372893 A1 | 12/2016 | McLaurin et al. |
| 2017/0063045 A1 | 3/2017 | McLaurin et al. |
| 2017/0063047 A1 | 3/2017 | Steigerwald et al. |
| 2017/0077677 A1 | 3/2017 | Hsu et al. |
| 2017/0365975 A1 | 12/2017 | Sztein et al. |
| 2018/0013265 A1 | 1/2018 | McLaurin et al. |
| 2018/0159302 A1 | 6/2018 | McLaurin et al. |
| 2019/0109432 A1 | 4/2019 | Sztein et al. |
| 2020/0099196 A1 | 3/2020 | McLaurin et al. |
| 2020/0244046 A1 | 7/2020 | McLaurin et al. |
| 2020/0274333 A1 | 8/2020 | Steigerwald et al. |
| 2020/0350740 A1 | 11/2020 | Sztein et al. |

OTHER PUBLICATIONS

U.S. Appl. No. 16/903,188 Non-Final Office Action mailed Oct. 1, 2021, 9 pages.
U.S. Appl. No. 16/903,188 Notice of Allowance mailed Feb. 24, 2022, 7 pages.
U.S. Appl. No. 17/843,104 Non-Final Office Action mailed Apr. 13, 2023, 8 pages.
U.S. Appl. No. 17/843,104 Notice of Allowance mailed Aug. 22, 2023, 7 pages.
U.S. Appl. No. 17/843,104 Supplemental Notice of Allowance mailed Sep. 11, 2023, 4 pages.
U.S. Appl. No. 15/612,897 Non-Final Office Action mailed Jun. 21, 2018, 5 pages.
U.S. Appl. No. 15/612,897 Notice of Allowance mailed Sep. 12, 2018, 7 pages.
U.S. Appl. No. 14/968,710 First Action Interview Pilot Program Pre-Interview Communication mailed Jan. 12, 2017, 3 pages.
U.S. Appl. No. 14/968,710 Notice of Allowance mailed Mar. 3, 2017, 12 pages.
U.S. Appl. No. 14/534,636 Non-Final Office Action mailed Jun. 3, 2015, 9 pages.
U.S. Appl. No. 14/534,636 Notice of Allowance mailed Sep. 15, 2015, 11 pages.
"Gallium Nitride", Wikipedia, Available Online at: http://en.wikipedia.org/wiki/Gallium_nitride, Accessed from Internet on Dec. 31, 2014, 6 pages.
"Light-Emitting Diode", Wikipedia, Available Online at: http://en.wikipedia.org/wiki/Light-emitting diode, Accessed from Internet on Dec. 31, 2014, 44 pages.
"Power Electronics", Available online at: http://en.wikipedia.org/wiki/Power_electronics, Dec. 31, 2014, 24 pages.
"Transistor", Available online at: http://en.wikipedia.org/wiki/Transistor, Dec. 31, 2014, 25 pages.
U.S. Appl. No. 12/481,543 , Non-Final Office Action, Mailed on Jun. 27, 2011, 10 pages.
U.S. Appl. No. 12/482,440 , Final Office Action, Mailed on Aug. 12, 2011, 7 pages.
U.S. Appl. No. 12/482,440 , Non-Final Office Action, Mailed on Feb. 23, 2011, 6 pages.
U.S. Appl. No. 12/484,924 , Final Office Action, Mailed on Oct. 31, 2011, 11 pages.
U.S. Appl. No. 12/484,924 , Non-Final Office Action, Mailed on Apr. 14, 2011, 12 pages.
U.S. Appl. No. 12/491,169 , Final Office Action, Mailed on May 11, 2011, 10 pages.
U.S. Appl. No. 12/491,169 , Non-Final Office Action, Mailed on Oct. 22, 2010, 10 pages.
U.S. Appl. No. 12/497,289 , Non-Final Office Action, Mailed on Feb. 2, 2012, 7 pages.
U.S. Appl. No. 12/497,289 , Notice of Allowance, Mailed on May 22, 2012, 7 pages.
U.S. Appl. No. 12/502,058 , Final Office Action, Mailed on Aug. 19, 2011, 13 pages.
U.S. Appl. No. 12/502,058 , Non-Final Office Action, Mailed on Dec. 8, 2010, 15 pages.
U.S. Appl. No. 12/502,058 , Notice of Allowance, Mailed on Apr. 16, 2012, 10 pages.
U.S. Appl. No. 12/534,829 , Non-Final Office Action, Mailed on Apr. 19, 2011, 9 pages.
U.S. Appl. No. 12/534,829 , Notice of Allowance, Mailed on Dec. 5, 2011, 7 pages.
U.S. Appl. No. 12/534,829 , Notice of Allowance, Mailed on Oct. 28, 2011, 8 pages.
U.S. Appl. No. 12/573,820 , Final Office Action, Mailed on Oct. 11, 2011, 23 pages.
U.S. Appl. No. 12/573,820 , Non-Final Office Action, Mailed on Mar. 2, 2011, 19 pages.
U.S. Appl. No. 12/749,466 , Final Office Action, Mailed on Feb. 3, 2012, 16 pages.
U.S. Appl. No. 12/749,466 , Non-Final Office Action, Mailed on Jul. 3, 2012, 18 pages.
U.S. Appl. No. 12/749,466 , Non-Final Office Action, Mailed on Jun. 29, 2011, 20 pages.
U.S. Appl. No. 12/749,466 , Notice of Allowance, Mailed on Jan. 2, 2013, 8 pages.
U.S. Appl. No. 12/749,476 , Final Office Action, Mailed on Nov. 8, 2011, 11 pages.
U.S. Appl. No. 12/749,476 , Non-Final Office Action, Mailed on Apr. 11, 2011, 15 pages.
U.S. Appl. No. 12/749,476 , Notice of Allowance, Mailed on Jun. 26, 2012, 8 pages.
U.S. Appl. No. 12/749,476 , Notice of Allowance, Mailed on May 4, 2012, 8 pages.
U.S. Appl. No. 12/759,273 , Final Office Action, Mailed on Jun. 26, 2012, 10 pages.
U.S. Appl. No. 12/759,273 , Final Office Action, Mailed on Mar. 29, 2016, 12 pages.
U.S. Appl. No. 12/759,273 , Final Office Action, Mailed on Oct. 24, 2014, 16 pages.
U.S. Appl. No. 12/759,273 , Final Office Action, Mailed on Jun. 8, 2015, 17 pages.
U.S. Appl. No. 12/759,273 , Non-Final Office Action, Mailed on Nov. 21, 2011, 10 pages.
U.S. Appl. No. 12/759,273 , Non-Final Office Action, Mailed on Apr. 3, 2014, 16 pages.
U.S. Appl. No. 12/759,273 , Non-Final Office Action, Mailed on Jan. 29, 2015, 16 pages.
U.S. Appl. No. 12/759,273 , Non-Final Office Action, Mailed on Sep. 23, 2015, 18 pages.
U.S. Appl. No. 12/759,273 , Notice of Allowance, Mailed on Aug. 19, 2016, 8 pages.
U.S. Appl. No. 12/762,269 , Non-Final Office Action, Mailed on Oct. 12, 2011, 12 pages.
U.S. Appl. No. 12/762,269 , Notice of Allowance, Mailed on Apr. 23, 2012, 8 pages.
U.S. Appl. No. 12/762,271 , Final Office Action, Mailed on Jun. 6, 2012, 13 pages.
U.S. Appl. No. 12/762,271 , Non-Final Office Action, Mailed on Dec. 23, 2011, 12 pages.
U.S. Appl. No. 12/762,271 , Notice of Allowance, Mailed on Aug. 8, 2012, 9 pages.
U.S. Appl. No. 12/762,278 , Notice of Allowance, Mailed on Nov. 7, 2011, 11 pages.
U.S. Appl. No. 12/778,718 , Non-Final Office Action, Mailed on Nov. 25, 2011, 12 pages.
U.S. Appl. No. 12/778,718 , Notice of Allowance, Mailed on Apr. 3, 2012, 14 pages.
U.S. Appl. No. 12/778,718 , Notice of Allowance, Mailed on Jun. 13, 2012, 7 pages.
U.S. Appl. No. 12/868,441 , Final Office Action, Mailed on Dec. 18, 2012, 34 pages.
U.S. Appl. No. 12/868,441 , Non-Final Office Action, Mailed on Apr. 30, 2012, 12 pages.

(56) References Cited

OTHER PUBLICATIONS

U.S. Appl. No. 12/868,441, Notice of Allowance, Mailed on Sep. 18, 2013, 13 pages.
U.S. Appl. No. 12/873,820, Non-Final Office Action, Mailed on Oct. 4, 2012, 10 pages.
U.S. Appl. No. 12/880,803, Non-Final Office Action, Mailed on Feb. 22, 2012, 9 pages.
U.S. Appl. No. 12/880,803, Notice of Allowance, Mailed on Jul. 18, 2012, 5 pages.
U.S. Appl. No. 12/883,093, Final Office Action, Mailed on Aug. 3, 2012, 13 pages.
U.S. Appl. No. 12/883,093, Non-Final Office Action, Mailed on Mar. 13, 2012, 11 pages.
U.S. Appl. No. 12/883,093, Notice of Allowance, Mailed on Nov. 21, 2012, 12 pages.
U.S. Appl. No. 12/883,652, Final Office Action, Mailed on Oct. 26, 2015, 11 pages.
U.S. Appl. No. 12/883,652, Final Office Action, Mailed on Jan. 11, 2013, 12 pages.
U.S. Appl. No. 12/883,652, Final Office Action, Mailed on Dec. 19, 2014, 16 pages.
U.S. Appl. No. 12/883,652, Non-Final Office Action, Mailed on Apr. 5, 2016, 12 pages.
U.S. Appl. No. 12/883,652, Non-Final Office Action, Mailed on May 14, 2014, 14 pages.
U.S. Appl. No. 12/883,652, Non-Final Office Action, Mailed on Jun. 3, 2015, 16 pages.
U.S. Appl. No. 12/883,652, Non-Final Office Action, Mailed on Apr. 17, 2012, 8 pages.
U.S. Appl. No. 12/883,652, Notice of Allowance, Mailed on Aug. 30, 2016, 7 pages.
U.S. Appl. No. 12/884,993, Final Office Action, Mailed on Aug. 2, 2012, 15 pages.
U.S. Appl. No. 12/884,993, Non-Final Office Action, Mailed on Mar. 16, 2012, 14 pages.
U.S. Appl. No. 12/884,993, Notice of Allowance, Mailed on Nov. 26, 2012, 11 pages.
U.S. Appl. No. 13/014,622, Final Office Action, Mailed on Apr. 30, 2012, 14 pages.
U.S. Appl. No. 13/014,622, Final Office Action, Mailed on May 11, 2015, 14 pages.
U.S. Appl. No. 13/014,622, Non-Final Office Action, Mailed on Nov. 28, 2011, 14 pages.
U.S. Appl. No. 13/014,622, Non-Final Office Action, Mailed on Jun. 20, 2014, 15 pages.
U.S. Appl. No. 13/046,565, Final Office Action, Mailed on Feb. 2, 2012, 17 pages.
U.S. Appl. No. 13/046,565, Final Office Action, Mailed on Jul. 19, 2012, 24 pages.
U.S. Appl. No. 13/046,565, Non-Final Office Action, Mailed on Nov. 7, 2011, 17 pages.
U.S. Appl. No. 13/046,565, Non-Final Office Action, Mailed on Apr. 13, 2012, 40 pages.
U.S. Appl. No. 14/176,403, Non-Final Office Action, Mailed on Sep. 11, 2015, 13 pages.
U.S. Appl. No. 14/176,403, Notice of Allowance, Mailed on Feb. 12, 2016, 8 pages.
U.S. Appl. No. 14/312,427, Final Office Action, Mailed on Dec. 16, 2015, 18 pages.
U.S. Appl. No. 14/312,427, Non-Final Office Action, Mailed on Aug. 21, 2015, 13 pages.
U.S. Appl. No. 14/312,427, Notice of Allowance, Mailed on Mar. 4, 2016, 8 pages.
U.S. Appl. No. 14/480,398, Non-Final Office Action, Mailed on Mar. 17, 2016, 17 pages.
U.S. Appl. No. 14/480,398, Notice of Allowance, Mailed on Aug. 12, 2016, 9 pages.
U.S. Appl. No. 14/534,636, Non-Final Office Action, Mailed on Jun. 3, 2015, 9 pages.
U.S. Appl. No. 14/534,636, Notice of Allowance, Mailed on Sep. 15, 2015, 11 pages.
U.S. Appl. No. 14/559,149, Notice of Allowance, Mailed on Feb. 17, 2016, 10 pages.
U.S. Appl. No. 14/580,693, Non-Final Office Action, Mailed on Jun. 16, 2016, 23 pages.
U.S. Appl. No. 14/580,693, Notice of Allowance, Mailed on Jan. 17, 2017, 8 pages.
U.S. Appl. No. 14/600,506, Non-Final Office Action, Mailed on Mar. 8, 2016, 7 pages.
U.S. Appl. No. 14/600,506, Notice of Allowance, Mailed on Aug. 9, 2016, 8 pages.
U.S. Appl. No. 14/968,710, First Action Interview Pilot Program Pre-Interview Communication, Mailed on Jan. 12, 2017, 3 pages.
U.S. Appl. No. 14/968,710, Notice of Allowance, Mailed on Mar. 3, 2017, 12 pages.
U.S. Appl. No. 15/173,441, Non-Final Office Action, Mailed on Dec. 29, 2016, 6 pages.
U.S. Appl. No. 15/173,441, Notice of Allowance, Mailed on Apr. 13, 2017, 8 pages.
U.S. Appl. No. 15/176,076, Final Office Action, Mailed on Nov. 15, 2018, 10 pages.
U.S. Appl. No. 15/176,076, Final Office Action, Mailed on Dec. 8, 2017, 12 pages.
U.S. Appl. No. 15/176,076, Non-Final Office Action, Mailed on Apr. 30, 2018, 10 pages.
U.S. Appl. No. 15/176,076, Non-Final Office Action, Mailed on Jun. 6, 2017, 14 pages.
U.S. Appl. No. 15/176,076, Notice of Allowance, Mailed on Mar. 6, 2019, 7 pages.
U.S. Appl. No. 15/177,710, Non-Final Office Action, Mailed on Dec. 30, 2016, 8 pages.
U.S. Appl. No. 15/177,710, Notice of Allowance, Mailed on May 2, 2017, 10 pages.
U.S. Appl. No. 15/180,737, Notice of Allowance, Mailed on Aug. 25, 2017, 11 pages.
U.S. Appl. No. 15/209,309, Notice of Allowance, Mailed on Dec. 19, 2016, 12 pages.
U.S. Appl. No. 15/351,326, "Ex Parte Quayle Action", Jun. 25, 2019, 4 pages.
U.S. Appl. No. 15/351,326, Final Office Action, Mailed on Jan. 18, 2018, 15 pages.
U.S. Appl. No. 15/351,326, Final Office Action, Mailed on Dec. 7, 2018, 16 pages.
U.S. Appl. No. 15/351,326, Non-Final Office Action, Mailed on Jun. 1, 2018, 13 pages.
U.S. Appl. No. 15/351,326, Non-Final Office Action, Mailed on Jul. 14, 2017, 15 pages.
U.S. Appl. No. 15/351,326, Notice of Allowance, Mailed on Sep. 25, 2019, 8 pages.
U.S. Appl. No. 15/356,302, Non-Final Office Action, Mailed on May 5, 2017, 8 pages.
U.S. Appl. No. 15/356,302, Notice of Allowance, Mailed on Sep. 19, 2017, 8 pages.
U.S. Appl. No. 15/480,239, Final Office Action, Mailed on Oct. 24, 2017, 15 pages.
U.S. Appl. No. 15/480,239, Non-Final Office Action, Mailed on Jul. 3, 2017, 13 pages.
U.S. Appl. No. 15/480,239, Notice of Allowance, Mailed on Feb. 20, 2018, 8 pages.
U.S. Appl. No. 15/612,897, Non-Final Office Action, Mailed on Jun. 21, 2018, 5 pages.
U.S. Appl. No. 15/612,897, Notice of Allowance, Mailed on Sep. 12, 2018, 7 pages.
U.S. Appl. No. 15/675,532, Non-Final Office Action, Mailed on Dec. 18, 2017, 11 pages.
U.S. Appl. No. 15/675,532, Notice of Allowance, Mailed on Jul. 19, 2018, 7 pages.
U.S. Appl. No. 15/694,641, Non-Final Office Action, Mailed on Jan. 24, 2019, 9 pages.
U.S. Appl. No. 15/694,641, Notice of Allowance, Mailed on May 8, 2019, 9 pages.

(56) References Cited

OTHER PUBLICATIONS

U.S. Appl. No. 15/820,160, Non-Final Office Action, Mailed on Nov. 20, 2019, 8 pages.
U.S. Appl. No. 15/820,160, Notice of Allowance, Mailed on Apr. 1, 2020, 9 pages.
U.S. Appl. No. 16/005,255, Non-Final Office Action, Mailed on Sep. 28, 2018, 28 pages.
U.S. Appl. No. 16/005,255, Non-Final Office Action, Mailed on Aug. 6, 2019, 9 pages.
U.S. Appl. No. 16/005,255, Notice of Allowance, Mailed on Dec. 17, 2019, 5 pages.
U.S. Appl. No. 16/199,974, Non-Final Office Action, Mailed on Sep. 24, 2019, 8 pages.
U.S. Appl. No. 16/199,974, Notice of Allowance, Mailed on Jan. 15, 2020, 8 pages.
U.S. Appl. No. 16/217,359, Non-Final Office Action, Mailed on Nov. 8, 2019, 8 pages.
U.S. Appl. No. 16/217,359, Notice of Allowance, Mailed on Mar. 10, 2020, 7 pages.
U.S. Appl. No. 16/586,100, Non-Final Office Action, Mailed on Jun. 8, 2020, 5 pages.
U.S. Appl. No. 16/586,100, Notice of Allowance, Mailed on Sep. 16, 2020, 9 pages.
U.S. Appl. No. 16/791,652, Non-Final Office Action, Mailed on Sep. 25, 2020, 8 pages.
U.S. Appl. No. 16/791,652, Notice of Allowance, Mailed on Jan. 13, 2021, 8 pages.
U.S. Appl. No. 16/796,154, Ex-Parte Quayle Action, Mailed on Jul. 8, 2020, 6 pages.
U.S. Appl. No. 16/796,154, Notice of Allowance, Mailed on Jul. 28, 2020, 5 pages.
U.S. Appl. No. 16/796,183, Non-Final Office Action, Mailed on Jul. 8, 2020, 8 pages.
U.S. Appl. No. 16/796,183, Notice of Allowance, Mailed on Jul. 31, 2020, 8 pages.
U.S. Appl. No. 16/835,082, Non-Final Office Action, Mailed on Jul. 9, 2020, 11 pages.
U.S. Appl. No. 16/835,082, Notice of Allowance, Mailed on Jul. 31, 2020, 5 pages.
U.S. Appl. No. 16/844,299, Non-Final Office Action, Mailed on Mar. 3, 2021, 10 pages.
U.S. Appl. No. 16/844,299, Notice of Allowance, Mailed on Jun. 11, 2021, 10 pages.
U.S. Appl. No. 16/876,569, Non-Final Office Action, Mailed on Dec. 21, 2020, 8 pages.
U.S. Appl. No. 16/876,569, Notice of Allowance, Mailed on Apr. 9, 2021, 9 pages.
Abare et al., "Cleaved and Etched Facet Nitride Laser Diodes", Institute of Electrical and Electronics Engineers Journal of Selected Topics in Quantum Electronics, vol. 4, No. 3, May-Jun. 1998, pp. 505-509.
Amano et al., "P-Type Conduction in Mg-Doped GaN Treated with Low-Energy Electron Beam Irradiation (LEEBI)", Japanese Journal of Applied Physics, vol. 28, No. 12, Dec. 1989, pp. L2112-L2114.
Aoki et al., "InGaAs/InGaAsP MQW Electroabsorption Modulator Integrated with a DFB Laser Fabricated by Band-Gap Energy Control Selective Area MOCVD", Institute of Electrical and Electronics Engineers Journal of Quantum Electronics, vol. 29, No. 6, Jun. 1993, pp. 2088-2096.
Asano et al., "100-mW Kink-Free Blue-Violet Laser Diodes with Low Aspect Ratio", Institute of Electrical and Electronics Engineers Journal of Quantum Electronics, vol. 39, No. 1, Jan. 2003, pp. 135-140.
Bernardini et al., "Spontaneous Polarization and Piezoelectric Constants of III-V Nitrides", Physical Review B, vol. 56, No. 16, Oct. 15, 1997, pp. 10024-10027.
Caneau et al., "Studies on the Selective OMVPE of (Ga,In)/(As,P)", Journal of Crystal Growth, vol. 124, Nov. 1, 1992, pp. 243-248.
Chen et al., "Growth and Optical Properties of Highly Uniform and Periodic InGaN Nanostructures", Advanced Materials, vol. 19, No. 13, Jun. 5, 2007, pp. 1707-1710.
D'Evelyn et al., "Bulk GaN Crystal Growth by the High-Pressure Ammonothermal Method", Journal of Crystal Growth, vol. 300, No. 1, Jan. 26, 2007, pp. 11-16.
Application No. EP15746370.4, Extended European Search Report, Mailed on Jul. 11, 2017, 11 pages.
Founta et al., "Anisotropic Morphology of Nonpolar a-Plane GaN Quantum Dots and Quantum Wells", Journal of Applied Physics, vol. 102, No. 7, Oct. 2, 2007, pp. 074304-1-074304-6.
Fujii et al., "Increase in the Extraction Efficiency of GaN-Based Light-Emitting Diodes Via Surface Roughening", Applied Physics Letters, vol. 84, No. 6, Feb. 9, 2004, pp. 855-857.
Funato et al., "Blue, Green, and Amber InGaN/GaN Light-Emitting Diodes on Semipolar (1122) GaN Bulk Substrates", Journal of Japanese Applied Physics, vol. 45, No. 26, Jun. 30, 2006, pp. L659-L662.
Funato et al., "Monolithic Polychromatic Light-Emitting Diodes Based on InGaN Microfacet Quantum Wells Toward Tailor-Made Solid-State Lighting", Applied Physics Express, vol. 1, No. 1, Jan. 17, 2008, pp. 011106-1-011106-3.
Gardner et al., "Blue-Emitting InGaN-GaN Double-Heterostructure Light-Emitting Diodes Reaching Maximum Quantum Efficiency Above 200 A/cm2", Applied Physics Letters, vol. 91, No. 24, Dec. 12, 2007, pp. 243506-1-243506-3.
Hiramatsu et al., "Selective Area Growth and Epitaxial Lateral Overgrowth of GaN by Metalorganic Vapor Phase Epitaxy and Hydride Vapor Phase Epitaxy", Materials Science and Engineering B, vol. 59, No. 1-3, May 6, 1999, pp. 104-111.
Hjort, "Sacrificial Etching of III-V Compounds for Micromechanical Devices", Journal of Micromechanics and Microengineering, vol. 6, Jul. 5, 1996, pp. 370-375.
Holder et al., "Demonstration of Nonpolar GaN-Based Vertical-Cavity Surface-Emitting Lasers", Applied Physics. Express, vol. 5, No. 9, Sep. 5, 2012, pp. 092104-1-092104-3.
Iso et al., "High Brightness Blue InGaN/GaN Light Emitting Diode on Nonpolar m-Plane Bulk GaN Substrate", Japanese Journal of Applied Physics, vol. 46, No. 40, Oct. 12, 2007, pp. L960-L962.
Kendall et al., "Energy Savings Potential of Solid State Lighting in General Lighting Applications", Report for the Department of Energy, Apr. 2001, 35 pages.
Khan et al., "Cleaved Cavity Optically Pumped InGaN-GaN Laser Grown on Spinel Substrates", Applied Physics Letters, vol. 69, No. 16, Oct. 14, 1996, pp. 2418-2420.
Kim et al., "Improved Electroluminescence on Nonpolar m-Plane InGaN/GaN Qantum Wells LEDs", Physica Status Solidi, vol. 1, No. 3, Apr. 12, 2007, pp. 125-127.
Kuramoto et al., "Novel Ridge-Type InGaN Multiple-Quantum-Well Laser Diodes Fabricated by Selective Area Re-Growth on N-GaN Substrates", Journal of Japanese Applied Physics, vol. 40, 2001, pp. L925-L927.
Lidow et al., "Gallium Nitride (GaN) Technology Overview", Engineer procure construct, White Paper, 2012, pp. 1-6.
Lin et al., "Influence of Separate Confinement Heterostructure Layer on Carrier Distribution in InGaAsP Laser Diodes with Nonidentical Multiple Quantum Wells", Japanese Journal of Applied Physics, vol. 43, No. 10, Oct. 8, 2004, pp. 7032-7035.
Masui et al., "Electrical Characteristics of Nonpolar InGaN-Based Light-Emitting Diodes Evaluated at Low Temperature", Japanese Journal of Applied Physics, vol. 46, No. 11, Nov. 6, 2007, pp. 7309-7310.
Michiue et al., "Recent Development of Nitride LEDs and LDs", Proceedings of Society of Photo-Optical Instrumentation Engineers, vol. 7216, Feb. 16, 2009, 6 pages.
Nakamura et al., "Candela-Class High-Brightness InGaN/AlGaN Double-Heterostructure Blue-Light-Emitting Diodes", Applied Physics Letters, vol. 64, No. 13, Jan. 5, 1994, pp. 1687-1689.
Nakamura et al., "InGaN/GaN/AlGaN-Based Laser Diodes with Modulation-Doped Strained-Layer Superlattices Grown on an Epitaxially Laterally Overgrown GaN Substrate", Applied Physics Letters, vol. 72, No. 2, Jan. 12, 1998, pp. 211-213.

(56) References Cited

OTHER PUBLICATIONS

Nakamura et al., "P-GaN/n-InGaN/n-GaN Double-Heterostructure Blue-Light-Emitting Diodes", Japanese Journal of Applied Physics, vol. 32, Feb. 15, 1993, pp. L8-L11.
Nam et al., "Lateral Epitaxial Overgrowth of GaN Films on SiO2 Areas Via Metalorganic Vapor Phase Epitaxy", Journal of Electronic Materials, vol. 27, No. 4, Apr. 1998, pp. 233-237.
Okamoto et al., "Continuous-Wave Operation of m-Plane InGaN Multiple Quantum Weil Laser Diodes", The Japan Society of Applied Physics, vol. 46, No. 9, Feb. 23, 2007, pp. L187-L189.
Okamoto et al., "High-Efficiency Continuous-Wave Operation of Blue-Green Laser Diodes Based on Nonpolar m-Plane Gallium Nitride", Applied Physics Express, vol. 1, No. 7, Jun. 20, 2008, pp. 172201-1-172201-3.
Okamoto et al., "Pure Blue Laser Diodes Based on Nonpolar M-Plane Gallium Nitride with InGaN Waveguiding Layers", Journal of Japanese Applied Physics, vol. 46, No. 35, Sep. 7, 2007, pp. L820-L822.
Okubo , "Nichia Develops Blue-Green Semiconductor Laser w/ 488nm Wavelength", Tech-on, Available Online at: http://techon.nikkeibp.cojp/english/NEWS_EN/20080122/146009/?ST=english_PRINT, Jan. 22, 2008, 2 pages.
Park , "Crystal Orientation Effects on Electronic Properties of Wurtzite InGaN/GaN Quantum Wells", Journal of Applied Physics, vol. 91, No. 12, Jun. 15, 2002, pp. 9904-9908.
Application No. PCT/US2009/046786 , International Search Report and Written Opinion, Mailed on May 13, 2010, 8 pages.
Application No. PCT/US2009/047107 , International Search Report and Written Opinion, Mailed on Sep. 29, 2009, 10 pages.
Application No. PCT/US2009/052611 , International Search Report and Written Opinion, Mailed on Sep. 29, 2009, 11 pages.
Application No. PCT/US2010/030939 , International Search Report and Written Opinion, Mailed on Jun. 16, 2010, 10 pages.
Application No. PCT/US2010/049172 , International Search Report and Written Opinion, Mailed on Nov. 17, 2010, 8 pages.
Application No. PCT/US2011/037792 , International Search Report and Written Opinion, Mailed on Sep. 8, 2011, 9 pages.
Application No. PCT/US2015/014567 , International Preliminary Report on Patentability, Mailed on Aug. 25, 2016, 14 pages.
Application No. PCT/US2015/014567 , International Search Report and Written Opinion, Mailed on Jul. 8, 2015, 19 pages.
Purvis , "Changing the Crystal Face of Gallium Nitride", The Advance Semiconductor Magazine, vol. 18, No. 8, Nov. 2005, 3 pages.
Romanov et al., "Strain-Induced Polarization in Wurtzite III-Nitride Semipolar Layers", Journal of Applied Physics, vol. 100, No. 2, Jul. 25, 2006, pp. 023522-1-023522-10.
Sato et al., "High Power and High Efficiency Green Light Emitting Diode on Free-Standing Semipolar (1122) Bulk GaN Substrate", Physica Status Solidi, vol. 1, No. 4, Jun. 15, 2007, pp. 162-164.
Sato et al., "Optical Properties of Yellow Light-Emitting-Diodes Grown on Semipolar (1122) Bulk GaN Substrates", Applied Physics Letter, vol. 92, No. 22, Jun. 2008, pp. 221110-1-221110-3.
Schmidt et al., "Demonstration of Nonpolar M-Plane InGaN/GaN Laser Diodes", Japanese Journal of Applied Physics, vol. 46, No. 9, Feb. 23, 2007, pp. L190-L191.

Schmidt et al., "High Power and High External Efficiency m-Plane InGaN Light Emitting Diodes", Japanese Journal of Applied Physics, vol. 46, No. 7, Feb. 9, 2007, pp. L126-L128.
Schoedl et al., "Facet Degradation of GaN Heterostructure Laser Diodes", Journal of Applied Physics, vol. 97, No. 12, Jun. 16, 2005, pp. 123102-1-123102-8.
Shchekin et al., "High Performance Thin-Film Flip-Chip InGaN-GaN Light-Emitting Diodes", Applied Physics Letters, vol. 89, No. 7, Aug. 16, 2006, pp. 071109-1-071109-3.
Shen et al., "Auger Recombination in InGaN Measured by Photoluminescence", Applied Physics Letters, vol. 91, No. 14, Oct. 1, 2007, pp. 141101-1-141101-3.
Sink , "Cleaved-Facet Group-III Nitride Lasers", University of California, Dec. 2000, 251 pages.
Sizov et al., "500-Nm Optical Gain Anisotropy of Semipolar (1122) InGaN Quantum Wells", Applied Physics Express, vol. 2, No. 7, Jun. 19, 2009, pp. 071001-1-071001-3.
Tamboli , "Photoelectrochemical Etching of Gallium Nitride for High Quality Optical Devices", Available Online at: http://adsabs.harvard.edu/abs/2009PhDT . . . 68T, Jun. 2009, 207 pages.
Tomiya et al., "Dislocation Related Issues in the Degradation of GaN-Based Laser Diodes", Institute of Electrical and Electronics Engineers Journal of Selected Topics in Quantum Electronics, vol. 10, No. 6, Nov.-Dec. 2004, pp. 1277-1286.
Tyagi et al., "High Brightness Violet InGaN/GaN Light Emitting Diodes on Semipolar (1011) Bulk GaN Substrates", Japanese Journal of Applied Physics, vol. 46, No. 7, Feb. 9, 2007, pp. L129-L131.
Uchida et al., "Recent Progress in High-Power Blue-Violet Lasers", Institute of Electrical and Electronics Engineers Journal of Selected Topics in Quantum Electronics, vol. 9, No. 5, Sep.-Oct. 2003, pp. 1252-1259.
Waltereit et al., "Nitride Semiconductors Free of Electrostatic Fields for Efficient White Light-Emitting Diodes", Nature, vol. 406, Aug. 24, 2000, pp. 865-868.
Wierer et al., "High-Power AlGaInN Flip-Chip Light-Emitting Diodes", Applied Physics Letters, vol. 78, No. 22, May 28, 2001, pp. 3379-3381.
Yamaguchi , "Anisotropic Optical Matrix Elements in Strained GaN-Quantum Wells with Various Substrate Orientations", Physica Status Solidi, vol. 5, No. 6, May 2008, pp. 2329-2332.
Yang , "Micromachining of Gan Using Photoelectrochemical Etching", Graduate Program in Electronic Engineering, Apr. 2005, 168 pages.
Yoshizumi et al., "Continuous-Wave Operation of 520 nm Green InGaN-Based Laser Diodes on Semi-Polar (2021) GaN Substrates", Applied Physics Express, vol. 2, No. 9, Aug. 21, 2009, pp. 092101-1-092101-3.
Yu et al., "Multiple Wavelength Emission from Semipolar InGaN/GaN Quantum Wells Selectively Grown by MOCVD", Quantum Electronics and Laser Science Conference, May 2007, 2 pages.
Zhong et al., "Demonstration of High Power Blue-Green Light Emitting Diode on Semipolar (1122) Bulk GaN Substrate", Electronics Letters, vol. 43, No. 15, Jul. 19, 2007, 2 pages.
Zhong et al., "High Power and High Efficiency Blue Light Emitting Diode on Freestanding Semipolar (1011) Bulk GaN Substrate", Applied Physics Letter, vol. 90, No. 23, Nov. 23, 2007, pp. 233504-1-233504-3.

\* cited by examiner

Ga2O3 deposited on the p-side of the epi-structure as both the p-contact and the p-cladding material

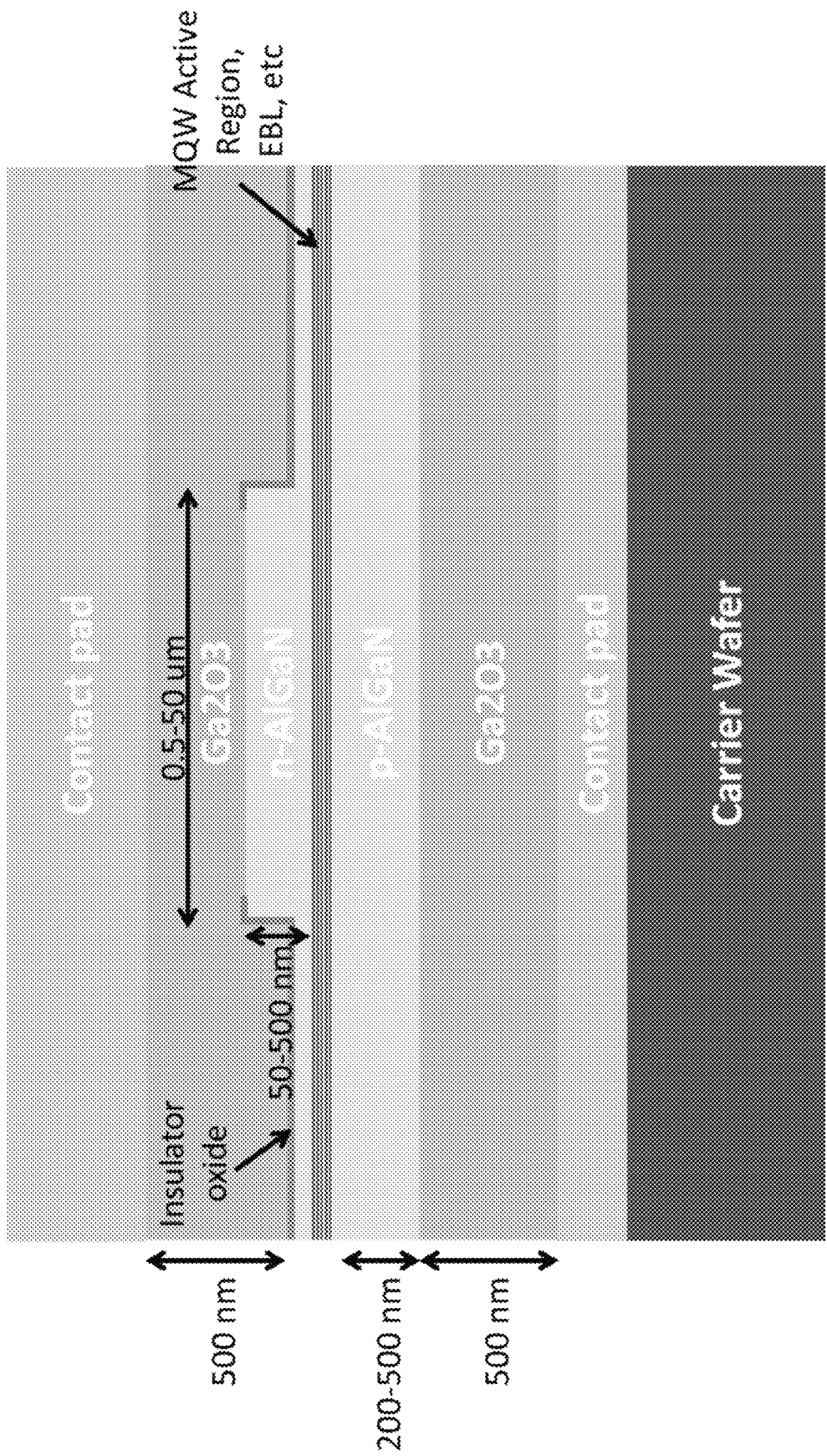
Figure 3a Double TCO Clad, n-ridge

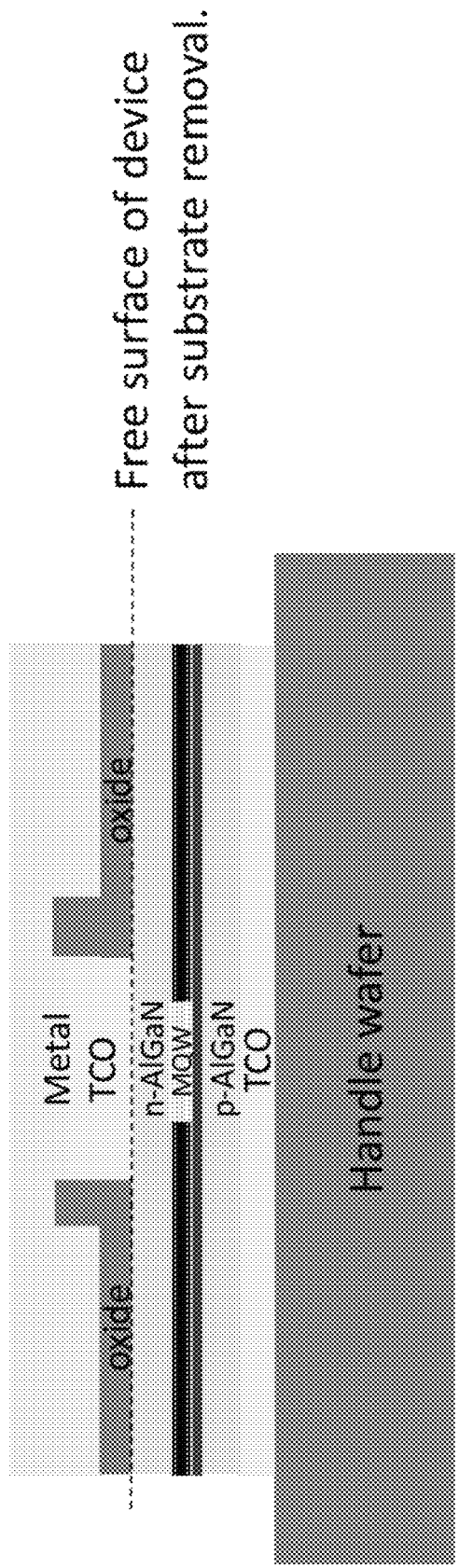
Figure 3b Double ITO Clad, TCO ridge

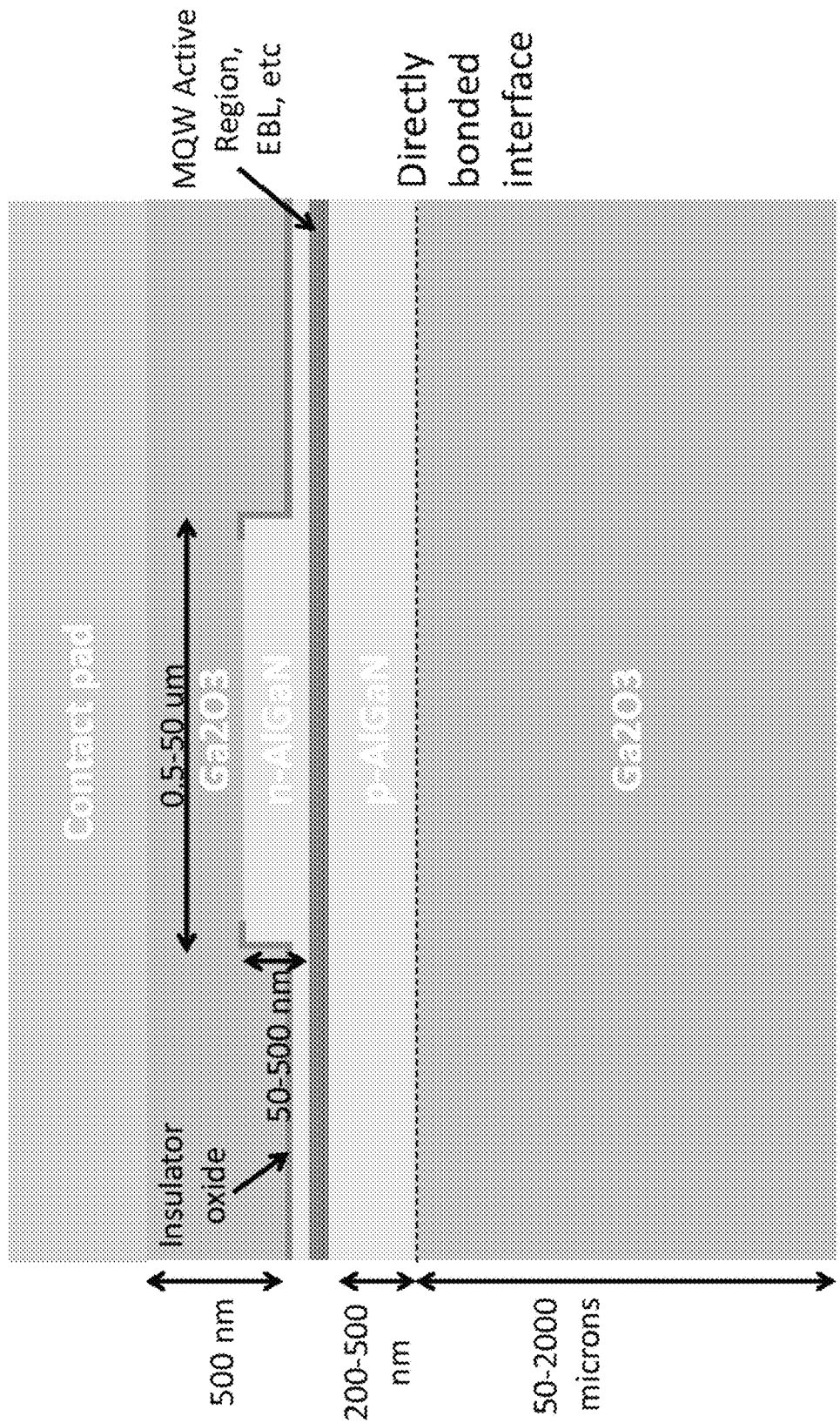
Figure 3c Double TCO Clad with TCO carrier wafer, n-ridge

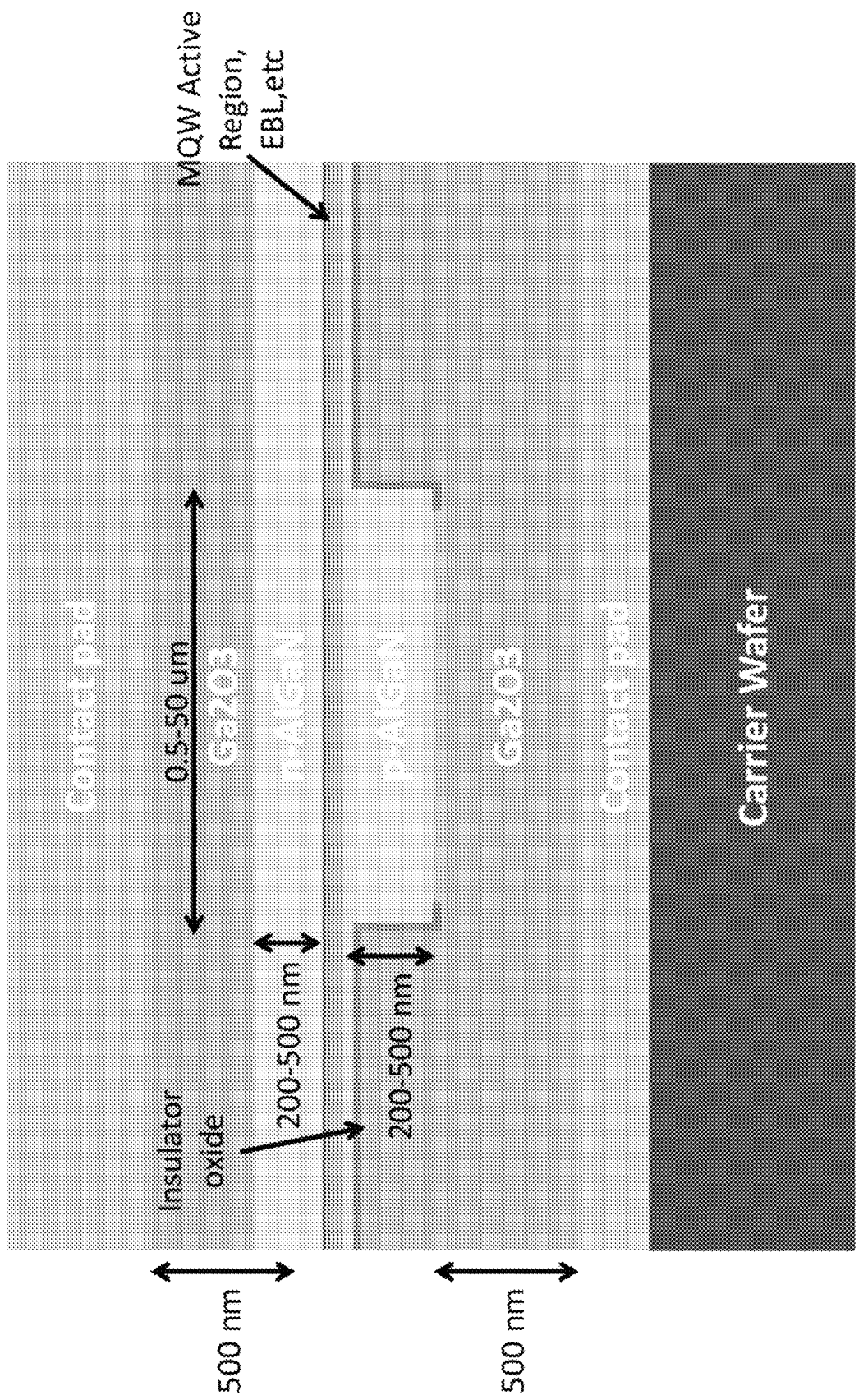
Figure 3d Double ITO Clad, p-ridge

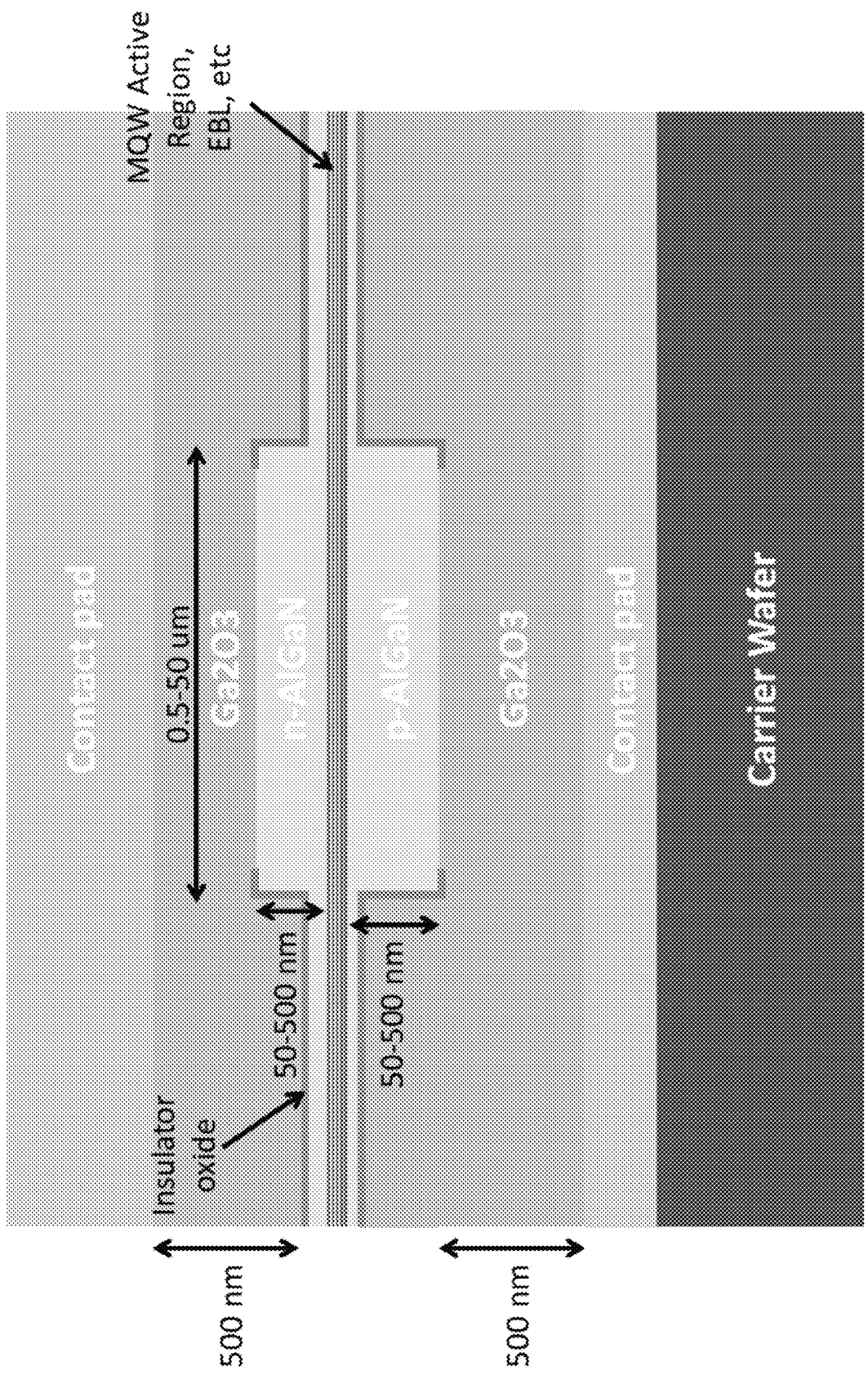
Figure 3e Double ITO Clad, p/n-ridge

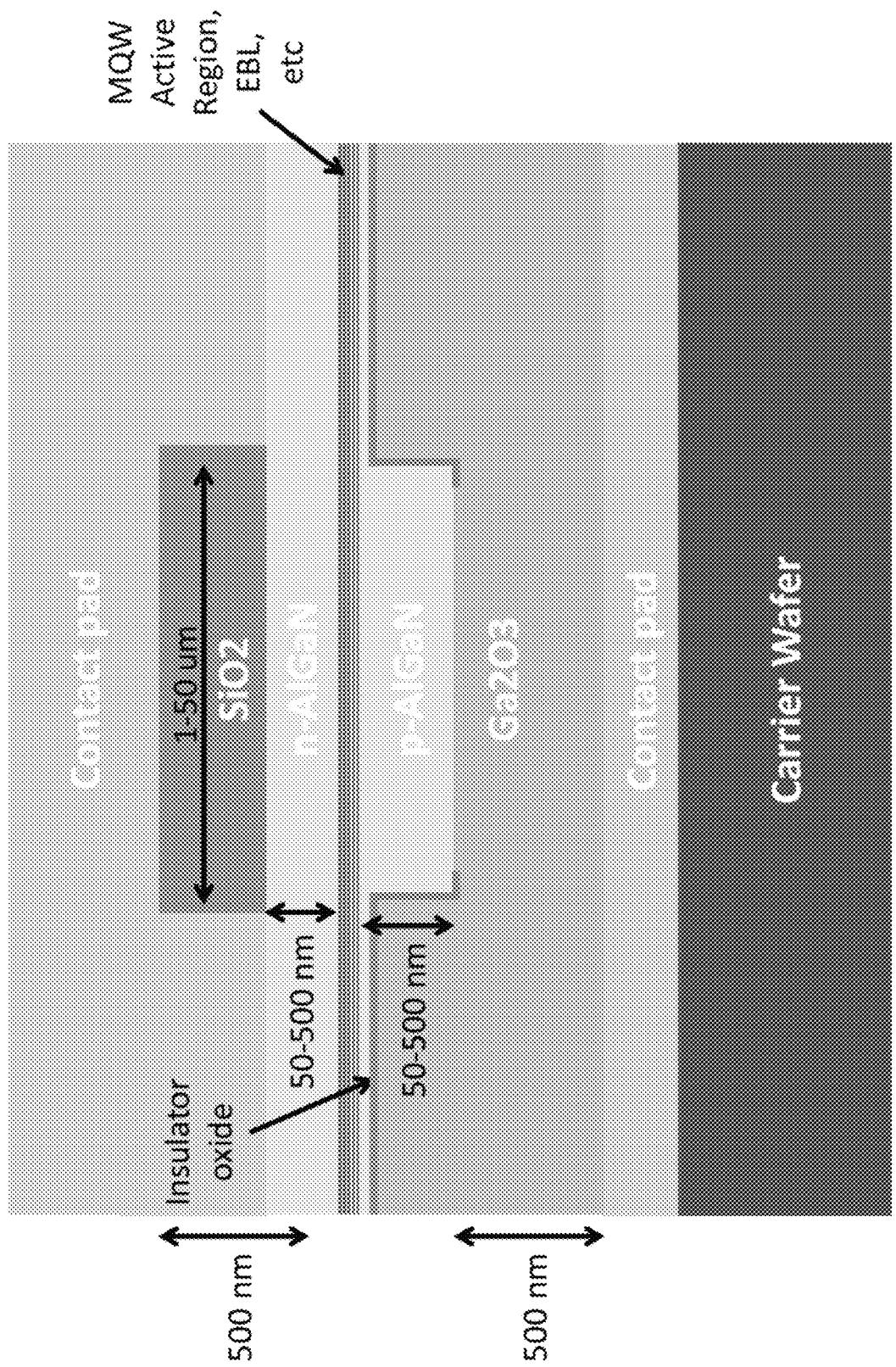
Figure 3f ITO p-clad, SiO2 n-clad, p-ridge

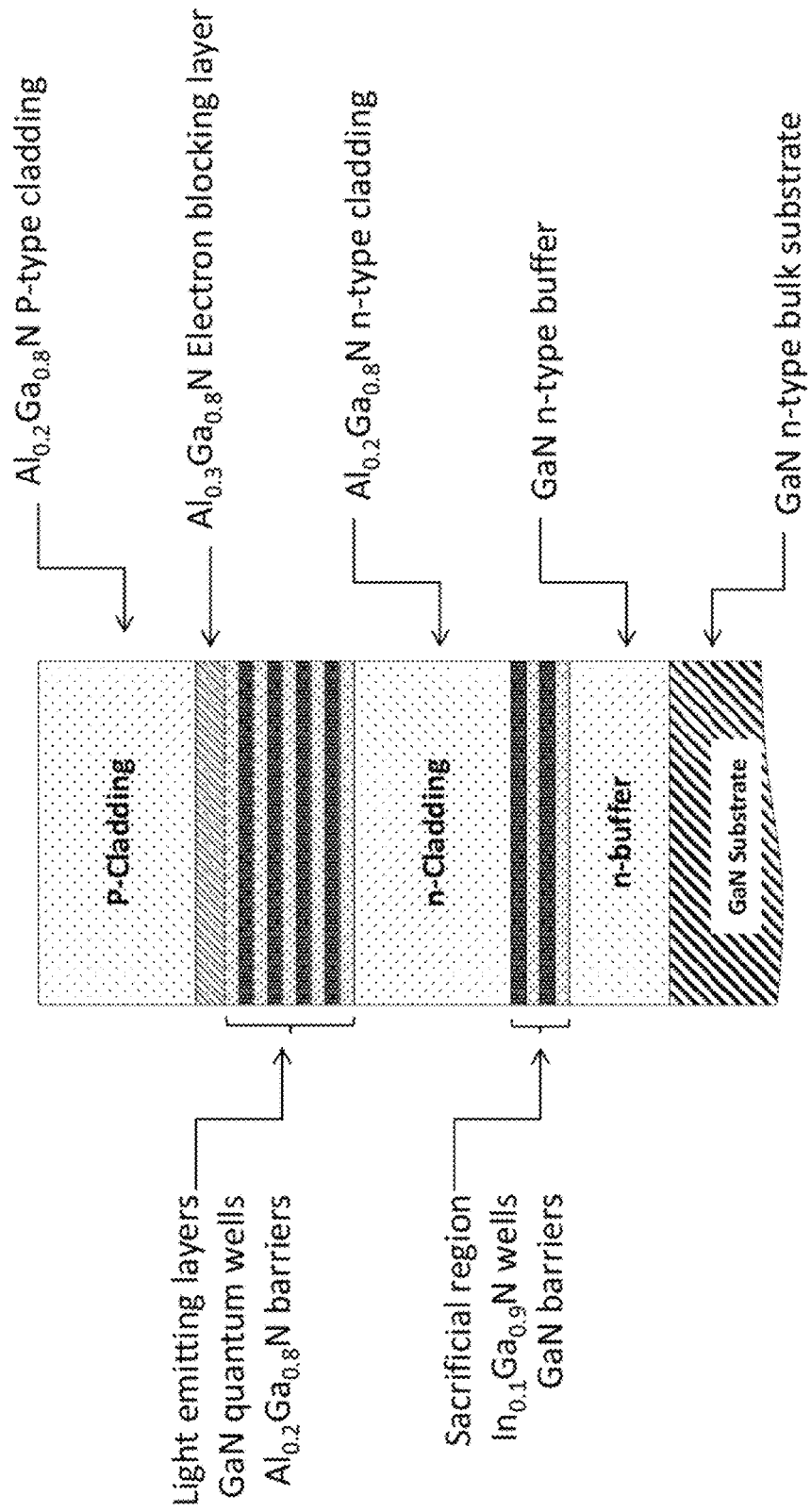
Figure 4a epi design for semipolar 350 nm laser diode with PEC etchable sacrificial layer

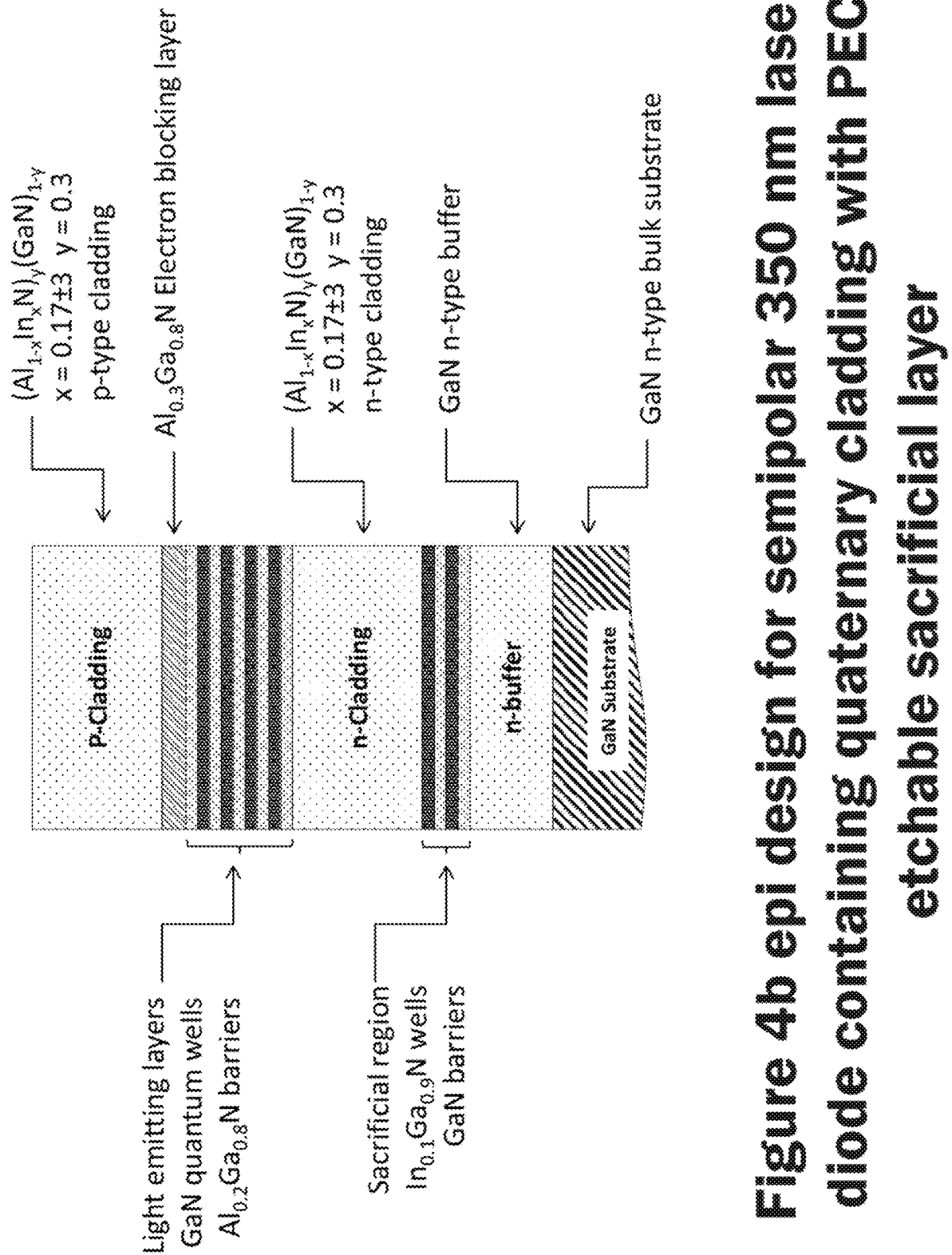
Figure 4b epi design for semipolar 350 nm laser diode containing quaternary cladding with PEC etchable sacrificial layer

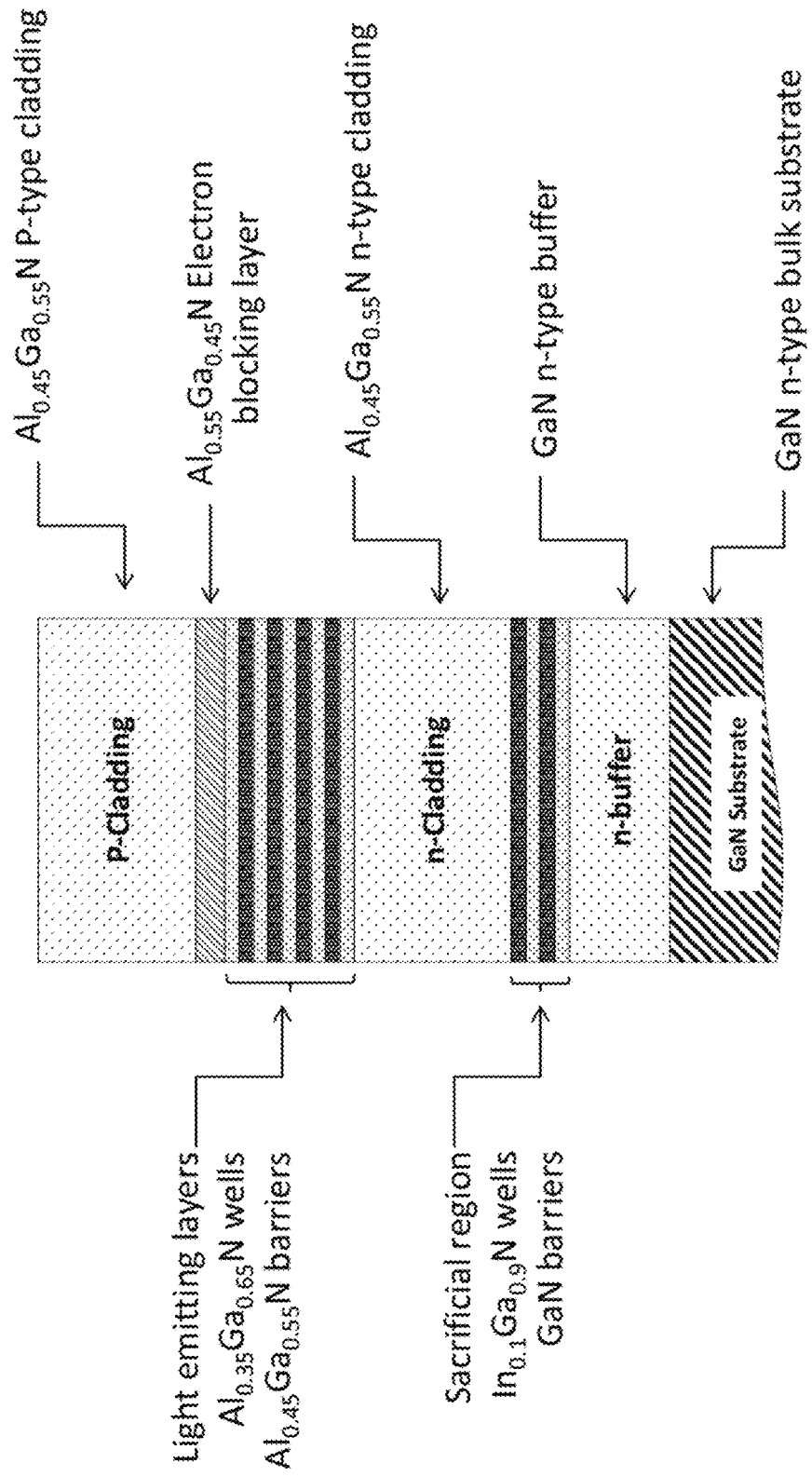
Figure 4c epi design for semipolar 300 nm laser diode with PEC etchable sacrificial layer

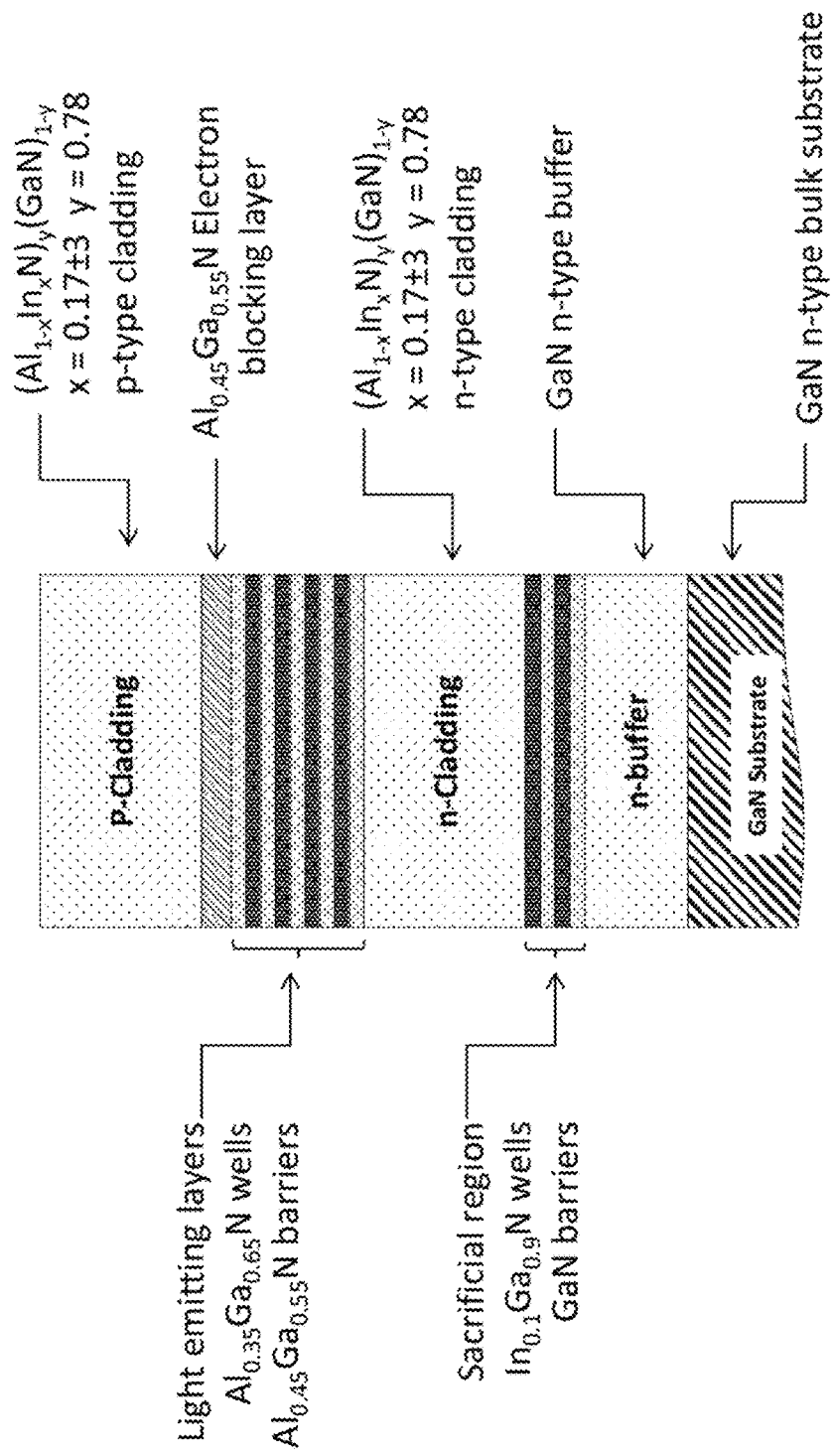
Figure 4d epi design for semipolar 300 nm laser diode containing quaternary cladding with PEC etchable sacrificial layer

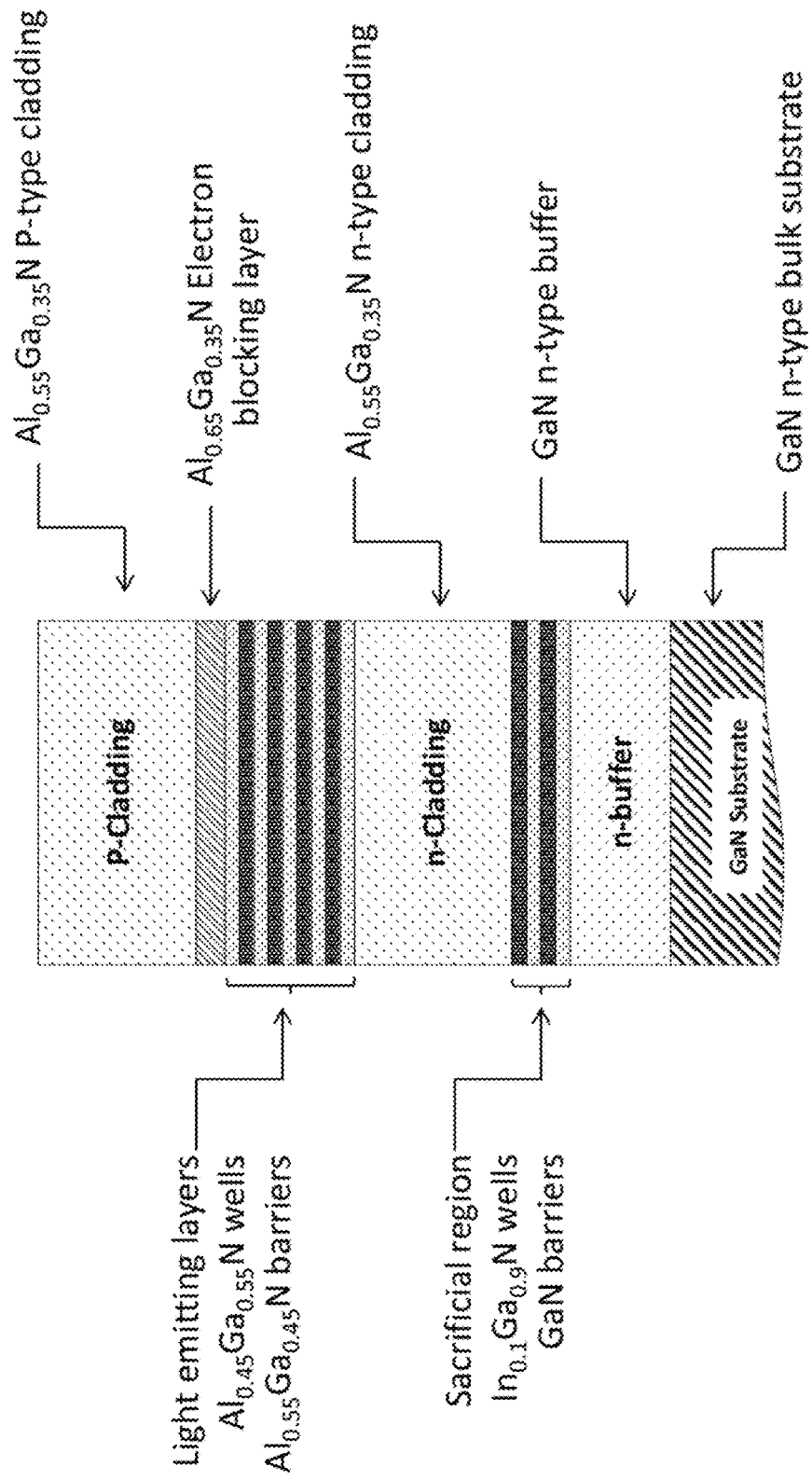
Figure 4e epi design for semipolar 280 nm laser diode with PEC etchable sacrificial layer

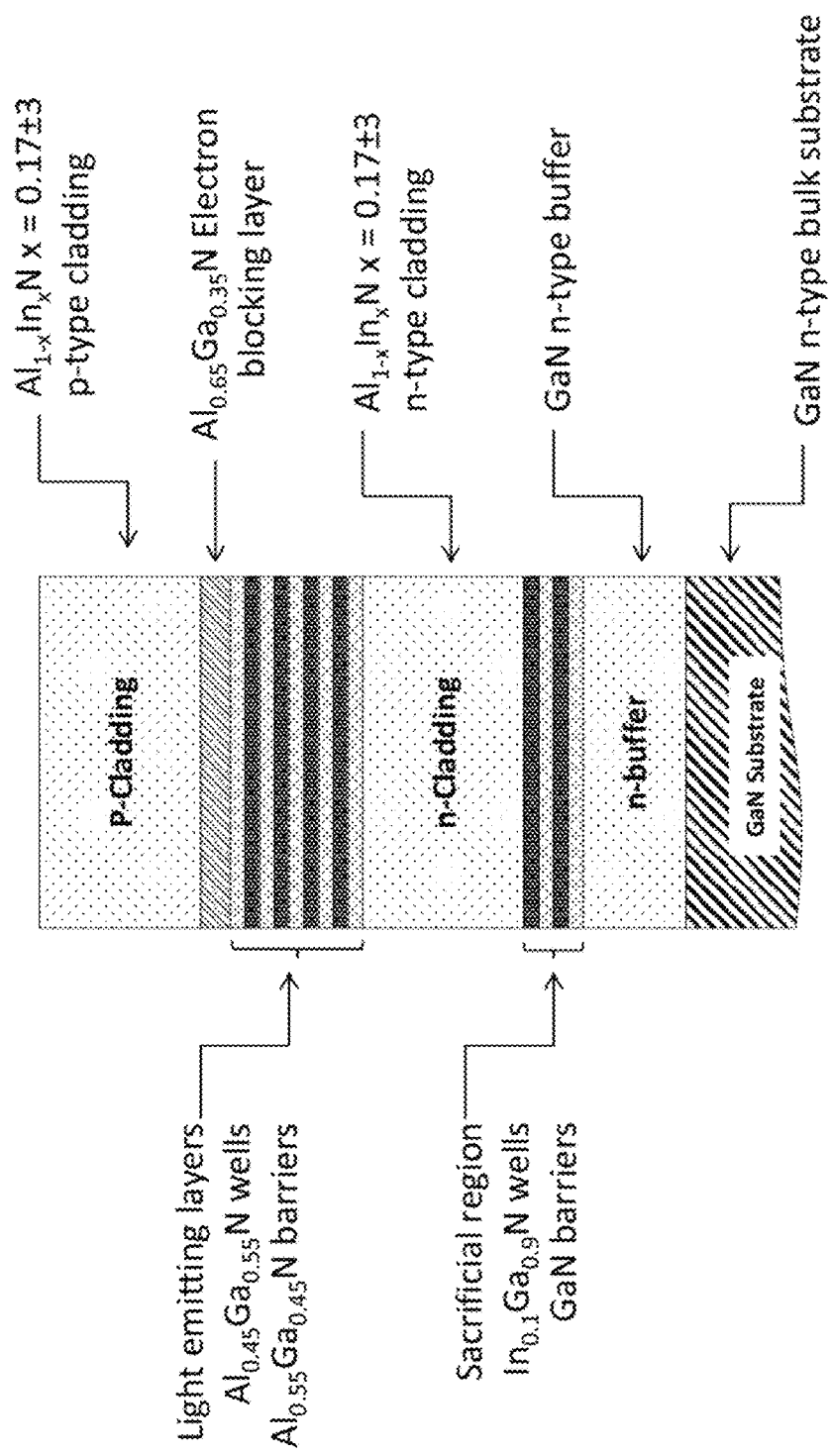
Figure 4f epi design for semipolar 280 nm laser diode containing quaternary cladding with PEC etchable sacrificial layer

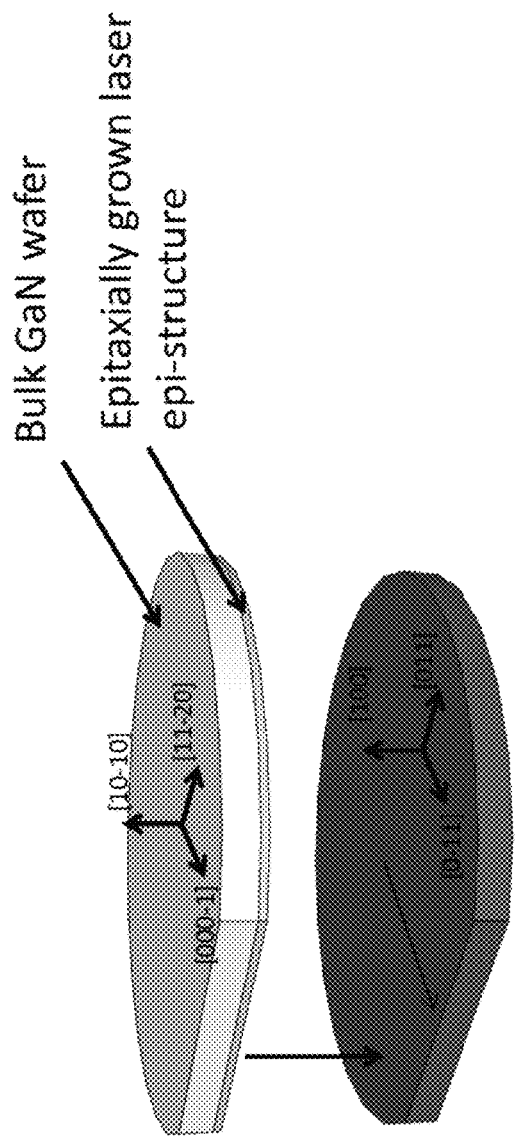
Figure 5a Handle wafer assisted cleaving
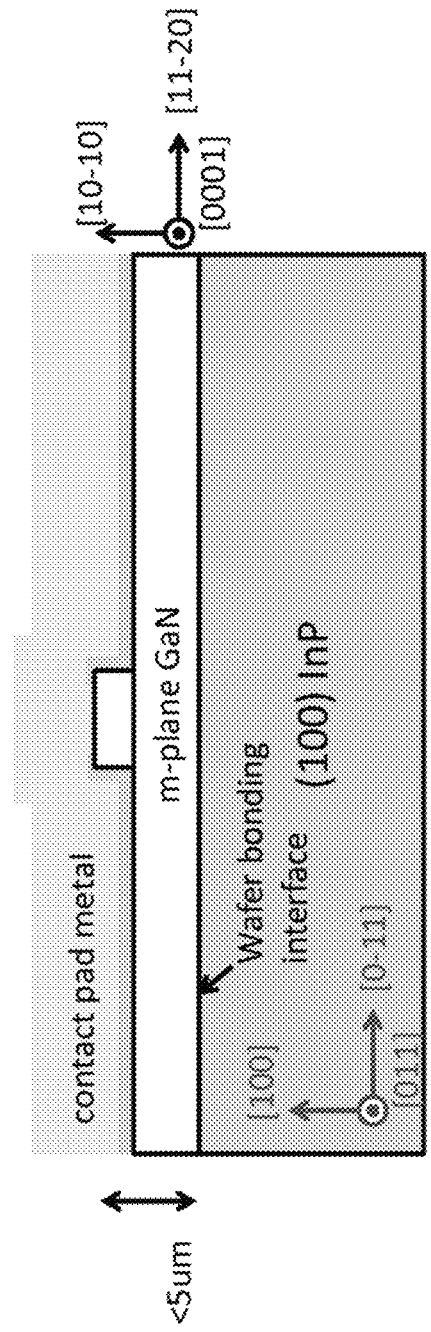
Figure 5b

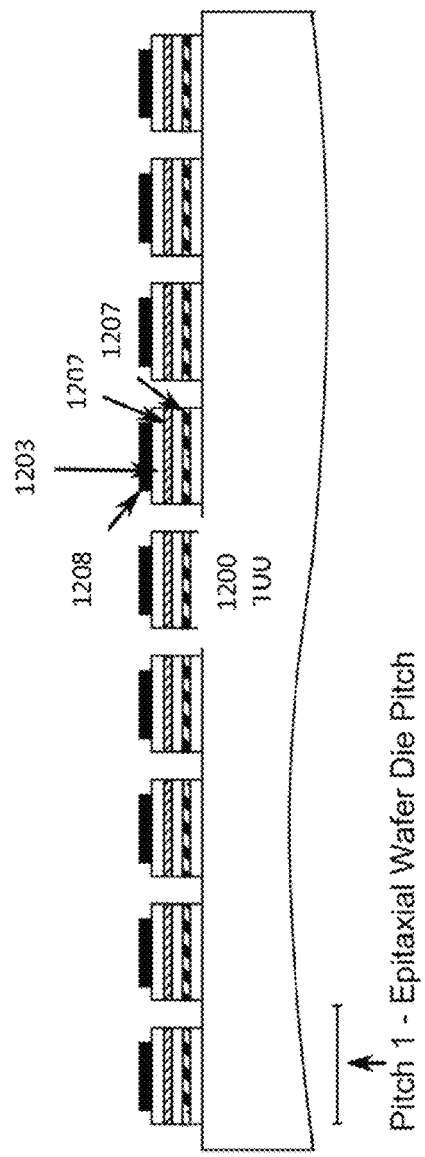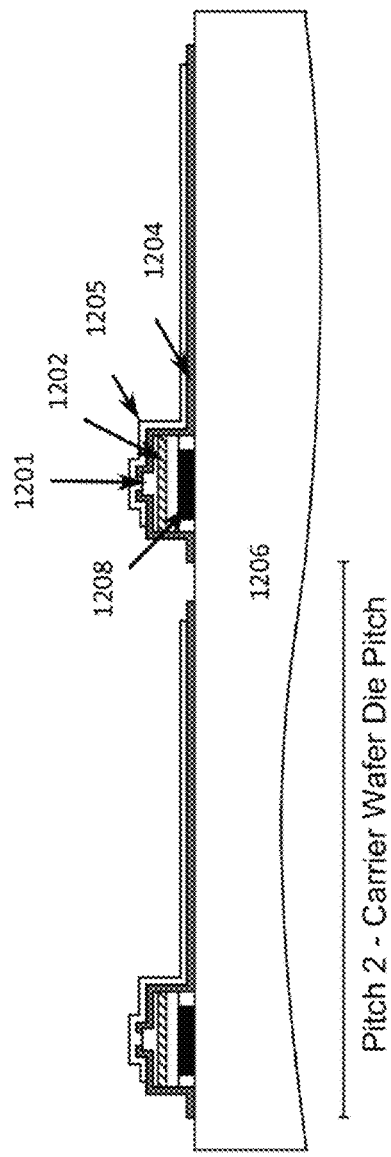
FIGURE 9

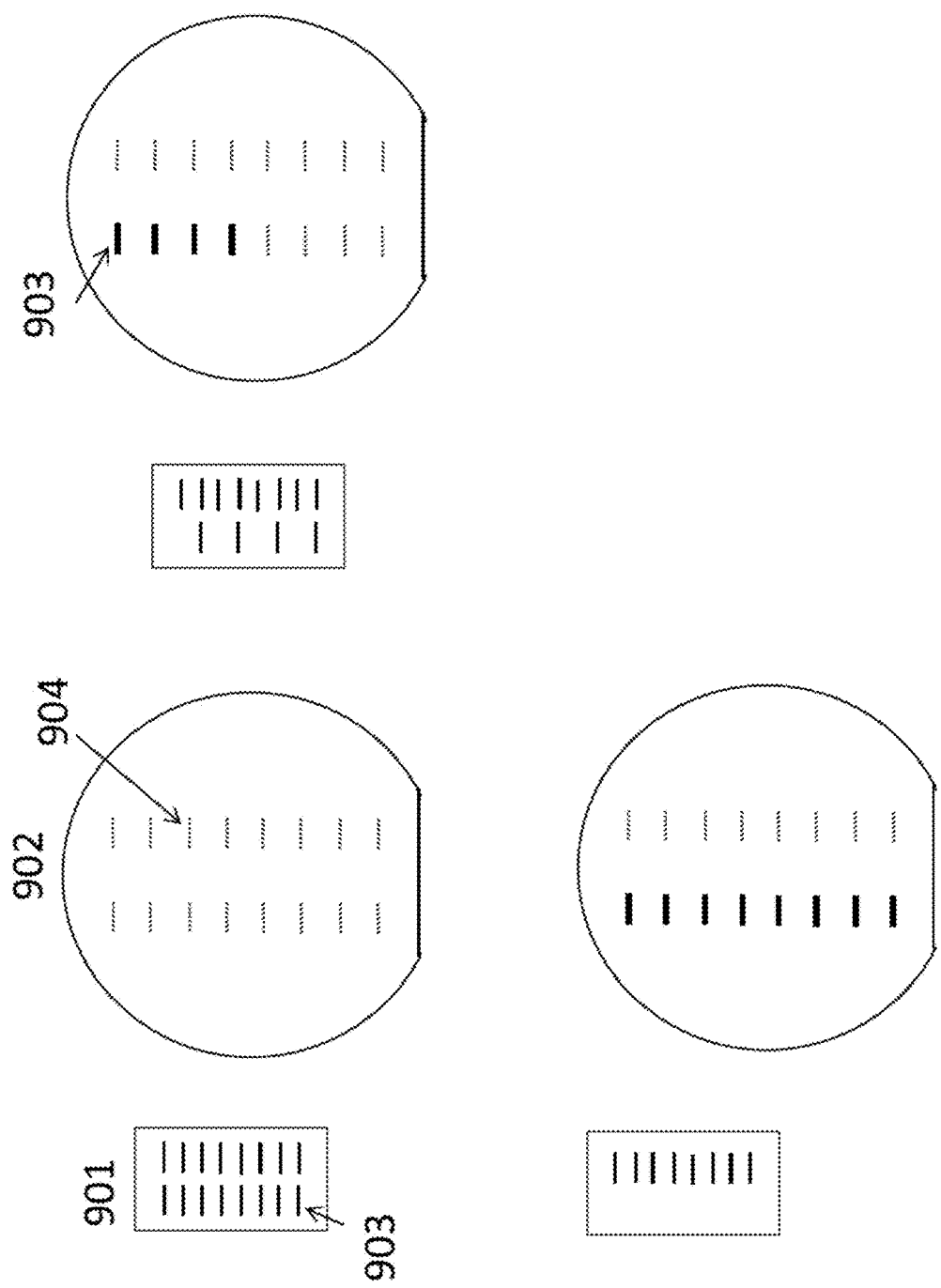
Figure 17: example of die expansion onto a carrier wafer in two dimensions

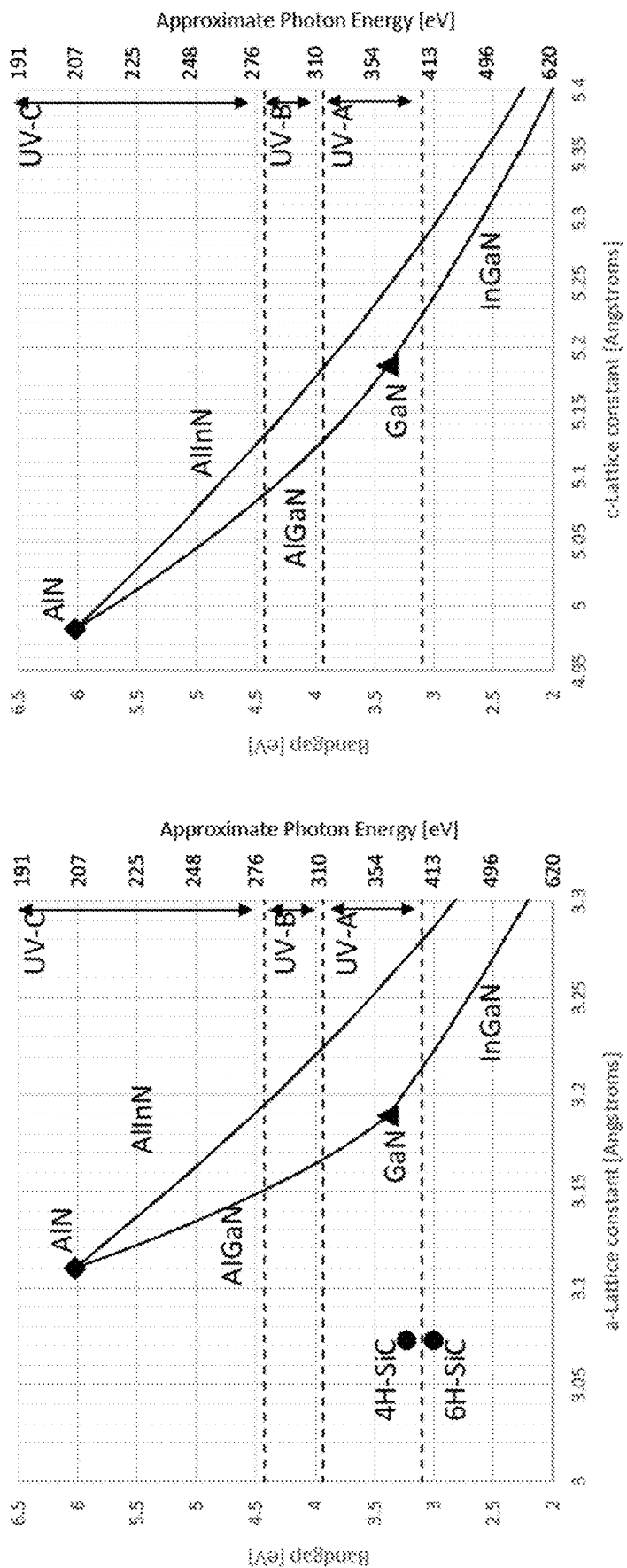
Figure 18: bandgap vs. lattice constant

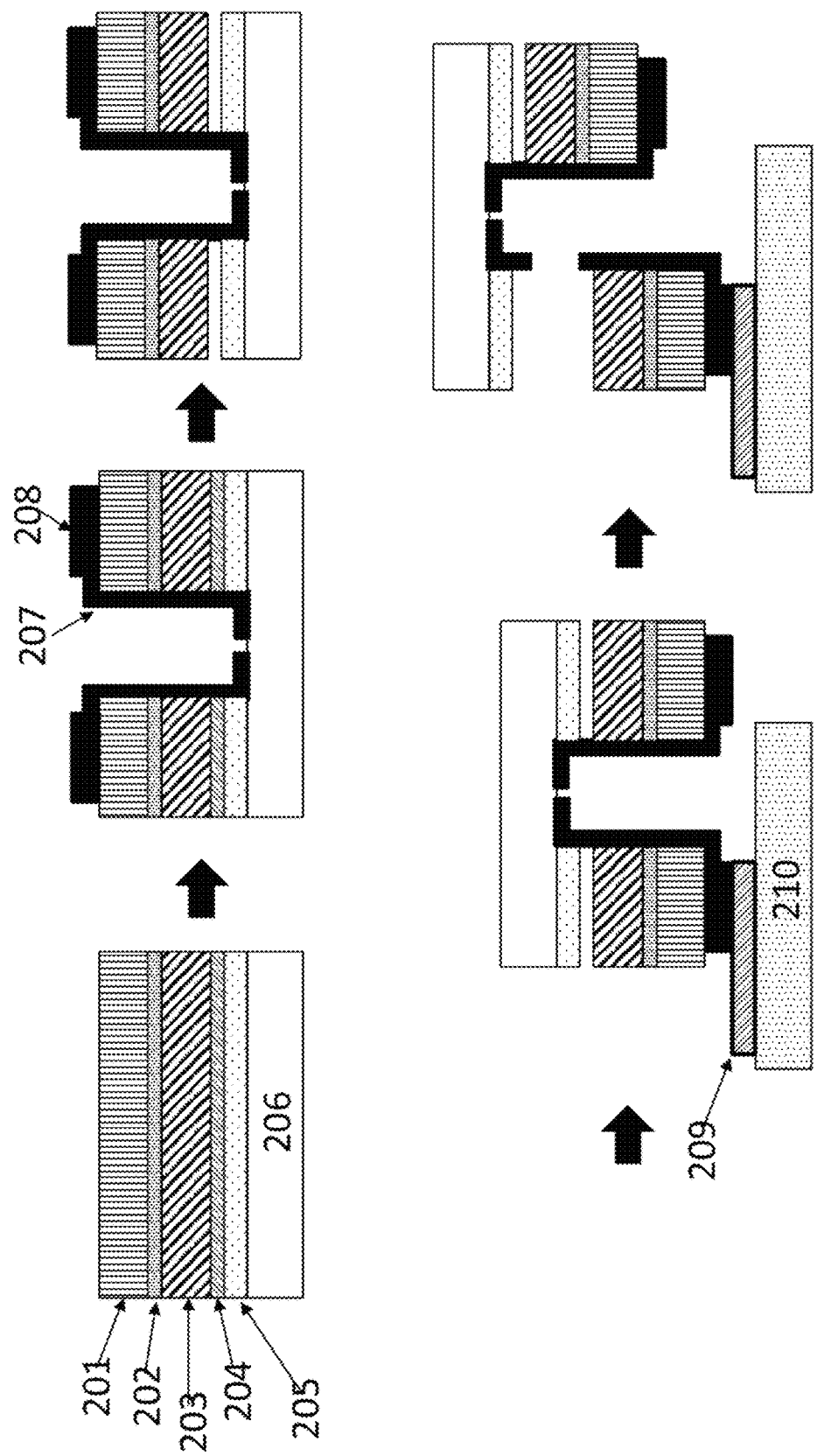
Figure 19: process flow

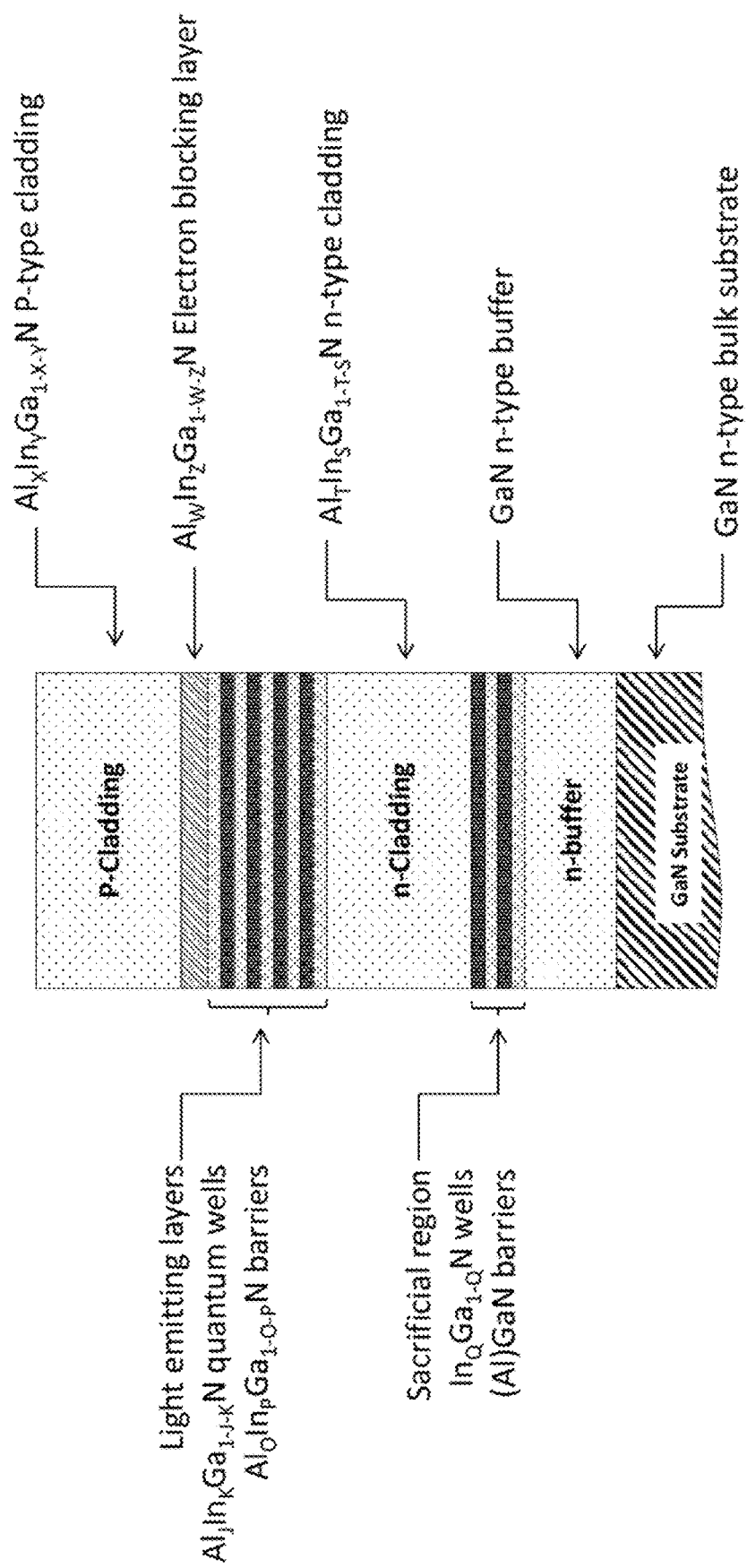
Figure 20: Example UV Optoelectronic Device Structure on GaN Substrate

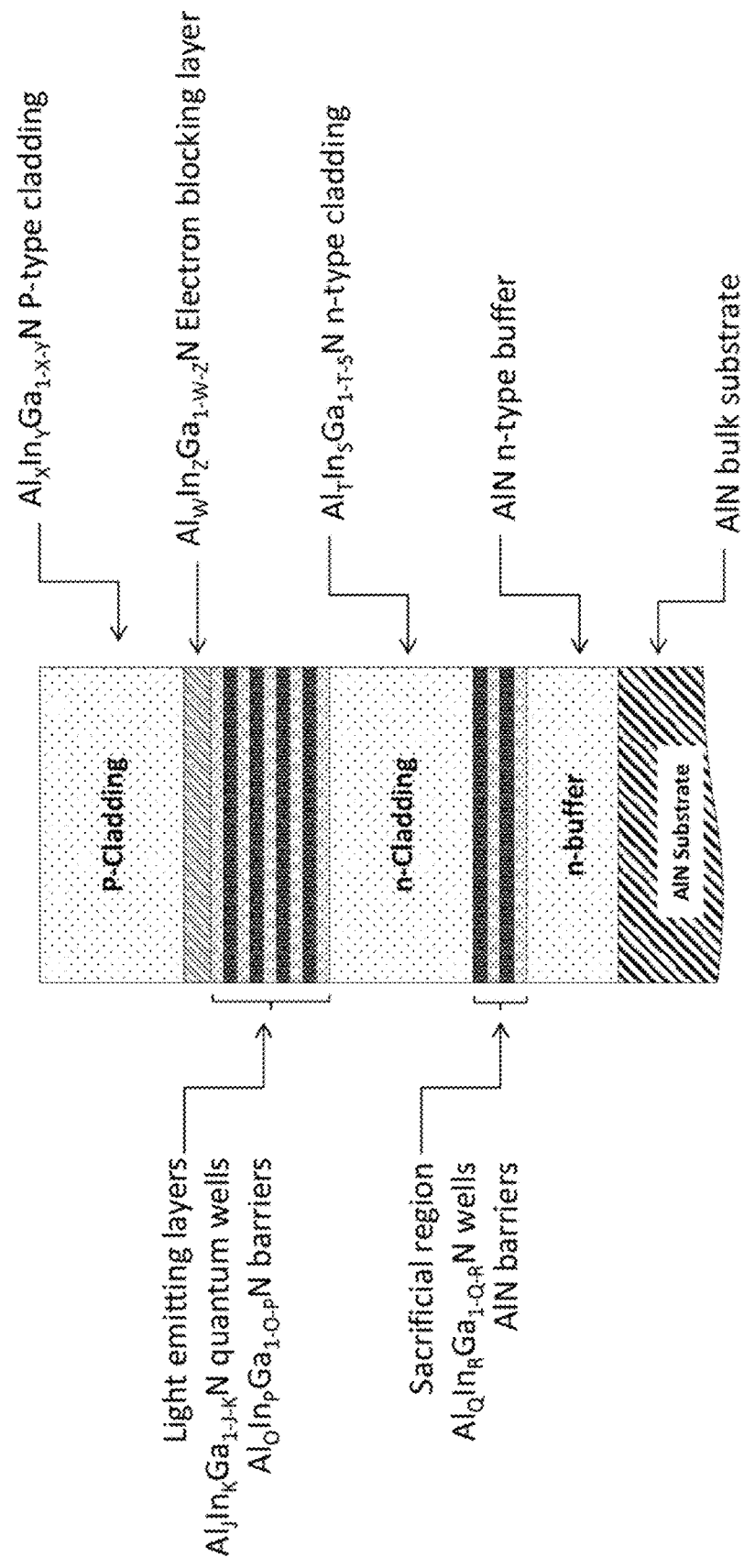
Figure 21: Example UV Optoelectronic Device Structure on AlN Substrate

METHOD OF MANUFACTURE FOR AN ULTRAVIOLET EMITTING OPTOELECTRONIC DEVICE

CROSS-REFERENCE TO RELATED APPLICATIONS

This application claims priority to U.S. Provisional Application No. 63/025,449, filed May 15, 2020, the entire contents of which are incorporated herein by reference in their entirety for all purposes. This application is also a continuation-in-part of U.S. application Ser. No. 16/903,188, filed Jun. 16, 2020, which is a continuation of U.S. application Ser. No. 16/217,359, filed Dec. 12, 2018, which is a continuation of U.S. application Ser. No. 15/612,897, filed Jun. 2, 2017, which is a continuation of U.S. application Ser. No. 14/968,710, filed Dec. 14, 2015, which is a continuation of U.S. application Ser. No. 14/534,636, filed Nov. 6, 2014, the entire contents of each of which are incorporated herein by reference in their entirety for all purposes.

BACKGROUND

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, and fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized to replace the inefficient and fragile lamps. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5%-10%, and further commercialization ensue into more high-end specialty industrial, medical, and scientific applications. However, the change to diode pumping increased the system cost and required precise temperature controls, leaving the laser with substantial size and power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser operating with longitudinal mode (single frequency) and single spatial mode, 1064 nm goes into frequency conversion crystal, which converts to visible 532 nm green light. These lasers designs are meant to improve the efficiency, cost and size compared to DPSS-SHG lasers, but the specialty single mode diodes, high precision laser beam alignment, and crystals required make this challenging. Additionally, while the diode-SHG lasers have the benefit of being directly modulate-able, they suffer from severe sensitivity to temperature, which limits their application.

Ultraviolet (UV) semiconductor laser diodes (LDs) are becoming a key technology for a number of applications such as bio-/chemical photonics, material processing, and high-density data storage. UV spectral band can be divided into UV-AI 340-400 nm, UV-AII 320-340 nm, UV-B 280-320 nm, and UV-C 280 nm in terms of effects on bio-organic and chemical substances.

SUMMARY

The present disclosure relates generally to optical techniques. More specifically, the present disclosure provides methods and device configurations for the formation of direct emitting laser diodes operating in the ultraviolet regime using nonpolar, semi-polar, or polar c-plane oriented gallium and nitrogen containing substrates for optical applications ranging in the ultraviolet (UV) spectral region, among others, including combinations thereof, and the like. Historically, the realization of high quality, high performance laser diodes operating in the UV range has been challenging for several reasons. First, since the relatively small bandgap of GaN compared to most UV wavelengths of interest will result in excessive optical absorption, the use of native GaN substrates in the laser structure as a component of the cladding region will lead to high internal loss within the laser diode. This forces either impractical growth of highly-strained, high-aluminum content ternary AlGaN cladding layers that will crack and become defective, the use of strain controlled high-aluminum content quaternary InAlGaN cladding layers that are impractical to grow on the thickness scale required for cladding regions, or the growth of the UV laser diode epi structures on foreign substrates such as AlN, silicon carbide, or sapphire. The latter approach is commonly deployed, but such devices suffer from excessive extended defects can create issues in the light emitting quantum well layers and reduce efficiency. Second, since such UV lasers require high aluminum content $Al_xGa(1-x)N$ ($x>0.05$, $x>0.10$, $x>0.20$, $x,>0.30$, $x>0.40$, $x>0.50$) quantum wells, barriers, and cladding regions the accumulated strain from the layers results in cracking and other material defects that limit the performance and lifetime of the laser diode. The growth of AlGaN layers with high AlN mole fractions, which are typically used as cladding layers to achieve optical and electrical confinement, is very difficult because of issues with poor crystalline quality. As a result of tensile strain, epitaxial AlGaN layers grown on substrates such as sapphire, AlN, SiC, and GaN suffer from dislocations and crack formation, in particular at higher AlN mole fractions or for thicker layers. AlGaN materials with high AlN mole fractions and having high crystalline quality (low dislocation density and crack-free) are necessary for the fabrication of high-performance devices.

This invention overcomes the challenges associated with conventional and known techniques for fabrication of UV laser diodes. First, by growing an epi stack containing only thin (<500 nm) n and p-type AlGaN cladding regions and/or waveguide regions and an active region comprised of 1 or more AlGaN quantum wells and barriers on a native GaN substrate, the total epi stack of highly tensile strained material can be thin to mitigate stress induced defects. Moreover, since the growth is initiated on a native GaN substrate the epitaxial interface will be pseudomorphic and be free from the defects present that form when growing on a foreign substrate.

The ability to keep the epitaxially grown portion of the cavity thin also enables the use of quaternary films (i.e. those composed of some composition of InGaAlN) for the production of nominally strain free cladding. Compositional control of quaternaries both run-to-run and within a single growth over the entire thickness of films is quite difficult when the film thickness exceeds several hundred nanometers. By keeping the quaternary cladding region thin two advantages are gained. Firstly, the thickness over which a uniform composition of quaternary that must be grown is reduced and, secondly, by reducing the thickness of the quaternary cladding one is able to grow cladding with higher strain due to unintentional variation in composition, either from run-to-run variation or within the thickness of the film, with exceeding the critical thickness for forming extended defects that relieve strain. This second benefit increases the tolerances for composition that one may accept in the growth process, leading to higher yield and lower defectivity.

By lifting this thin AlGaN containing epitaxy layer structure off the bulk GaN substrate to transfer it to a carrier wafer and sandwiching the AlGaN quantum wells and barriers between high absorption edge transparent conductive oxide layers (TCO) to form the remainder or the cladding regions, and bonding the stack to a high bandgap substrate such as AlN the optical absorption of the cladding and substrate region can be low. The result will be a high quality AlGaN based active region with low loss cladding and substrate materials. It is critical that the TCO be carefully selected such that it has appropriate conductivity and has a high energy absorption edge such that optical losses will be minimized in the UV spectral region. Gallium oxide has been recognized as a promising candidate for deep-ultraviolet transparent conductive oxides with a direct absorption edge of above 4.7 eV or <263 nm (APPLIED PHYSICS LETTERS VOLUME 81, NUMBER 28 Jul. 2002). This invention combines a novel method for transferring high quality gallium and nitrogen UV laser epitaxial structures from bulk gallium and nitrogen containing substrates to carrier wafers and positioning the said epitaxial structure between TCO cladding regions that are transparent in the deep UV spectral range to form a high performance direct emitting UV laser diode.

In an example, the present invention provides a method for fabricating a laser diode device. The method includes providing a gallium and nitrogen containing substrate member comprising a surface region, a release material overlying the surface region, an n-type aluminum, gallium, and nitrogen containing material; an active region overlying the n-type aluminum, gallium, and nitrogen containing material, a p-type aluminum, gallium, and nitrogen containing material; and a first transparent conductive oxide material overlying the p-type aluminum, gallium, and nitrogen containing material, and an interface region overlying the first transparent conductive oxide material. The method includes bonding the interface region to a handle substrate and subjecting the release material to an energy source to initiate release of the gallium and nitrogen containing substrate member.

In an example, the interface region is comprised of metal, a semiconductor and/or another transparent conductive oxide. In an example, the interface region comprises a contact material.

In an example, the energy source is selected from a light source, a chemical source, a thermal source, or a mechanical source, and their combinations. In an example, the release material is selected from a semiconductor, a metal, or a dielectric. In an example, the release material is selected from GaN, InGaN, AlInGaN, or AlGaN such that the InGaN is released using PEC etching. In an example, the active region comprises a plurality of quantum well regions.

In an example, the method comprises forming a ridge structure configured with the n-type aluminum, gallium, and nitrogen containing material to form an n-type ridge structure, and forming a dielectric material overlying the n-type aluminum, gallium, and nitrogen containing material, and forming a second transparent conductive oxide material overlying an exposed portion of the n-type aluminum, gallium, and nitrogen containing material or overlying an exposed portion of a n-type gallium and nitrogen containing material overlying the n-type aluminum, gallium, and nitrogen containing material such that active region is configured between the first transparent conductive oxide material and the second conductive oxide material to cause an optical guiding effect within the active region. In an example, the method includes forming an n-type contact material overlying an exposed portion of the n-type aluminum, gallium, and nitrogen containing material or forming an n-type contact material overlying a conductive oxide material overlying an exposed portion of the n-type aluminum, gallium, and nitrogen containing material. In an example, the method includes forming an n-type contact region overlying an exposed portion of the n-type aluminum, gallium, and nitrogen containing material or an exposed portion of an n-type gallium and nitrogen containing material overlying the n-type aluminum, gallium, and nitrogen containing material; forming a patterned transparent oxide region overlying a portion of the n-type contact region; and forming a thickness of metal material overlying the patterned transparent oxide region; wherein the p-type aluminum, gallium, and nitrogen containing material is configured as a ridge waveguide structure to form a p-type ridge structure.

In another example the method comprises depositing a transparent conductive oxide over an exposed planar n-type or p-type aluminum, gallium, and nitrogen containing material or over an exposed planar n-type or p-type gallium and nitrogen containing material and then forming a ridge structure within the transparent conductive oxide to provide lateral waveguiding. The ridge structure can be formed through dry etching, wet etching, or a lift-off technique. In an example, the transparent conductive oxide is comprised of gallium oxide, indium tin oxide, indium gallium zinc oxide, or zinc oxide. In a preferred embodiment transparent conductive oxides for laser cladding is a gallium oxide (for example beta Ga2O3 among other stoichiometries of gallium oxide). Gallium oxide can be deposited either via sputtering, evaporation, or growth from aqueous solution or via a chemical or physical vapor deposition. Gallium oxide may be grown epitaxially on the gallium and nitrogen containing layers via metal organic chemical vapor deposition or molecular beam epitaxy among other growth techniques. Gallium oxide conductivity can be controlled either by introduction of extrinsic defects such as alloying with dopant species such as, but not limited to, nitrogen, zinc and silicon among others. Conductivity and band-gap can also be controlled by alloying gallium oxide with indium oxide, indium tin oxide alloys, zinc oxide, aluminum oxide and tin oxide among others. In some embodiments the TCO layers may consist of several or more layers of different composition. For example, a thin (less than 50 nm thick) but highly conductive gallium oxide contact layer may be used to provide good electrical contact while a thicker (100-200 nm) indium tin oxide layer is used to provide electrical conductivity and lower loss.

In an example, the transparent conductive oxide is overlaid on an exposed planar n-type or p-type aluminum, gallium, and nitrogen containing material or over an exposed planar n-type or p-type gallium and nitrogen containing material using direct wafer bonding of the surface of the aluminum, gallium, and nitrogen containing material to the surface of a carrier wafer comprised primarily of TCO or coated in TCO layers. In both cases the TCO surface of the carrier wafer and the exposed aluminum, gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with one or more of acids, bases or plasma treatments to produce a surface that yields a weak bond when brought into contact with the TCO surface. For example the exposed surface of the gallium containing material may be treated to form a thin layer of gallium oxide, which being chemically similar to the TCO bonding surface will bond more readily. Furthermore the TCO and now gallium oxide terminated surface of the aluminum, gallium, and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an example, the method includes forming an n-type contact region overlying an exposed portion of the n-type aluminum, gallium, and nitrogen containing material or overlying an exposed portion of a n-type gallium and nitrogen containing material overlying the n-type aluminum, gallium, and nitrogen containing material; forming a patterned dielectric region overlying a portion of the n-type contact region; and forming a thickness of conformal metal material overlying the patterned dielectric region; wherein the p-type aluminum, gallium, and nitrogen containing material is configured as a ridge waveguide structure to form a p-type ridge structure. In an example, the dielectric region is comprised of silicon oxide or silicon nitride. In an example, the method includes forming a ridge waveguide region in or overlying the n-type aluminum, gallium, and nitrogen containing material to form an n-type ridge structure; forming a second conductive oxide region overlying the n-type aluminum, gallium, and nitrogen containing material or an exposed portion of an n-type gallium and nitrogen containing material overlying the n-type aluminum, gallium, and nitrogen containing material; and forming a metal material overlying the transparent oxide region.

In an example, the handle substrate is selected from a semiconductor, a metal, or a dielectric or combinations thereof. In an example, the handle substrate is selected from sapphire, silicon carbide, aluminum nitride, aluminum oxynitride, copper, aluminum, silicon containing metal filled vias, or others. In an example, the bonding comprising thermal bonding, plasma activated bonding, anodic bonding, chemical bonding, or combinations thereof. In an example, the surface region of the gallium and nitrogen containing substrate is configured in a polar, semipolar, or non-polar orientation.

In an example, the method further comprising forming a laser cavity oriented in a c-direction, a projection of a c-direction, an m-direction, or an a-direction and forming a pair of cleaved facets using a cleave propagated through both the handle substrate material and the gallium and nitrogen containing material. The method also further comprising forming a laser cavity oriented in a c-direction or a projection of a c-direction and forming a pair of etched facets.

In an example, the handle substrate is a silicon carbide; and further comprising separating a plurality of laser dice by initiating a cleaving process on the silicon carbide substrate material. In an example, the handle substrate is a sapphire substrate material; and further comprising separating a plurality of laser dice by initiating a cleaving process on the sapphire substrate material. In an example, the method further comprises separating a plurality of laser dice by initiating a cleaving process on the handle substrate.

In an example, the present invention provides a method for fabricating a laser diode device. The method includes providing a gallium and nitrogen containing substrate member comprising a surface region, a release material overlying the surface region, an n-type aluminum, gallium, and nitrogen containing material; an active region overlying the n-type aluminum, gallium, and nitrogen containing material, a p-type aluminum, gallium, and nitrogen containing material; and a first transparent conductive oxide region overlying the p-type aluminum, gallium, and nitrogen containing material, and an interface region overlying the conductive oxide material. The method includes bonding the interface region to a handle substrate; and subjecting the release material to an energy source to initiate release of the gallium and nitrogen containing substrate member. In an example, the method includes forming a ridge structure configured with the n-type aluminum, gallium, and nitrogen containing material, and forming a dielectric material overlying the n-type gallium and nitrogen containing material, and forming a second transparent conductive oxide material overlying an exposed portion of the n-type aluminum, gallium, and nitrogen containing material or an exposed portion of an n-type gallium and nitrogen containing material overlying the n-type aluminum, gallium, and nitrogen containing material such that active region is configured between the first transparent conductive oxide material and the second conductive oxide material to cause an optical guiding effect within the active region.

In an alternative example, the present invention provides a method for fabricating a laser diode device. The method includes providing a gallium and nitrogen containing substrate member comprising a surface region, a release material overlying the surface region, an n-type aluminum, gallium, and nitrogen containing material; an active region overlying the n-type aluminum, gallium, and nitrogen containing material, a p-type aluminum, gallium, and nitrogen containing material; and a first transparent conductive oxide region overlying the p-type aluminum, gallium, and nitrogen containing material or over a p-type gallium and nitrogen containing material, and an interface region overlying the conductive oxide material. The method includes bonding the interface region to a handle substrate and subjecting the release material to an energy source to initiate release of the gallium and nitrogen containing substrate member in no specific order. In an example, a second transparent conductive oxide material is disposed overlying an exposed portion of the n-type aluminum, gallium, and nitrogen containing material or over an exposed portion of the n-type gallium and nitrogen containing material such that active region is configured between the first transparent conductive oxide material and the second conductive oxide material. The method includes forming a ridge structure in the second conductive oxide layer to cause a lateral optical guiding effect within the active region. Forming a dielectric material overlying the second conductive oxide layer, exposing a portion of the second conductive oxide layer on the top of the ridge, and forming a metal contact layer to the exposed portion of the second conductive oxide.

In an alternative example, the present invention provides a method for fabricating a laser diode device. The method includes providing a gallium and nitrogen containing substrate member comprising a surface region, a release material overlying the surface region, an n-type aluminum, gallium, and nitrogen containing material; an active region overlying the n-type aluminum, gallium, and nitrogen containing material, a p-type aluminum, gallium, and nitrogen containing material; and a first transparent conductive oxide region overlying the p-type gallium and nitrogen containing material, and an interface region overlying the conductive oxide material. The method includes bonding the interface region to a handle substrate and subjecting the release material to an energy source to initiate release of the gallium and nitrogen containing substrate member in no particular order. The method includes forming an n-type contact region overlying an exposed portion of the n-type aluminum, gallium, and nitrogen containing material or an exposed portion of an n-type gallium and nitrogen containing material overlying the n-type aluminum, gallium, and nitrogen containing material; forming a patterned second transparent oxide region overlying a portion of the n-type contact region; and forming a thickness of metal material overlying the patterned transparent oxide region; wherein the p-type aluminum, gallium, and nitrogen containing material is configured as a ridge waveguide structure to form a p-type ridge structure.

In an example, the present invention provides a method for fabricating a laser diode device. The method includes providing a gallium and nitrogen containing substrate member comprising a surface region, a release material overlying the surface region, an n-type aluminum, gallium, and nitrogen containing material; an active region overlying the n-type aluminum, gallium, and nitrogen containing material, a p-type aluminum, gallium, and nitrogen containing material; and a first transparent conductive oxide material overlying the p-type aluminum, gallium, and nitrogen containing material, and an interface region overlying the conductive oxide material. The method includes bonding the interface region to a handle substrate and subjecting the release material to an energy source to initiate release of the gallium and nitrogen containing substrate member in no particular order. The method includes forming a cavity member comprising a waveguide structure, a first end, and a second end, and forming the first end and second end by initiating a cleaving process in the handle substrate material. In an example, a length of the cavity member is defined by the first cleaved end and the second cleaved end. The length of the cavity member is less than about 1500 um, less than about 1000 um, less than about 600 um, less than about 400 um, or less than about 200 um.

In an example, the present invention provides a method for fabricating a laser diode device. The method includes providing a gallium and nitrogen containing substrate member comprising a surface region, the surface region characterized by a nonpolar or semipolar orientation; a release material overlying the surface region, an n-type aluminum, gallium, and nitrogen containing material; an active region overlying the n-type aluminum, gallium, and nitrogen containing material, a p-type aluminum, gallium, and nitrogen containing material; and an interface region overlying the p-type aluminum, gallium, and nitrogen containing material. The method includes bonding the interface region to a handle substrate; subjecting the release material to an energy source to initiate release of the gallium and nitrogen containing substrate member and forming a cavity member comprising a waveguide structure, a first end, and a second end. The method includes forming the first end and second end by initiating a cleaving process in the handle substrate material.

In accordance with an embodiment, a method for fabricating an ultraviolet laser diode device operable at a wavelength of less than 365 nm and greater than 200 nm includes providing substrate member comprising gallium and nitrogen, the substrate member comprising a surface region; and forming an epitaxial material overlying the surface region. The epitaxial material comprises an n-type buffer layer overlying the surface region, the n-type buffer layer comprising gallium and nitrogen; an epitaxially grown sacrificial layer overlying the n-type buffer layer, the sacrificial layer comprising indium, gallium, and nitrogen and selected to absorb light with photon energies less than a band gap energy of the substrate member; an n-type cladding region overlying the sacrificial layer, the n-type cladding region comprising aluminum, indium, gallium, and nitrogen; an active region overlying the n-type cladding region, the active region comprising aluminum, indium, gallium, and nitrogen, the active region having at least one quantum well and barrier layers; and a p-type cladding region overlying the active region, the p-type cladding region comprising aluminum, indium, gallium, and nitrogen. The method also includes patterning the epitaxial material to form epitaxial mesa regions and expose the sacrificial layer; depositing a bond media on at least one of the epitaxial mesa regions; bonding the bond media on the at least one of the epitaxial mesa regions to a handle substrate; subjecting the sacrificial layer to an energy source to initiate release of the substrate member and transfer the at least one of the epitaxial mesa regions to the handle substrate; and processing the at least one of the epitaxial mesa regions to form the ultraviolet laser diode device.

In an embodiment, the method also includes forming anchors to prevent the epitaxial mesa regions from detaching from the substrate member, and breaking the anchors to separate the at least one of the epitaxial mesa regions from the substrate member.

In another embodiment, subjecting the sacrificial layer to the energy source includes using a photoelectrochemical (PEC) etching process to selectively remove the sacrificial layer.

In another embodiment, the substrate member is a bulk GaN substrate, and the surface region is configured with an offcut of less than about 10 degrees, and the surface region includes a {30-32}, {20-21}, {30-31}, {50-51}, {30-3-2}, {20-2-1}, {30-3-1}, {50-5-1}, {11-22}, or {10-1-1} orientation.

In another embodiment, the n-type buffer layer is epitaxially grown on the surface region.

In another embodiment, the sacrificial layer comprises one or more layers of $InQGa_{1-Q}N$, where $Q≥0.01$.

In another embodiment, the sacrificial layer includes a plurality of InGaN layers separated by barriers comprising gallium and nitrogen.

In another embodiment, the n-type cladding region comprises a plurality of layers of various compositions of $Al_TIn_SGa_{1-T-S}N$, where $1.0≥T≥0.0$ and $0.2≥S≥0.0$ and $T+S≤1$.

In another embodiment, the at least one quantum well comprises $Al_JIn_KGa_{1-J-K}N$ and the barrier layers comprise $Al_OIn_PGa_{1-O-P}N$, where $1.0≥J≥0.0$, $0.2≥K≥0.0$, $1.0≥O≥0.0$, $0.2≥P≥0.0$, $J+K≤1$ and $O+P≤1$.

In yet another embodiment, the p-type cladding region comprises at least one layer of $Al_XIn_YGa_{1-X-Y}N$, where $1.0≥X≥0.0$, $0.2≥Y≥0.0$, and $X+Y≤1$.

In accordance with another embodiment, a method for fabricating an ultraviolet laser diode device operable at a wavelength of less than 365 nm and greater than 200 nm includes providing substrate member comprising aluminum and nitrogen, the substrate member comprising a surface region; and forming an epitaxial material overlying the surface region. The epitaxial material comprises an n-type buffer layer overlying the surface region, the n-type buffer layer comprising aluminum and nitrogen; an epitaxially grown sacrificial layer overlying the n-type buffer layer, the sacrificial layer comprising aluminum, indium, gallium, and nitrogen and selected to absorb light with photon energies less than a band gap energy of a narrowest band gap material used in the epitaxial material; an n-type cladding region overlying the sacrificial layer, the n-type cladding region comprising aluminum, indium, gallium, and nitrogen; an active region overlying the n-type cladding region, the active region comprising aluminum, indium, gallium, and nitrogen, the active region having at least one quantum well and barrier layers; and a p-type cladding region overlying the active region, the p-type cladding region comprising aluminum, indium, gallium, and nitrogen. The method also includes patterning the epitaxial material to form epitaxial mesa regions and expose the sacrificial layer; depositing a bond media on at least one of the epitaxial mesa regions; bonding the bond media on the at least one of the epitaxial mesa regions to a handle substrate; subjecting the sacrificial layer to an energy source to initiate release of the substrate member and transfer the at least one of the epitaxial mesa regions to the handle substrate; and processing the at least one of the epitaxial mesa regions to form the ultraviolet laser diode device.

In an embodiment, the substrate member is a bulk AlN substrate, and the surface region is configured with an offcut of less than about 10 degrees, and the surface region includes a {30-32}, {20-21}, {30-31}, {50-51}, {30-3-2}, {20-2-1}, {30-3-1}, {50-5-1}, {11-22}, or {10-1-1}orientation.

A further understanding of the nature and advantages of the present invention may be realized by reference to the latter portions of the specification and attached drawings.

BRIEF DESCRIPTION OF THE DRAWINGS

The following drawings are merely examples for illustrative purposes according to various disclosed embodiments and are not intended to limit the scope of the present invention.

Figure id illustrates a GaN substrate is removed via one of several possible processes including PEC etching, laser ablation, CMP, etc. For some of these processes, a sacrificial layer may be necessary in an example. After substrate removal, a thin gallium and nitrogen containing epi-membrane will be left on top of the Ga2O3 and carrier wafer. Some p-side processing prior to bonding may be necessary depending on the final desired LD structure. The bonded epitaxially grown material will be thin<5 um. The laser structure itself will be <1.5 um of that.

Figure 1A:
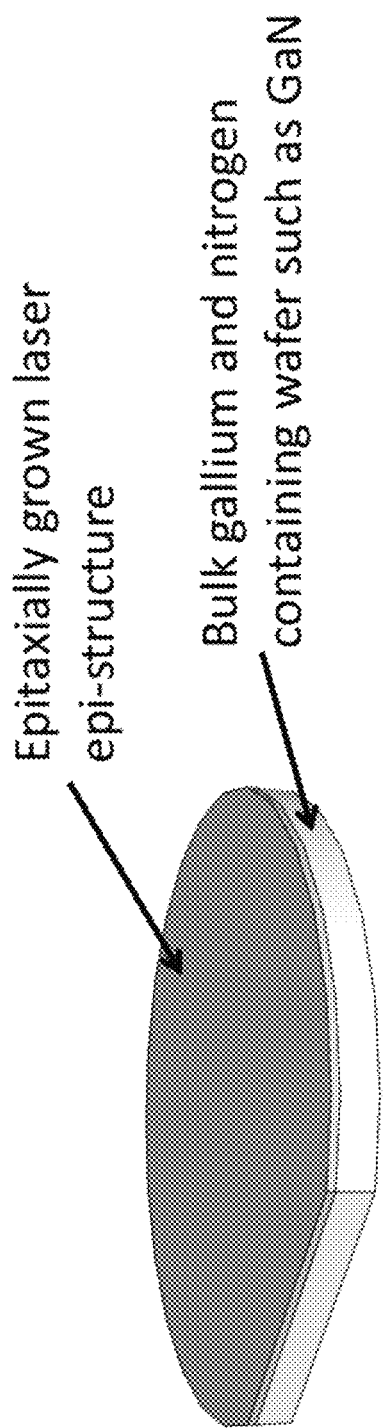
FIG. 1a illustrates an epitaxial structure including sacrificial release layer, n-type aluminum, gallium, and nitrogen containing material, and active region and p-type aluminum, gallium, and nitrogen containing material is grown on bulk gallium and nitrogen containing substrate in an example.
Figure 1B:
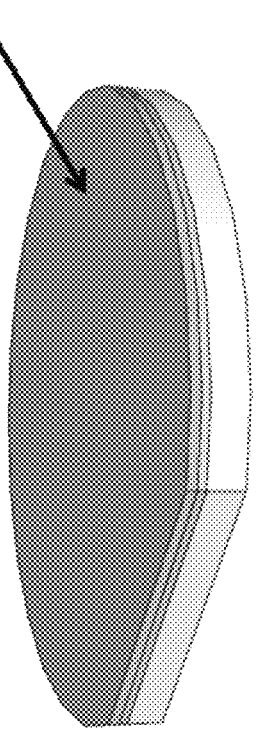
FIG. 1b illustrates a transparent conductive oxide such as GA2O3 deposited on the p-side (epi-surface) of the wafer in an example. Optionally, a metal contact layer could be deposited on the GA2O3.
Figure 1C:
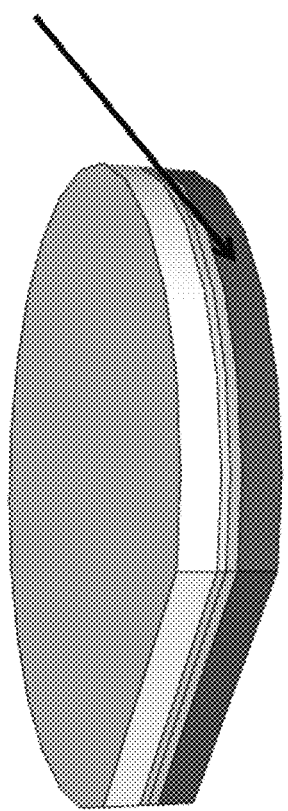
FIG. 1c illustrates a GA2O3+epi-structure+GaN substrate bonded to a handle (carrier wafer) which could be a number of different materials including aluminum nitride, silicon carbide, sapphire, or other. Indirect bonding or direct bonding could be used for this step in an example.
Figure 1D:
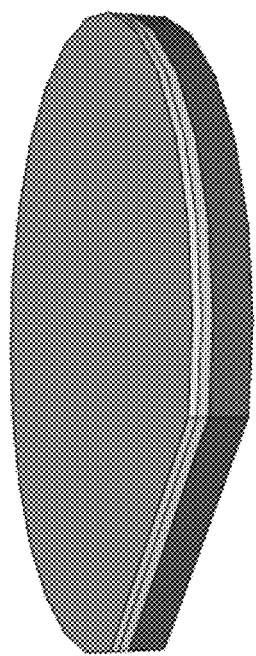
Figure 2A:
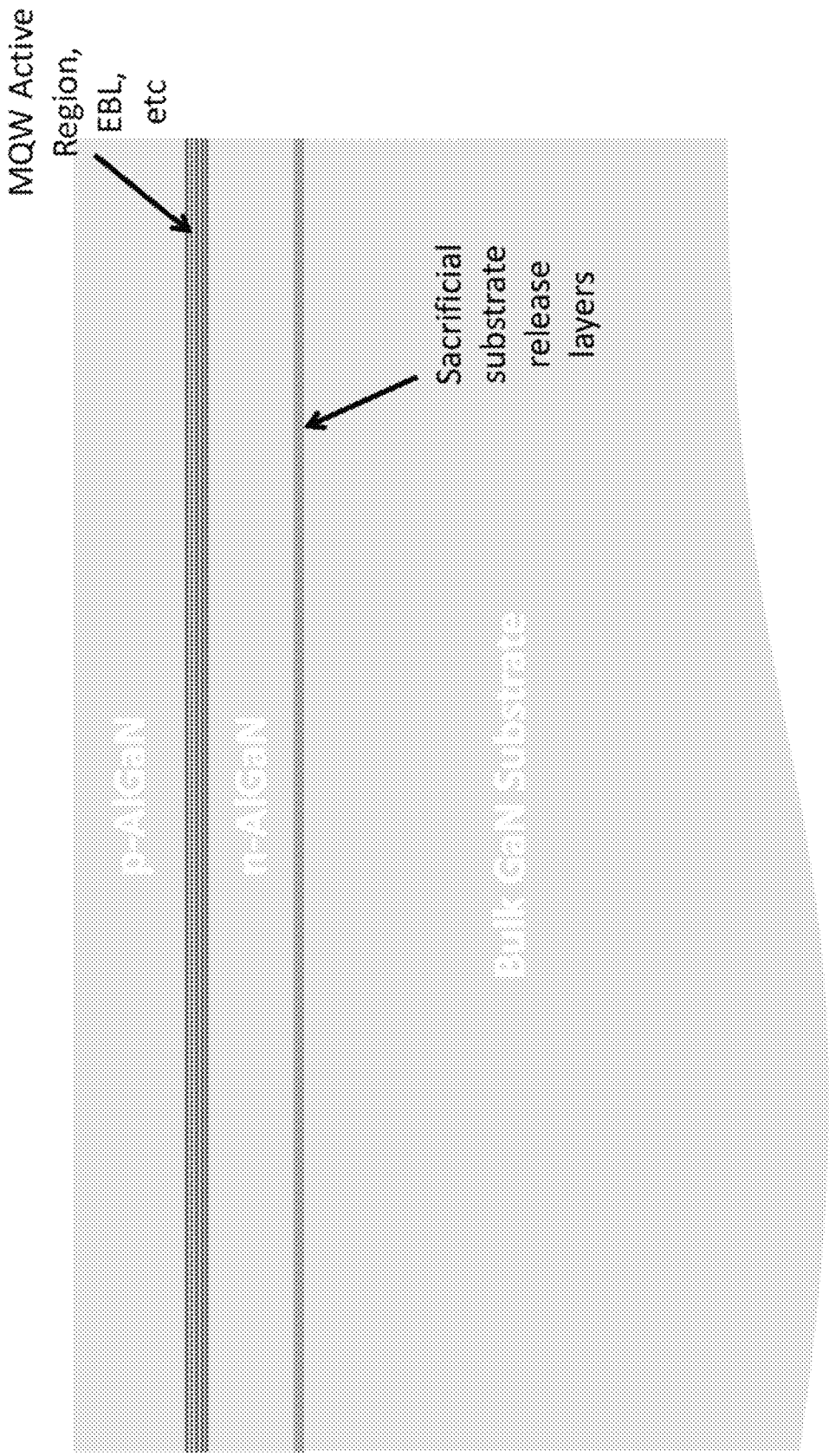

FIG. 2a is a simplified schematic of epi-structure grown on GaN substrate including a sacrificial layer in an example.

Figure 2B:
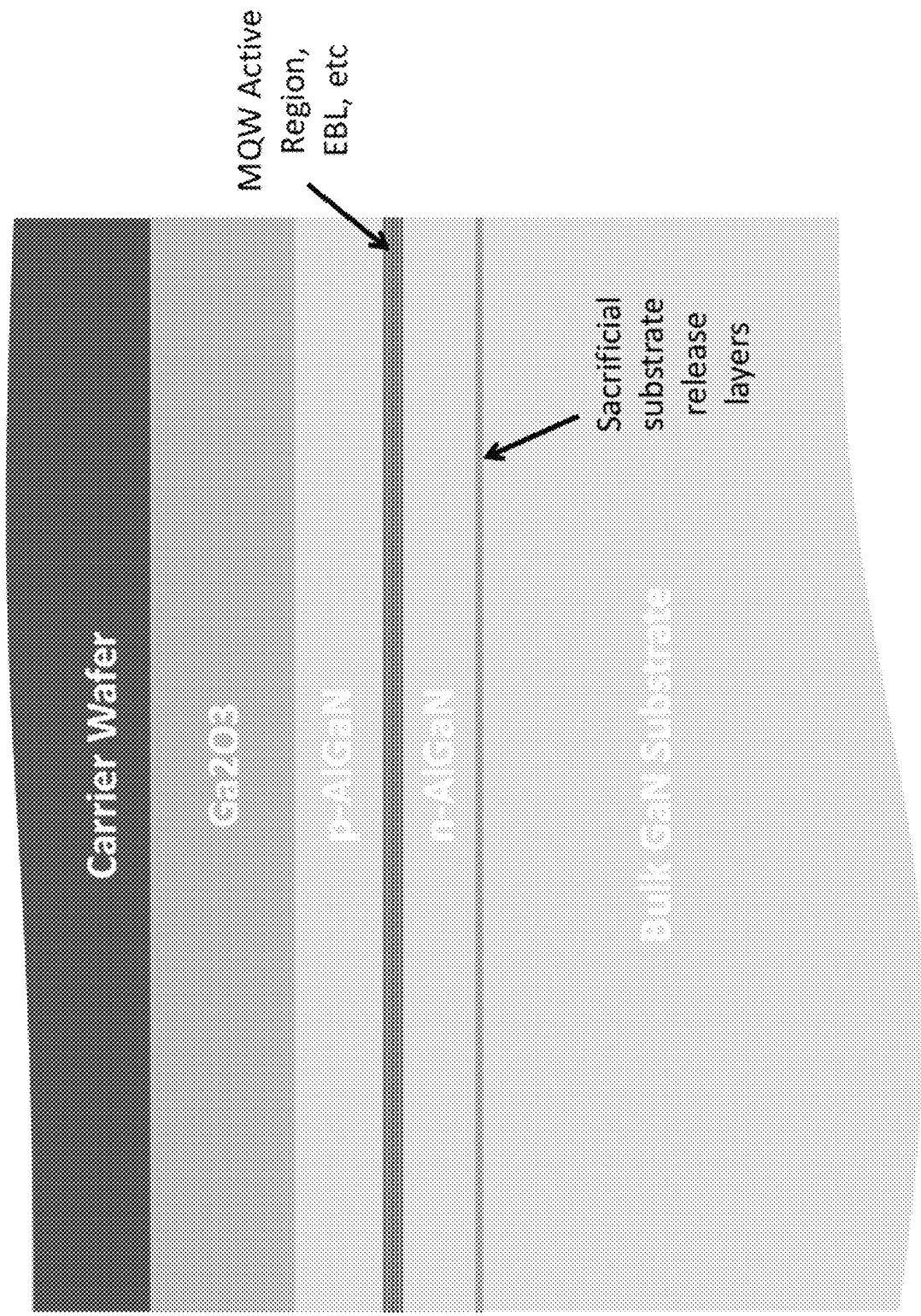

FIG. 2b is a simplified schematic of epi-structure grown on GaN substrate with a transparent conductive oxide such as Ga2O3 deposited on top of the p-type aluminum, gallium, and nitrogen containing material and a carrier wafer bonded to the top of the stack in an example.

Figure 2C:
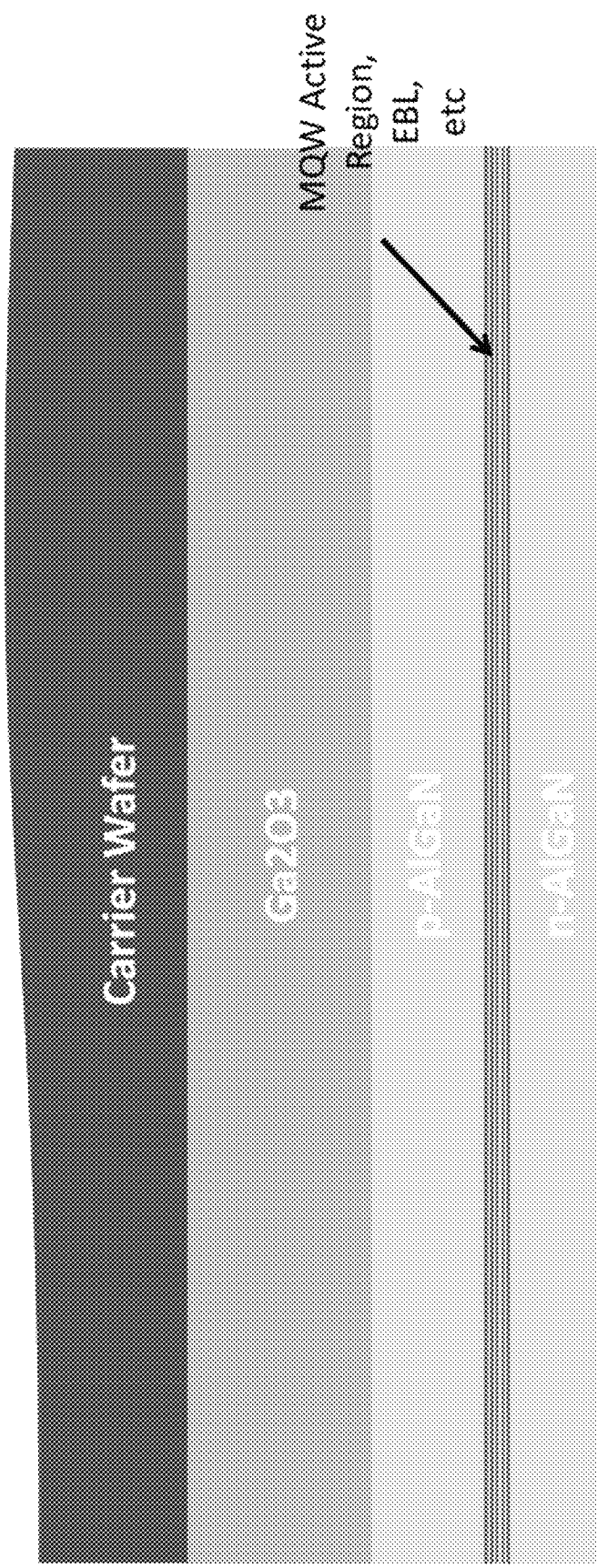

FIG. 2c is a simplified schematic of epi-structure with conductive oxide and carrier wafer after the gallium and nitrogen containing substrate has been removed in an example.

Figure 2D:
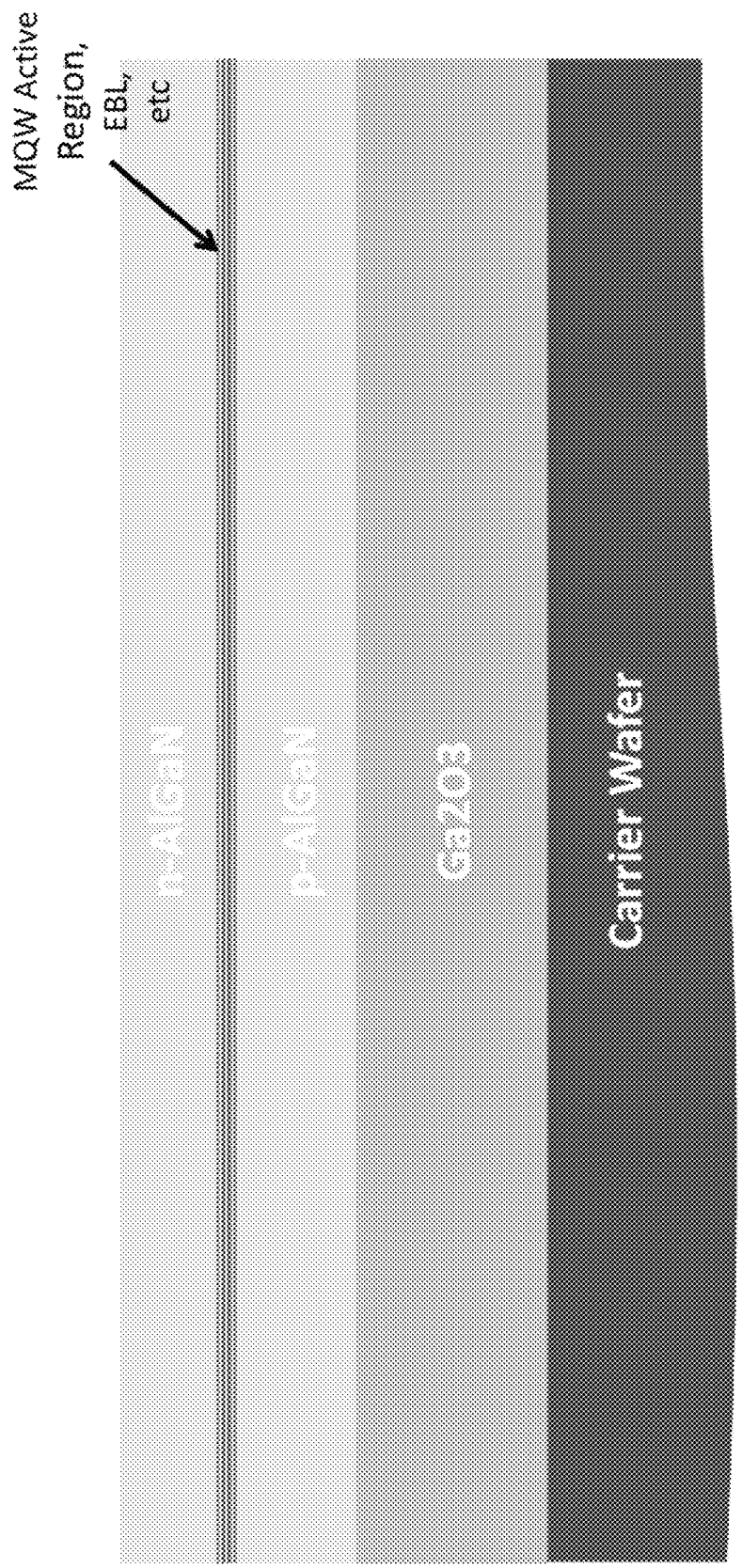

FIG. 2d is a simplified schematic of epi-structure with conductive oxide and carrier wafer after the gallium and nitrogen containing substrate has been removed in an example. The structure has been flipped over such that the carrier wafer is now the bottom of the stack.

FIG. 3a is an example schematic cross section of laser waveguide with double conductive oxide cladding showing ridge formation in n-type aluminum, gallium, and nitrogen containing material such as AlGaN in an example.

FIG. 3b is an example schematic cross section of laser waveguide with double conductive oxide cladding showing ridge formation in the conductive oxide layer overlying the n-type aluminum, gallium, and nitrogen containing material such as AlGaN in an example.

FIG. 3c is an example schematic cross section of laser waveguide with double conductive oxide cladding wherein a gallium oxide carrier wafer is used for the p-type TCO cladding. A direct bond is made between the p-type aluminum, gallium, and nitrogen containing material such as AlGaN and a conductive carrier wafer comprised of gallium oxide. The original substrate is then removed and a ridge is formed to provide lateral guiding in the now exposed n-type aluminum, gallium, and nitrogen containing material. Subsequent TCO layers, passivation layer and metal layers to provide electrical contact are overlaid.

FIG. 3d is an example schematic cross section of laser waveguide with double conductive oxide cladding showing ridge formation in p-type aluminum, gallium, and nitrogen containing material such as AlGaN.

FIG. 3e is an example schematic cross section of laser waveguide with double conductive oxide cladding showing ridge formation in n-type and in p-type aluminum, gallium, and nitrogen containing material such as AlGaN.

FIG. 3f is an example schematic cross section of laser waveguide with conductive oxide and oxide or dielectric cladding showing ridge formation in p-type aluminum, gallium, and nitrogen containing material such as AlGaN.

FIG. 4a is an example schematic cross section of an epitaxial structure containing AlGaN cladding that could be used for the fabrication of a UV laser device emitting at approximately 350 nm according to this invention.

FIG. 4b is an example schematic cross section of an epitaxial structure containing AlInGaN cladding that could be used for the fabrication of a UV laser device emitting at approximately 350 nm according to this invention.

FIG. 4c is an example schematic cross section of an epitaxial structure containing AlGaN cladding that could be used for the fabrication of a UV laser device emitting at approximately 300 nm according to this invention.

FIG. 4d is an example schematic cross section of an epitaxial structure containing AlInGaN cladding that could be used for the fabrication of a UV laser device emitting at approximately 300 nm according to this invention.

FIG. 4e is an example schematic cross section of an epitaxial structure containing AlGaN cladding that could be used for the fabrication of a UV laser device emitting at approximately 280 nm according to this invention.

FIG. 4f is an example schematic cross section of an epitaxial structure containing AlInGaN cladding that could be used for the fabrication of a UV laser device emitting at approximately 280 nm according to this invention.

FIG. 5a shows schematic diagrams of direct versus indirect wafer bonding to the handle wafer in an example. In the indirect bonding approach a layer such as a metal is used between the handle wafer and the gallium and nitrogen containing epitaxial structure.

FIG. 5b is an example illustrating a preferred cleaved facet plane aligned to the preferred cleavage plane of the handling wafer, scribing and cleaving the handling wafer will assist the cleaving of the GaN laser facet. In this example m-plane GaN lasers wafer bonded to InP. Preferred cleaved facet plane must be aligned to the preferred cleavage plane of the handling wafer.

Figure 6:
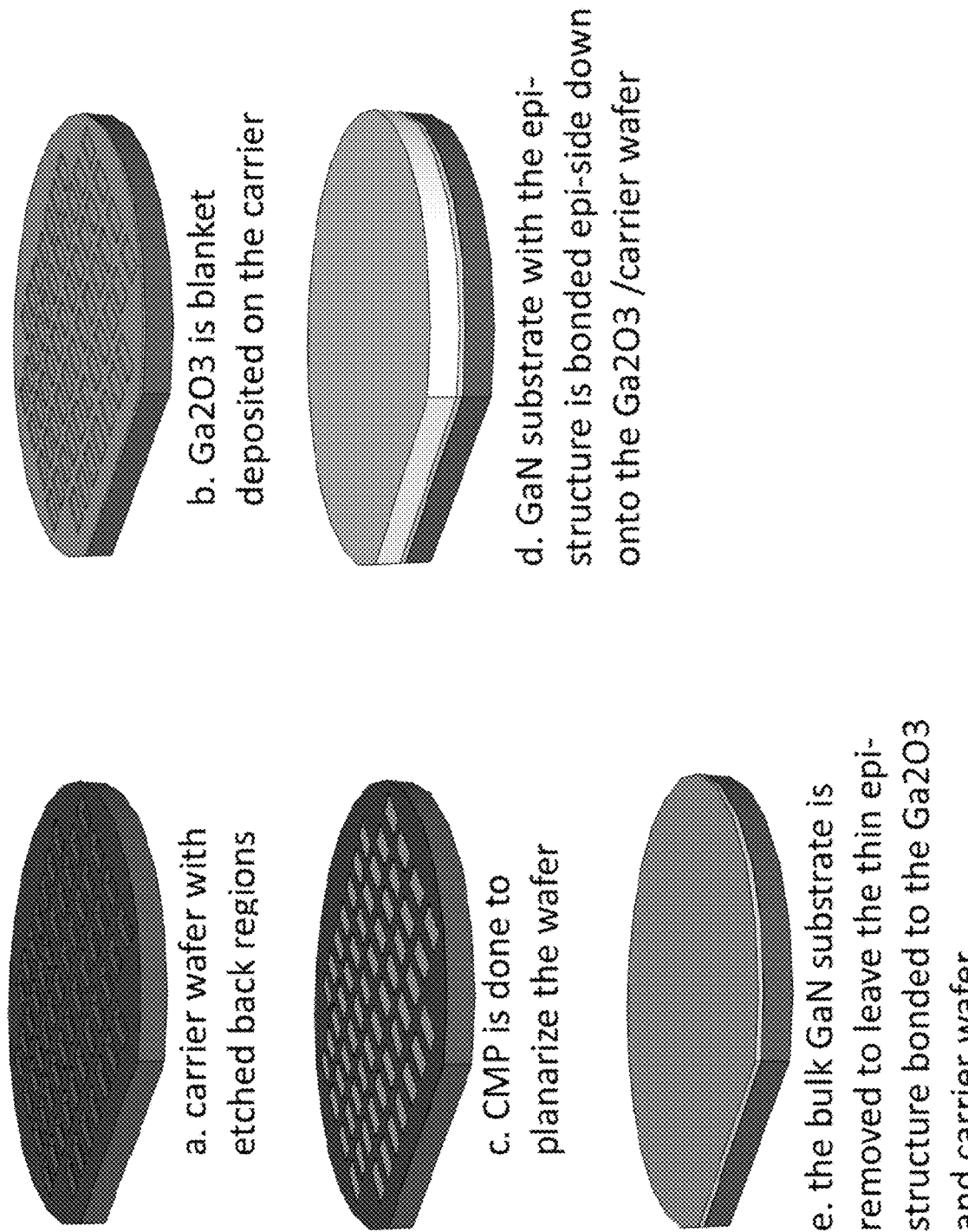

FIG. 6 is an example of a process flow that allows for direct bonding of gallium and nitrogen containing epi to a carrier wafer and GA2O3.

Figure 7A:
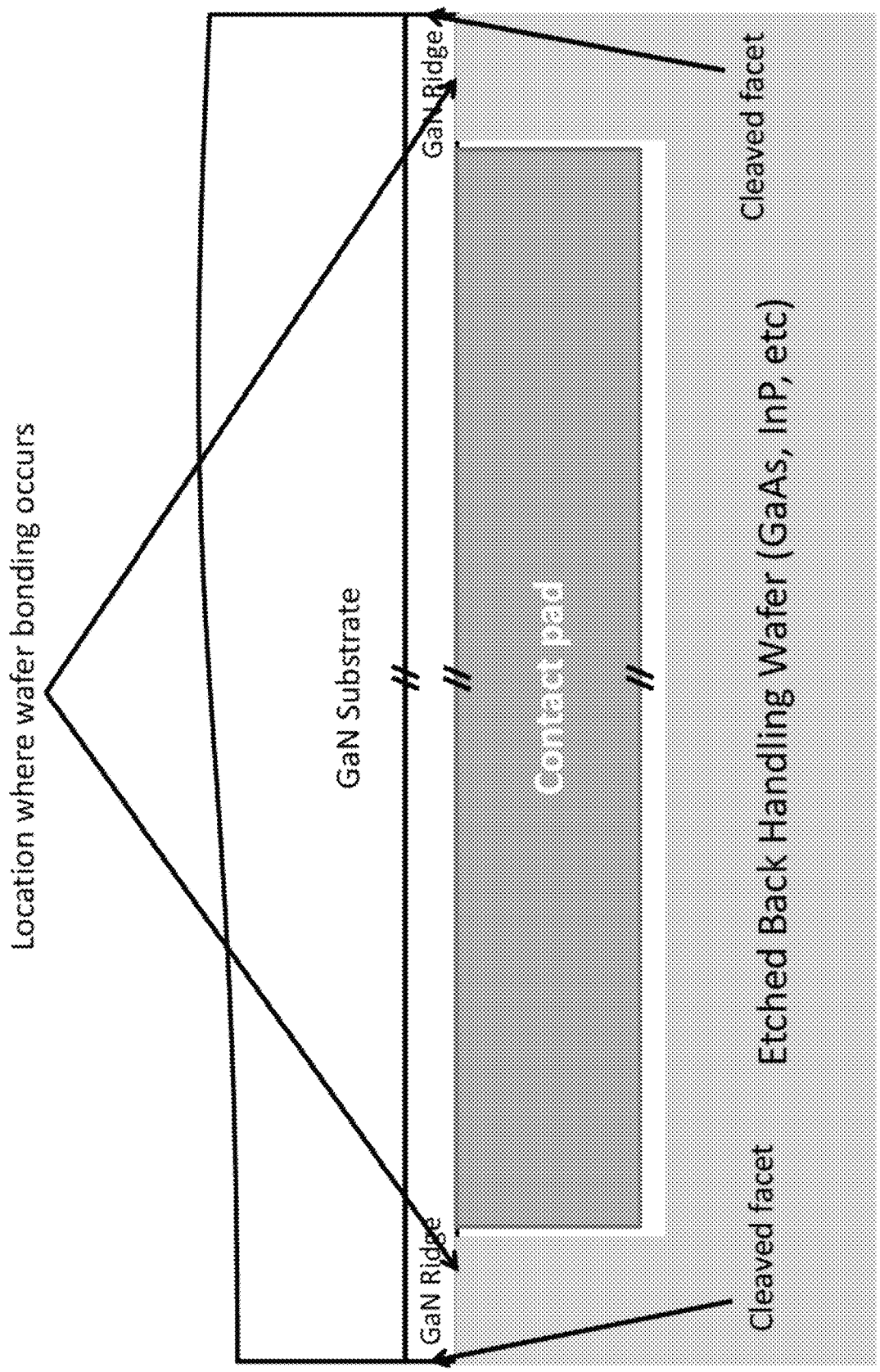

FIG. 7a is an example of a process that allows for direct/indirect bonding of GaN epi to carrier wafer after the ridge has already been formed.

Figure 7B:
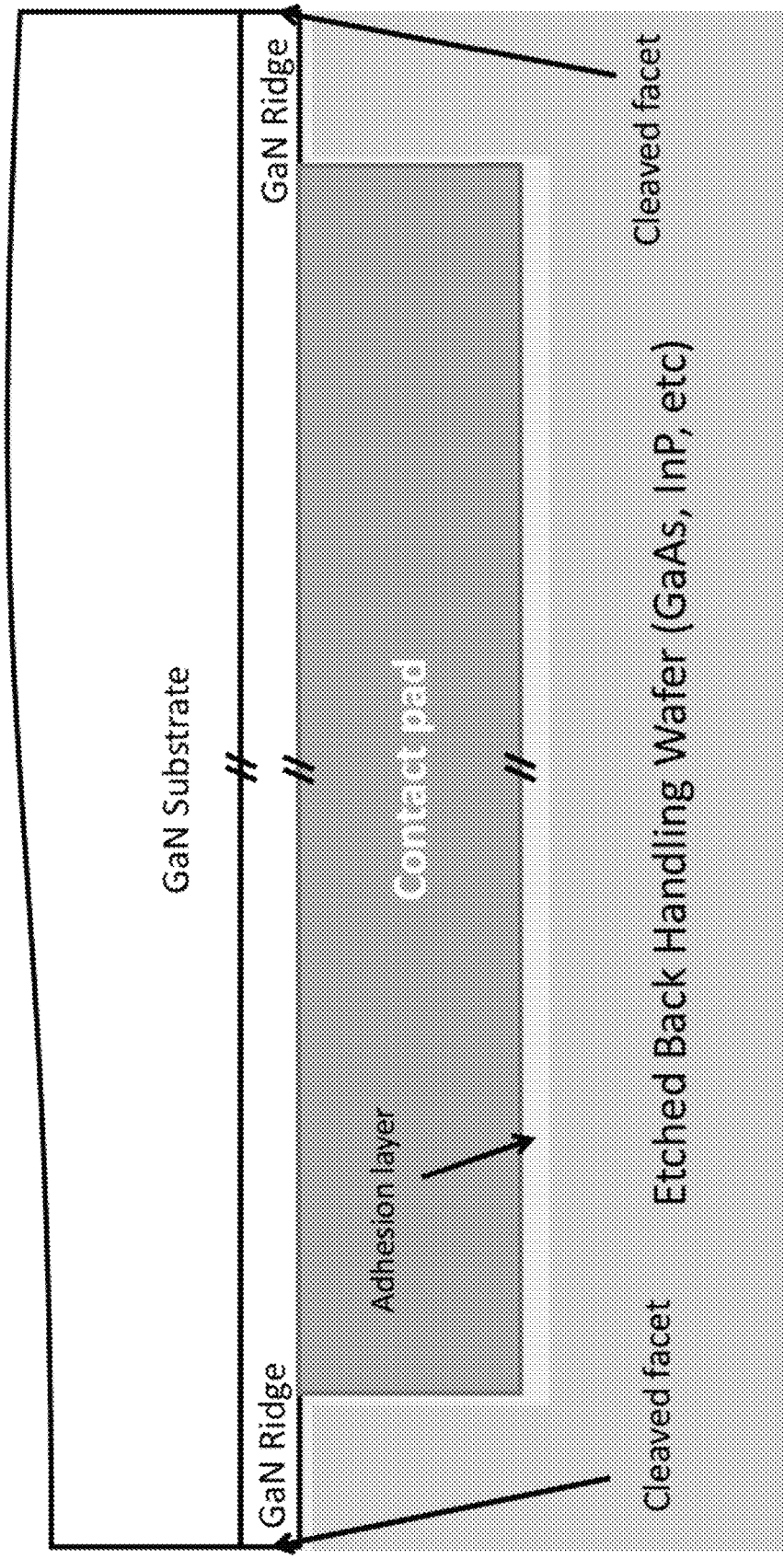

FIG. 7b is an example of a process that allows for direct/indirect bonding of gallium and nitrogen containing epi to carrier wafer after the ridge has already been formed using adhesion layer.

Figure 8:
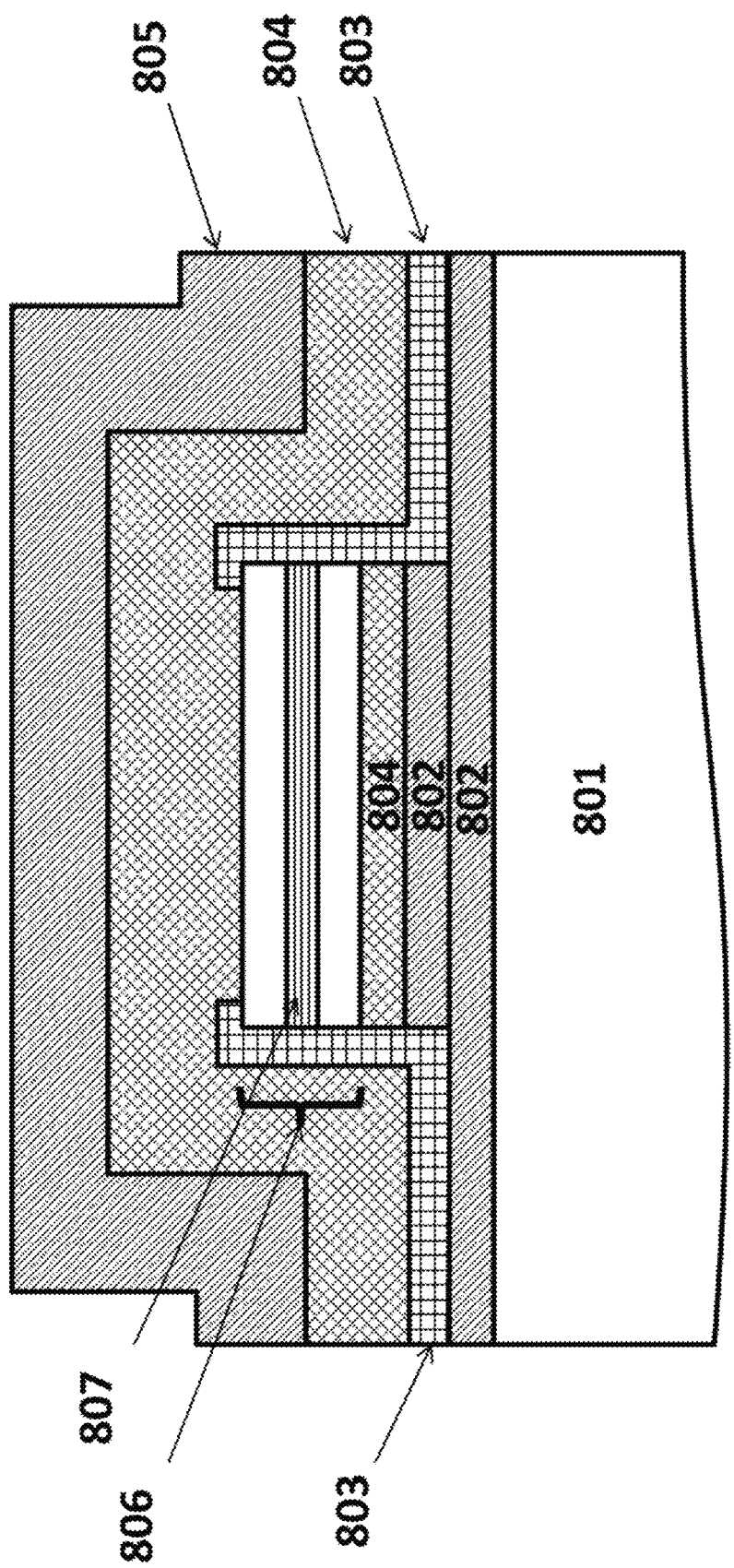

FIG. 8 is an example illustrating a ridge-less laser structure.

FIG. 9 is an example illustrating die expansion.

Figure 10:
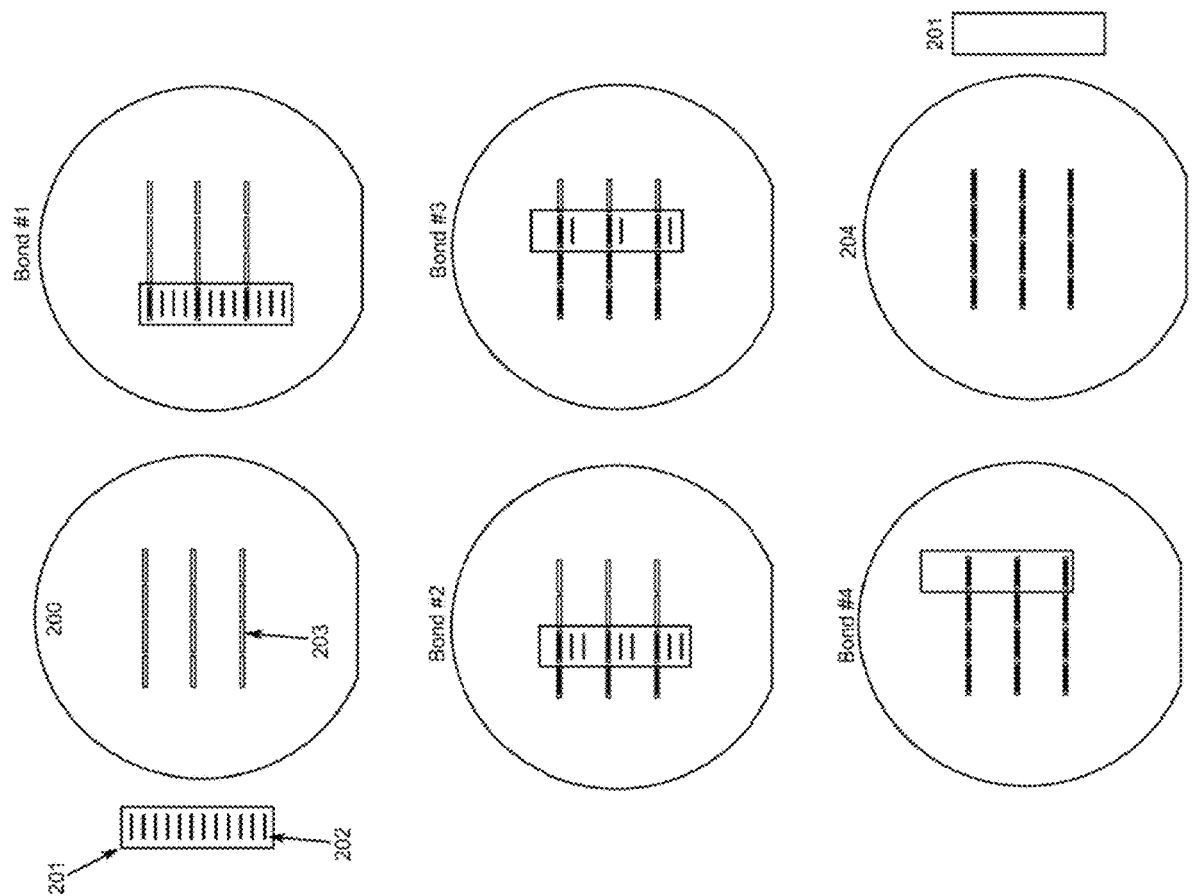

FIG. 10 is a top view of a selective area bonding process in an example.

Figure 11:
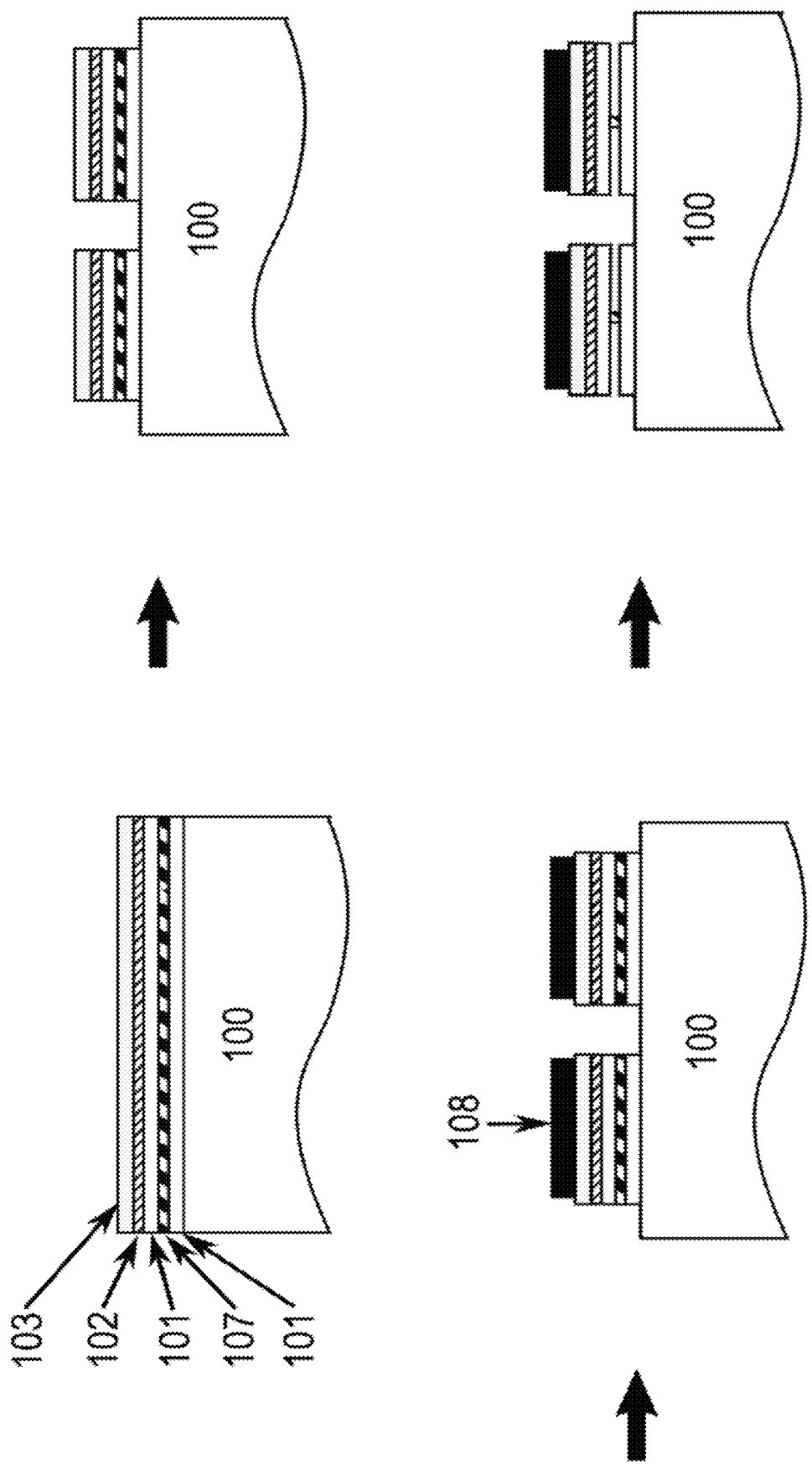

FIG. 11 is a simplified process flow for epitaxial preparation in an example.

Figure 12:
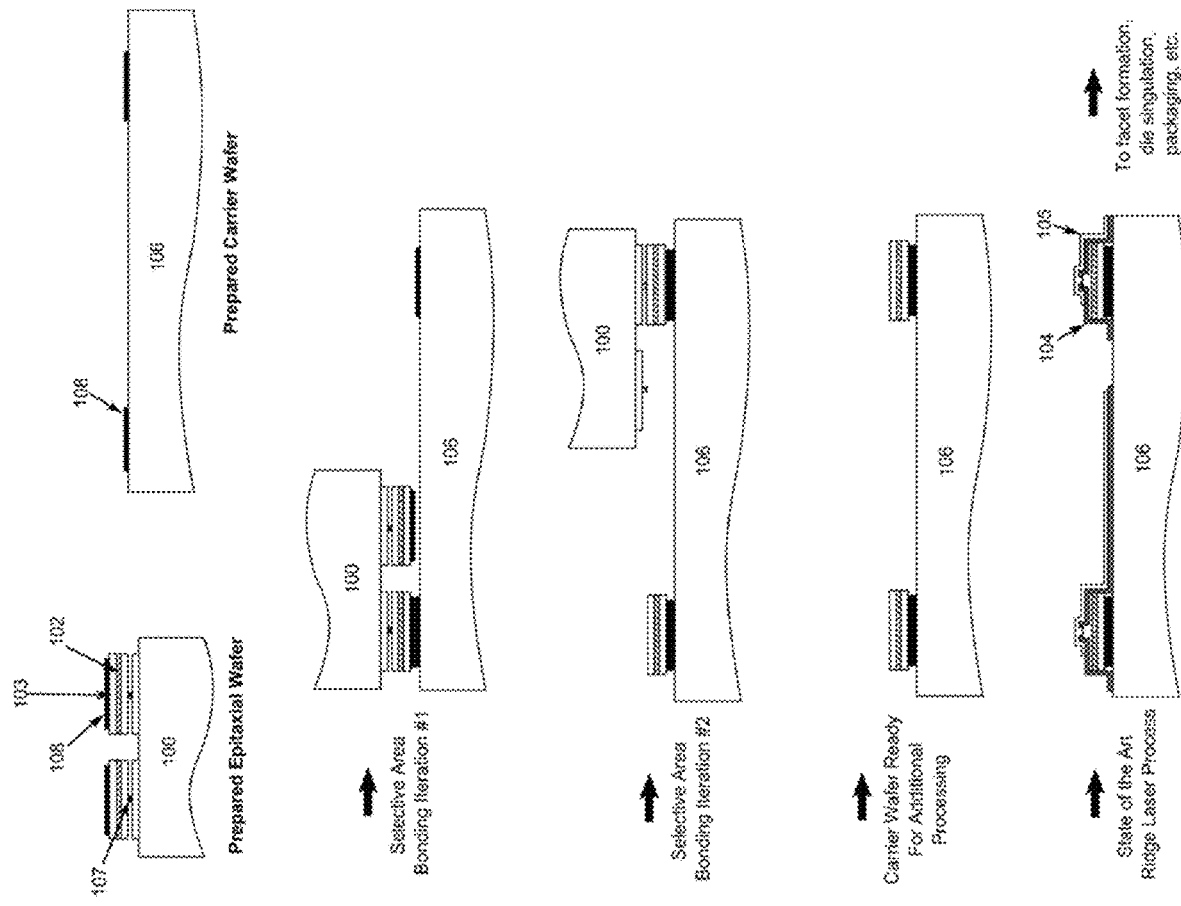

FIG. 12 is a simplified side view illustration of selective area bonding in an example.

Figure 13:
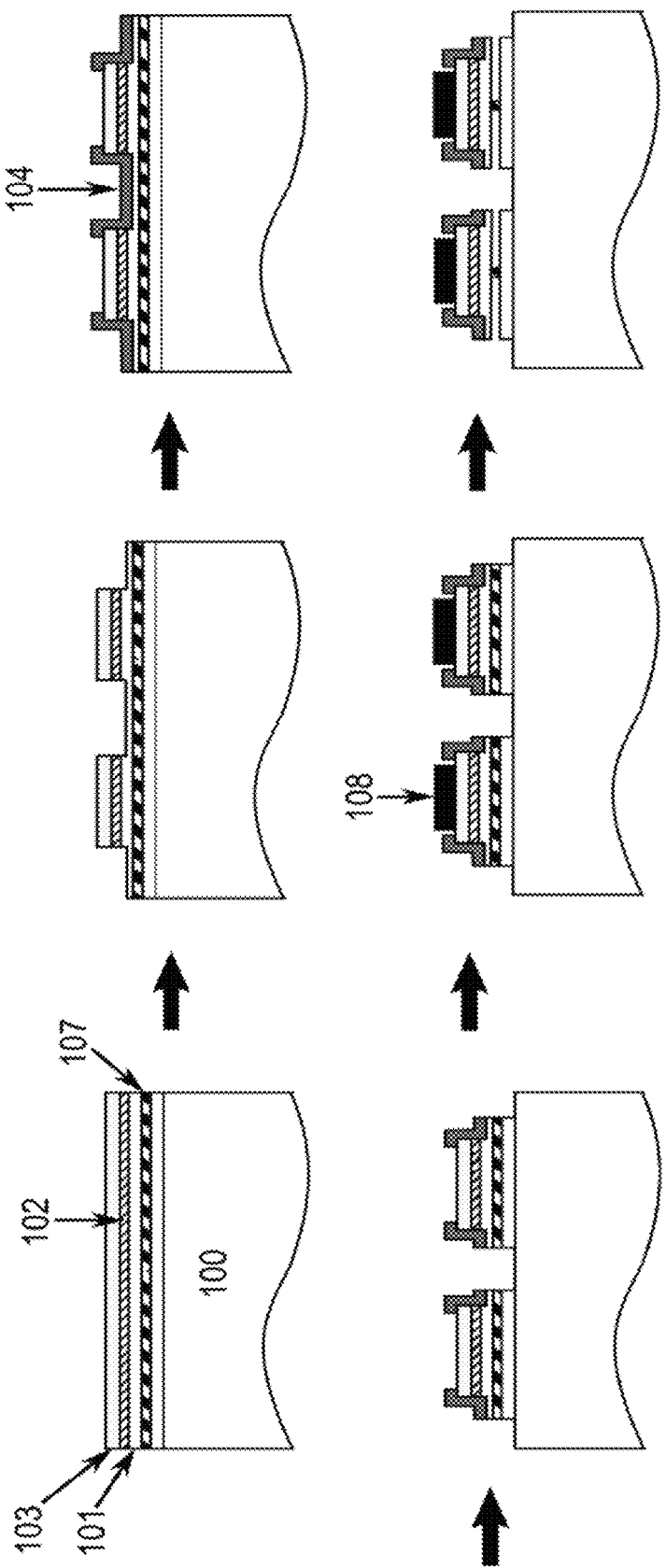

FIG. 13 is a simplified process flow of epitaxial preparation with active region protection in an example.

Figure 14:
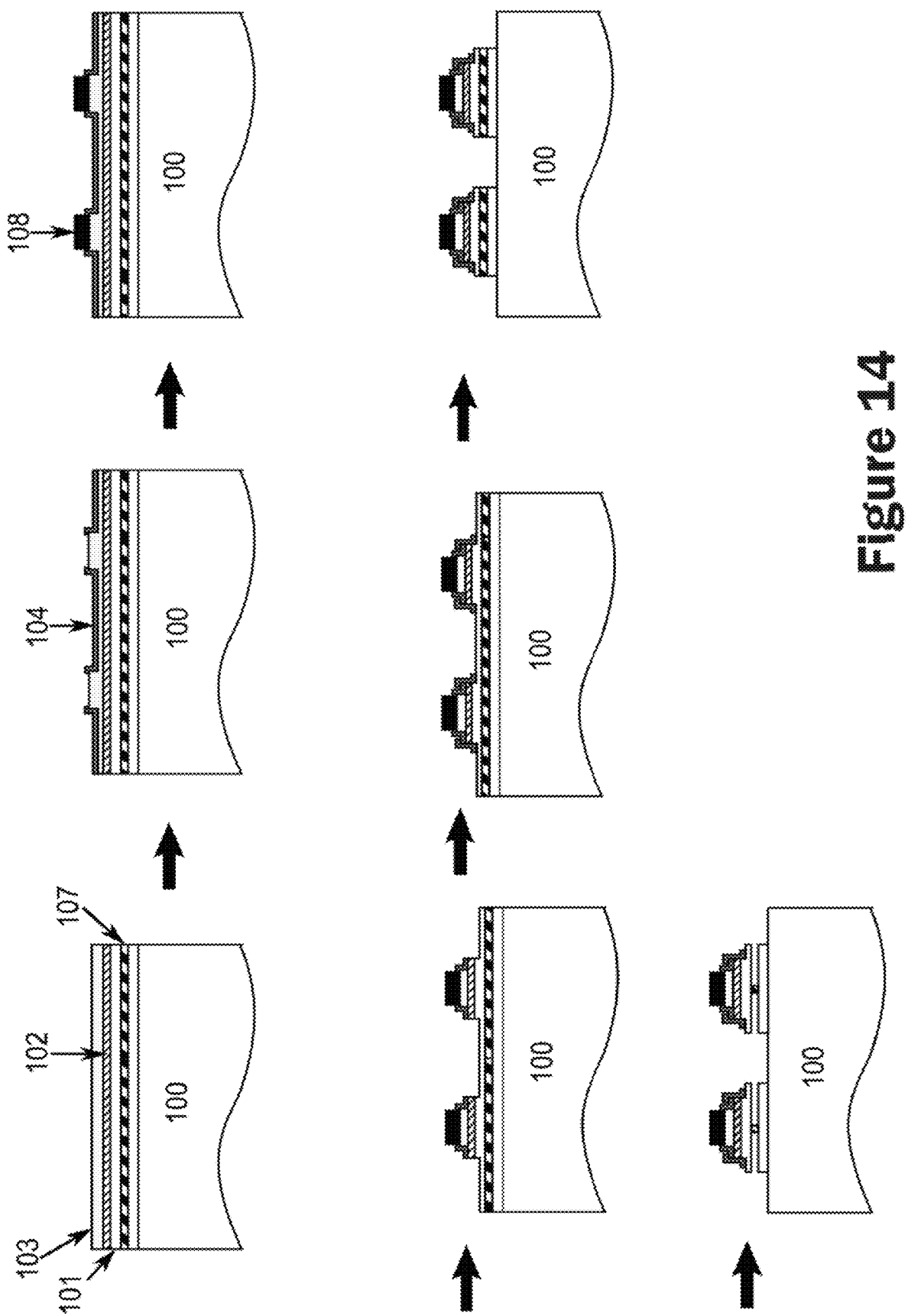

FIG. 14 is a simplified process flow of epitaxial preparation with active region protection and with ridge formation before bonding in an example.

Figure 15:
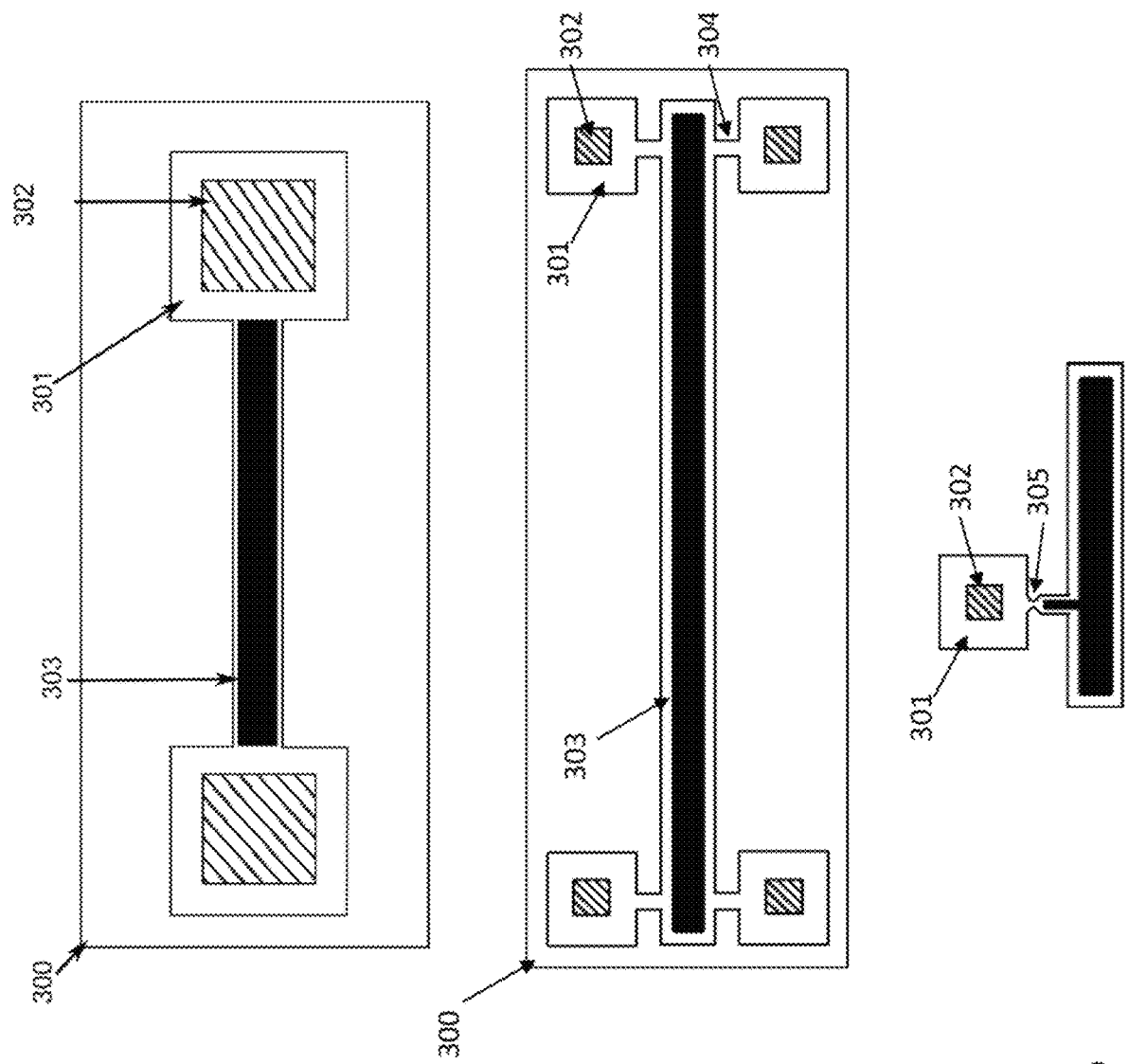

FIG. 15 is a simplified illustration of anchored PEC undercut (top-view) in an example.

Figure 16:
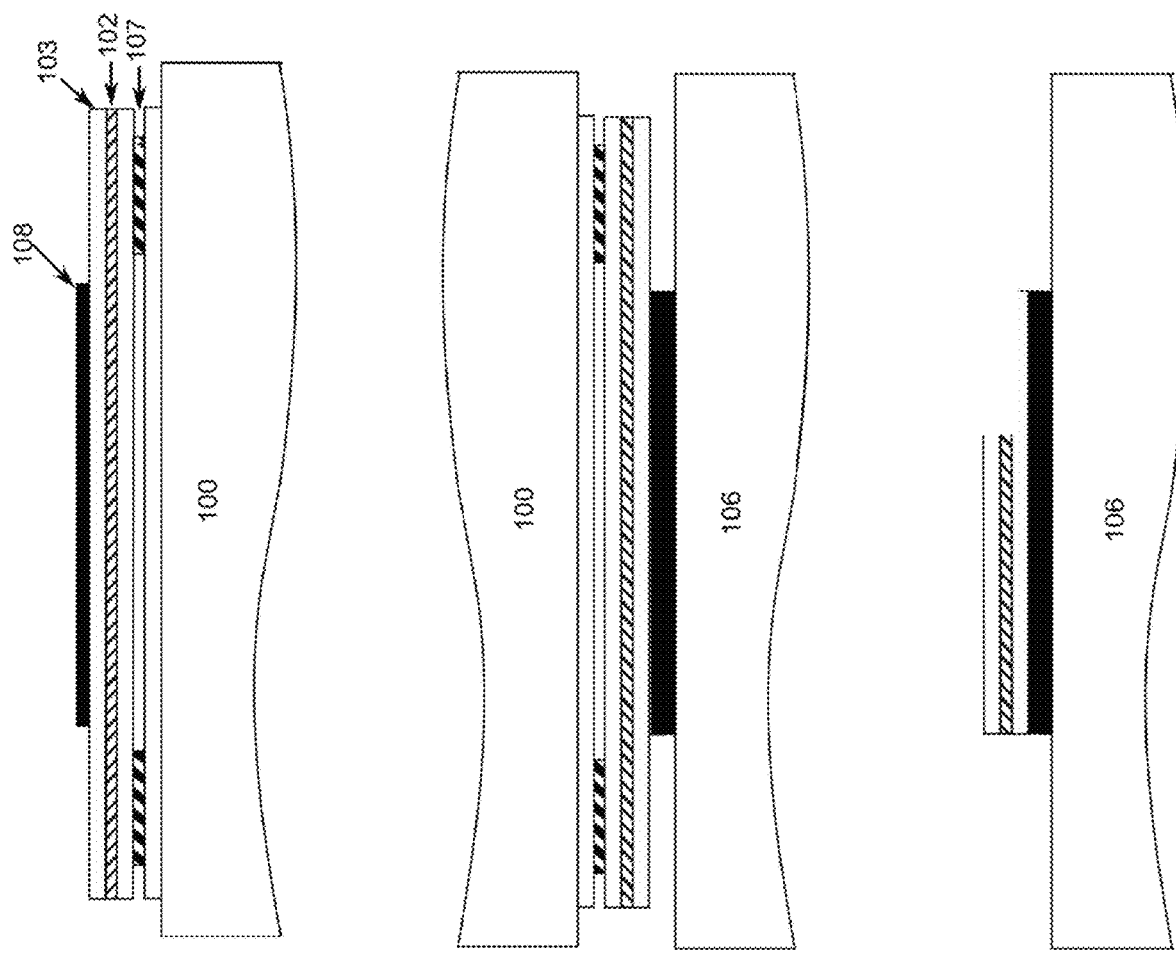

FIG. 16 is a simplified illustration of anchored PEC undercut (side-view) in an example.

FIG. 17 is top view of a selective area bonding process with die expansion in two dimensions in an example.

FIG. 18 is a plot of band gap versus lattice constant in the a-direction of the AlInGaN material system along with two polytypes of SiC in an example. The three loci shown connected to the binary alloys AlN and GaN show the values for the various ternary alloys of AlGaN, AlInN, and InGaN. The area bounded by the loci defines the allowed values for the quaternary AlGaInN alloys. The wavelength and photon energy ranges for various bands of ultra-violet light are shown; comprising UV-A (315-400 nm), UV-B (280-315 nm), and UV-C(100-280 nm).

FIG. 19 is a simplified schematic representation of the process flow in an example. An epitaxial device structure is provided comprising a substrate wafer 206, a buffer layer 205 comprising the initial layers of epitaxial growth and any layers needed to establish a sufficiently high quality film as characterized by extended or point defect density and surface roughness and morphology, an epitaxially-grown, selectively-removable sacrificial layer 204, an n-type cladding region 203, and active region 202 comprising light emitting structures such as one or more quantum well and including quantum barrier layers, electron blocking layers, and separate confinement heterostructure layers, and a p-type cladding region 201 which includes p-type contact layers for establishing electrical contact to the device. The epitaxial device wafer is patterned into a plurality of mesas using lithography and etching techniques. The etch depth between mesas is sufficiently deep to expose the selectively removable layer. A first region of bond media 208 is deposited on the p-type surface of the mesas and anchors 207 are provided to prevent the mesas from detaching from the epitaxial substrate. The sacrificial layer is then removed selectively to release the mesas from the epitaxial substrate. One or more mesas is then transferred to a carrier wafer 210 by bonding the first region of bond media 208 to a second region of bond media deposited on the carrier wafer. The anchors 207 are then broken to fully separate the epitaxial mesa from the epitaxial substrate. The bonding step is repeated until all mesas are transferred to carrier wafers.

FIG. 20 is a schematic representation of an example ultra-violet light emitting optoelectronic device epitaxial structure grown on a bulk GaN substrate.

FIG. 21 is a schematic representation of an example ultra-violet light emitting optoelectronic device epitaxial structure grown on a bulk GaN substrate.

DETAILED DESCRIPTION

The present disclosure relates generally to optical techniques. More specifically, the present disclosure provides methods and devices using nonpolar, semi-polar, or polar c-plane oriented gallium and nitrogen containing substrates for optical applications. In an example, the present disclosure describes the fabrication of a high confinement factor UV laser diode composed of a low index upper and lower transparent conductive oxide (TCO) cladding layers. In an example, this method uses conventional planar growth of a LD epi-structure on either a nonpolar, semipolar, or polar c-plane GaN substrates. A TCO is then deposited on the free epitaxial surface to form a transparent, conductive contact layer with an index of refraction lower than GaN or AlGaN films of compositions that can be grown fully strained at the thicknesses needed to provide sufficient confinement of the optical mode. Examples of TCOs are gallium oxide (Ga2O3), indium tin oxide (ITO), and zinc oxide (ZnO). ITO is the commercial standard for TCOs, and is used in a variety of fields including displays and solar cells where a semi-transparent electrical contact is desired. However, in the UV region ITO will be highly absorbing and thus may not be the ideal TCO for UV based laser diodes. ZnO offers the advantage of being a direct gap semiconductor with the same crystal structure as GaN and can be grown epitaxially on GaN at temperatures relatively low compared to growth temperatures of AlInGaN alloys. The bandgap of ZnO is also sufficiently large and similar to GaN (approx. 3.3 eV) that it will exhibit negligible band-edge absorption of visible and near UV wavelengths of light. ZnO can be deposited in a variety of ways such as metal organic chemical vapor deposition, other vapor deposition techniques, and from a solution. In a preferred embodiment, the transparent conductive oxides for UV laser diode cladding is a gallium oxide (for example beta Ga2O3 among other stoichiometries of gallium oxide). The direct absorption edge of above 4.7 eV or <263 nm makes gallium oxide an ideal candidate for UV laser cladding regions.

Gallium oxide can be deposited either via sputtering, evaporation, or growth from aqueous solution or via a chemical or physical vapor deposition. Gallium oxide may be grown epitaxially on the GaN layers via metal organic chemical vapor deposition or molecular beam epitaxy among other growth techniques. Gallium oxide conductivity can be controlled either by introduction of extrinsic defects such as alloying with dopant species such as, but not limited to, nitrogen, zinc and silicon among others. Conductivity and band-gap can also be controlled by alloying gallium oxide with indium oxide, indium tin oxide alloys, zinc oxide, aluminum oxide and tin oxide among others. In some embodiments the TCO layers may consist of several or more layers of different composition. For example, a thin (less than 50 nm thick) but highly conductive gallium oxide contact layer may be used to provide good electrical contact while a thicker (100-200 nm) indium tin oxide layer is used to provide electrical conductivity and lower loss.

The wafer is then bonded to a handle, with the free-surface of the TCO adjacent to the bonding interface. The bonding can either be direct, i.e. with the TCO in contact with the handle material, or indirect, i.e. with a bonding media disposed between the TCO and the handle material in order to improve the bonding characteristics. For example, this bonding media could be Au-Sn solder, CVD deposited SiO2, a polymer, CVD or chemically deposited polycrystalline semiconductor or metal, etc. Indirect bonding mechanisms may include thermocompression bonding, anodic bonding, glass frit bonding, bonding with an adhesive with the choice of bonding mechanism dependent on the nature of the bonding media.

Thermocompression bonding involves bonding of wafers at elevated temperatures and pressures using a bonding media disposed between the TCO and handle wafer. The bonding media may be comprised of a number of different layers, but typically contain at least one layer (the bonding layer) that is composed of a relatively ductile material with a high surface diffusion rate. In many cases this material is either Au, Al, or Cu. The bonding stack may also include layers disposed between the bonding layer and the TCO or handle wafer that promote adhesion or act as diffusion barriers should the species in the TCO or handle wafer have a high solubility in the bonding layer material. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the TCO and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Metal layer stacks may be spatially non-uniform. For example, the initial layer of a bonding stack may be varied using lithography to provide alignment or fiducial marks that are visible from the backside of the transparent substrate.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle).

Glasses in both cases could be deposited via vapor deposition or with a process involving spin on glass. In both cases the bonding areas could be limited in extent and with geometry defined by lithography or silk-screening process.

Direct bonding between TCO deposited on both the GaN and handle wafers, of the TCO to the handle wafer or between the epitaxial GaN film and TCO deposited on the handle wafer would also be made at elevated temperatures and pressures. Here the bond is made by mass transport of the TCO, GaN and/or handle wafer species across the bonding interface. Due to the low ductility of TCOs the bonding surfaces must be significantly smoother than those needed in thermocompressive bonding of metals like gold.

The embodiments of this invention will typically include a ridge of some kind to provide lateral index contrast that can confine the optical mode laterally. One embodiment would have the ridge etched into the epitaxially grown AlGaN cladding layers. In this case, it does not matter whether the ridge is etched into the p-type AlGaN layer before TCO deposition and bonding or into the n-type layer after bonding and removal of the substrate. In the former case, the TCO would have to be planarized somehow to provide a surface conducive to bonding unless a reflowable or plastically deformable bonding media is used which could accommodate large variations in height on the wafer surface. In the latter case bonding could potentially be done without further modifying the TCO layer. Planarization may be required in either case should the TCO deposition technique result in a sufficiently rough TCO layer as to hinder bonding to the handle wafer.

In the case where a ridge is formed either partially or completely with the TCO, the patterned wafer could be bonded to the handle, leaving air gaps on either side of the ridge, thereby maximizing the index contrast between the ridge and surrounding materials.

After p-side ridge processing, TCO is deposited as the p-contact. Following TCO deposition, the wafer is bonded p-side down to a carrier wafer and the bulk of the substrate is removed via laser lift-off or photochemical etching (PEC). This will require some kind of sacrificial layer on the n-side of the epi-structure.

Laser ablation is a process where an above-band-gap emitting laser is used to decompose an absorbing sacrificial (Al,In,Ga)N layer by heating and inducing desorption of nitrogen. The remaining Ga sludge is then etched away using aqua regia or HCl. This technique can be used similarly to PEC etching in which a sacrificial material between the epitaxial device and the bulk substrate is etched/ablated away resulting in separation of the epitaxial structure and the substrate. The epitaxial film (already bonded to a handling wafer) can then be lapped and polished to achieve a planar surface.

PEC etching is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

After laser lift-off, TCO is deposited as the n-contact. One version of this process flow using laser lift-off is described in FIGS. 4(a) and 4(b). Using this method, the substrate can be subsequently polished and reused for epitaxial growth. Sacrificial layers for laser lift-off are ones that can be included in the epitaxial structure between the light emitting layers and the substrate. These layers would have the properties of not inducing significant amounts of defects in the light emitting layers while having high optical absorption at the wavelengths used in the laser lift-off process. Some possible sacrificial layers include epitaxially grown layers that are fully strained to the substrate which are absorbing either due to bandgap, doping or point defectivity due to growth conditions, ion implanted layers where the implantation depth is well controlled and the implanted species and energy are tuned to maximize implantation damage at the sacrificial layer and patterned layers of foreign material which will act as masks for lateral epitaxial overgrowth.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the cladding material remaining after substrate removal can also be incorporated to allow better control of the etch process. The etch properties of the etch stop layer can be controlled solely by or a combination of alloy composition and doping. A potential etch stop layer would an AlGaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

PEC etching can be done before or after direct/indirect bonding of the free surface of the TCO to the handle material. In one case, the PEC etching is done after bonding of the p-side TCO to the handle material and the PEC etch releases the III-nitride epitaxial material from the gallium and nitrogen containing substrate. In another case, PEC etching of the sacrificial layer is done before bonding such that most of the sacrificial layer is removed and the III-nitride epitaxial material is held mechanically stable on the gallium and nitrogen containing substrate via small unetched regions. Such regions can be left unetched due to significant decrease in etch rates around dislocations or defects. TCO is then deposited on the epitaxial material and the TCO free surface is bonded to a handle wafer that can be composed of various materials. After bonding, mechanical force is applied to the handle wafer and gallium and nitrogen containing substrate to complete the release of III-nitride epitaxial material from the GaN substrate.

Substrate removal can also be achieved by mechanical lapping and polishing or chemical-mechanical lapping and polishing, in which case the substrate cannot be recovered. In cases where the laterally confining structure is on the bonded p-side of the wafer the substrate need only be thinned enough to facilitate good cleaving, in which case lapping and polishing may be an ideal removal technique.

In addition to providing ultra-high confinement active regions, this wafer bonding technique for the fabrication of Ga-based laser diodes can also lead to improved cleaved facet quality. Specifically, we describe a method for fabricating cleaved facets along a vertical plane for nonpolar (NP) and semipolar (SP) ridge laser structures grown on bulk gallium and nitrogen containing substrates.

Achieving a high quality cleaved facet for NP and SP ridge lasers can be extremely difficult due to the nature of the atomic bonding on the crystallographic planes that are orthogonal to a laser stripe oriented in the c-direction or the projection of the c-direction. In nonpolar m-plane, the desired ridge orientation is along the c-direction. Therefore, facets must be form on a crystallographic plane orthogonal to the c-direction (the c-plane). While this can be done in practice, the yield tends to be low and the facet qualities often vary. This is in part due to the high iconicity and bond strength on the c-plane, which make cleaving difficult. In some SP orientations, it is possible to achieve vertical cleavage planes that are orthogonal to the ridge direction-however, yields also tend to be low. In other SP orientations, vertical cleavage planes orthogonal to the ridge direction simply do not exist. Cleaving in these SP orientations often result in facets that are grossly angled.

In this wafer bonding process invention the epitaxial laser structure grown on top of the gallium and nitrogen containing substrate is bonded p-side down on top of a handling wafer. This can be done before/after top-side processing depending on the desired resulting laser diode (LD) structure. The handling wafer material and crystal orientation is selected to have easily achievable vertical cleavage planes (examples of such materials include Si, GaAs, InP, etc.). The LD wafer and the handling wafer can be crystallographically aligned such that the preferable cleavage direction of the handling wafer coincides with the desired cleavage plane of the ridge LD structure. The LD wafer and the handling wafer are then directly or indirectly bonded together. After bonding, the bulk gallium and nitrogen containing substrate can be removed via PEC etching, laser ablation, or chemical mechanical planarization (CMP).

Since the resulting LD epitaxial film will be thin (<5 um), scribe marks should be penetrate the epi-film completely and into the bonding wafer. Forcing a clean cleave across the desired crystallographic plane should now be easy since there is limited amount of actual epi-material to break. This method may also allow fabrication of cleaved facet LDs on certain SP orientations that was previously not possible.

The handling wafer can be selected from several possibilities including, but not limited to 6H—SiC, Si, sapphire, $MgAl_2O_4$ spinel, MgO, ZnO, $ScAlMgO_4$, GaAsInP, InP, GaAs, $TiO_2$, Quartz, $LiAlO_2$, AlN.

The above described method can also be extended into the process for die expansion.

Typical dimensions for laser cavity widths are 1-30 pm, while wire bonding pads are ~100 pm wide. This means that if the wire bonding pad width restriction and mechanical handling considerations were eliminated from the gallium and nitrogen containing chip dimension, between >3 and 100 times more laser diode die could be fabricated from a single epitaxial gallium and nitrogen containing wafer. This translates to a >3 to 100 times reduction in epitaxy and substrate costs. In certain device designs, the relatively large bonding pads are mechanically supported by the epitaxy wafer, although they make no use of the material properties of the semiconductor beyond structural support. Some embodiments of the current invention allows a method for maximizing the number of gallium and nitrogen containing laser devices which can be fabricated from a given epitaxial area on a gallium and nitrogen containing substrate by spreading out the epitaxial material on a carrier wafer such that the wire bonding pads or other structural elements are mechanically supported by relatively inexpensive carrier wafer, while the light emitting regions remain fabricated from the necessary epitaxial material.

In an embodiment, mesas of gallium and nitrogen containing laser diode epitaxy material are fabricated in a dense array on a gallium and nitrogen containing substrate. This pattern pitch will be referred to as the 'first pitch'. Each of these mesas is a 'die'. These die are then transferred to a carrier wafer at a second pitch where the second pitch is greater than the first pitch. The second die pitch allows for easy mechanical handling and room for wire bonding pads positioned in the regions of carrier wafer in-between epitaxy mesas, enabling a greater number of laser diodes to be fabricated from a given gallium and nitrogen containing substrate and overlying epitaxy material. This is referred to as "die expansion," or other terms consistent with ordinary meaning for one of ordinary skill in the art.

FIG. 9 provides side view illustrations of gallium and nitrogen containing epitaxial wafer 100 before the die expansion process and carrier wafer 1206 after the die expansion process. This figure demonstrates a roughly five times expansion and thus five times improvement in the number of laser diodes which can be fabricated from a single gallium and nitrogen containing substrate and overlying epitaxial material. Typical epitaxial and processing layers are included for example purposes and are n-AlGaN for n-side waveguide and/or cladding layers 1201, active region 1202, p-AlGaN for p-side waveguide or cladding layers 1203, insulating layers 1204, and contact/pad layers 105. Additionally, a sacrificial region 1207 and bonding material 1208 are used during the die expansion process.

In another embodiment, die expansion can be used to fabricate "ridge-less" lasers in which the epitaxial material of the entire or almost entire mesa stripe is utilized in the laser. This differs from the traditional ridge laser structure where a ridge is etched into the epitaxial material to form an index guided laser. In this embodiment for a ridge-less laser, the entire mesa is used as a gain guided laser structure. First mesas are etched and transferred onto a carrier wafer via direct/indirect bonding. The gallium and nitrogen containing substrate is removed, leaving the etched mesas on the carrier wafer at a die pitch larger than the original die pitch on the gallium and nitrogen containing carrier wafer. Dielectric material is deposited on the sidewalls of the mesa to insulate the p- and n-contacts. The dielectric material does not cover the entirety of the gallium and nitrogen containing p-contact surface. Metal or TCO is deposited on the gallium and nitrogen containing p-contact surface to form the p-contacts. This is an exemplary process in which a ridge-less LD structure may be formed through the invention described in this patent.

FIG. 8 is an example cross-section schematic of a ridge-less laser structure fabricated using the current invention. The epitaxial material 806 is transferred onto a carrier wafer

801 using the techniques discussed herein. Bonding of the epitaxial material 806 to the carrier wafer 801 can be done so via indirect metal 802 to metal 802 thermo-compressive bonding. The epitaxial material is cladded on the p- and n-side using TCO 804 to provide high modal confinement in the MQW active region 807. Insulating material 803 is deposited on the sidewalls of the mesa to insulate the p- and n-contacts. Top-side metal pad contact 805 is formed on top of the top side TCO 804.

In an example, the present techniques provide for a method for fabricating a laser diode device. The method includes providing a gallium and nitrogen containing substrate member comprising a surface region, a release material overlying the surface region, an n-type gallium and nitrogen containing material such as AlGaN; an active region overlying the n-type gallium and nitrogen containing material, an electron blocking layer overlying the active region, a p-type gallium and nitrogen containing material such as AlGaN; and an interface region overlying the p-type gallium and nitrogen containing material. The method includes bonding the interface region to a handle substrate; and subjecting the release material to an energy source, using at least PEC etching, to initiate release of the gallium and nitrogen containing substrate member, while maintaining attachment of the handle substrate via the interface region. The method also includes forming a contact region to either or both the n-type gallium and nitrogen containing material or the p-type gallium and nitrogen containing material.

Referring now back to FIG. 6*a*, an epitaxial LD structure and the GaN substrate may be bonded directly or indirectly to a handling wafer. Direct wafer bonding is bonding without the application of intermediate layers (i.e., GaN directly onto GaAs). Indirect wafer bonding is bonding with the application of an intermediate adhesion layer. When the adhesion layer material is comprised of a metal alloy, the process is often referred to as eutectic bonding.

In FIG. 6*b*, for the cleave to translate from the bonding wafer into the thin GaN LD membrane, the two wafers must be crystallographically aligned before bonding. Here, the GaN (0001) plane (or the [11-20] direction) for an m-plane LD is aligned with InP (011) plane (or [0-11] direction).

In FIG. 7, wafer bonding is sensitive to surface roughness and topography. Smooth surfaces are typically required for high yield direct wafer bonding. Direct wafer bonding of a handling wafer onto the ridge side of the LD structure would therefore likely require a pre-etched handling wafer. The pre-etched handling wafer would allow the wafer bonding to occur only on the exposed AlGaN ridge and not on the contact pads. This is depicted in the cross-sectional schematic in FIG. 3*a*. The use of a pre-etched handling wafer would also be applicable in the case where indirect bonding is used (FIG. 3*b*). Note, this pre-etched handling wafer is only necessary if there is exists a rough surface topography that may degrade the wafer bonding yield. A non-etched handling wafer may be used if bonding between two planar wafers is desired.

FIG. 9 is a side view illustration of gallium and nitrogen containing epitaxial wafer 100 before the die expansion process and carrier wafer 106 after the die expansion process. This figure demonstrates a roughly five times expansion and thus a five times increase in the number of laser diodes that can be fabricated from a single gallium and nitrogen containing substrate and overlying epitaxial material. Typical epitaxial and processing layers are included for example purposes and include AlGaN and/or n-AlGaN for n-side waveguiding and/or cladding layers 101, active region 102, AlGaN and/or p-AlGaN for p-side waveguiding or cladding regions 103, insulating layers 104, and contact/pad layers 105. Additionally, a sacrificial region 107 and bonding material 108 are used during the die expansion process.

FIG. 10 is a simplified top view of a selective area bonding process and illustrates a die expansion process via selective area bonding. The original gallium and nitrogen containing epitaxial wafer 201 has had individual die of epitaxial material and release layers defined through processing. Individual epitaxial material die are labeled 202 and are spaced at pitch 1. A round carrier wafer 200 has been prepared with patterned bonding pads 203. These bonding pads are spaced at pitch 2, which is an even multiple of pitch 1 such that selected sets of epitaxial die can be bonded in each iteration of the selective area bonding process. The selective area bonding process iterations continue until all epitaxial die have been transferred to the carrier wafer 204. The gallium and nitrogen containing epitaxy substrate 201 can now optionally be prepared for reuse.

In an example, FIG. 11 is a simplified diagram of process flow for epitaxial preparation including a side view illustration of an example epitaxy preparation process flow for the die expansion process. The gallium and nitrogen containing epitaxy substrate 100 and overlying epitaxial material are defined into individual die, bonding material 108 is deposited, and sacrificial regions 107 are undercut. Typical epitaxial layers are included for example purposes and are AlGaN and/or n-AlGaN for n-side waveguide or cladding layers 101, active region 102, and AlGaN and/or p-AlGaN for p-side waveguide regions and/or cladding regions 103.

In an example, FIG. 12 is a simplified illustration of a side view of a selective area bonding process in an example. Prepared gallium and nitrogen containing epitaxial wafer 100 and prepared carrier wafer 106 are the starting components of this process. The first selective area bonding iteration transfers a fraction of the epitaxial die, with additional iterations repeated as needed to transfer all epitaxial die. Once the die expansion process is completed, state of the art laser processing can continue on the carrier wafer. Typical epitaxial and processing layers are included for example purposes and are AlGaN and/or n-AlGaN for n-side waveguide and/or cladding layers 101, active region 102, p-AlGaN or AlGaN for p-side waveguide and/or cladding regions 103, insulating layers 104 and contact/pad layers 105. Additionally, a sacrificial region 107 and bonding material 108 are used during the die expansion process.

In an example, FIG. 13 is a simplified diagram of an epitaxy preparation process with active region protection. Shown is a side view illustration of an alternative epitaxial wafer preparation process flow during which sidewall passivation is used to protect the active region during any PEC undercut etch steps. This process flow allows for a wider selection of sacrificial region materials and compositions. Typical substrate, epitaxial, and processing layers are included for example purposes and are the gallium and nitrogen containing substrate 100, n-AlGaN and/or AlGaN for n-side cladding and/or waveguiding layers 101, active region 102, AlGaN and/or p-AlGaN for p-side waveguiding and/or cladding regions 103, insulating layers 104 and contact/pad layers 105. Additionally, a sacrificial region 107 and bonding material 108 are used during the die expansion process.

In an example, FIG. 14 is a simplified diagram of epitaxy preparation process flow with active region protection and ridge formation before bonding. Shown is a side view illustration of an alternative epitaxial wafer preparation process flow during which sidewall passivation is used to protect the active region during any PEC undercut etch steps and laser ridges are defined on the denser epitaxial wafer before transfer. This process flow potentially allows cost saving by performing additional processing steps on the denser epitaxial wafer. Typical substrate, epitaxial, and processing layers are included for example purposes and are the gallium and nitrogen containing substrate 100, AlGaN and/or n-AlGaN for n-side waveguide and/or cladding layers 101, active region 102, AlGaN and/or p-AlGaN for p-side waveguide and/or cladding layers 103, insulating layers 104 and contact/pad layers 105. Additionally, a sacrificial region 107 and bonding material 108 are used during the die expansion process.

FIG. 15 is a simplified example of anchored PEC undercut (top-view). Shown is a top view of an alternative release process during the selective area bonding of narrow mesas. In this embodiment a top down etch is used to etch away the area 300, followed by the deposition of bonding metal 303. A PEC etch is then used to undercut the region 301, which is wider than the lateral etch distance of the sacrificial layer. The sacrificial region 302 remains intact and serves as a mechanical support during the selective area bonding process. Anchors such as these can be placed at the ends of narrow mesas as in the "dog-bone" version. Anchors can also be placed at the sides of mesas (see peninsular anchor) such that they are attached to the mesa via a narrow connection 304, which is undercut and will break preferentially during transfer. Geometric features that act as stress concentrators 305 can be added to the anchors to further restrict where breaking will occur. The bond media can also be partially extended onto the anchor to prevent breakage near the mesa.

FIG. 16 is a simplified view of anchored PEC undercut (side-view) in an example. Shown is a side view illustration of the anchored PEC undercut. Posts of sacrificial region are included at each end of the epitaxial die for mechanical support until the bonding process is completed. After bonding the epitaxial material will cleave at the unsupported thin film region between the bond pads and intact sacrificial regions, enabling the selective area bonding process. Typical epitaxial and processing layers are included for example purposes and are AlGaN and/or n-AlGaN for n-side waveguide and/or cladding layers 101, active region 102, AlGaN and/or p-AlGaN for p-side waveguide and/or cladding layers 103, insulating layers 104 and contact/pad layers 105. Additionally, a sacrificial region 107 and bonding material 108 are used during the die expansion process. Epitaxial material is transferred from the gallium and nitrogen containing epitaxial wafer 100 to the carrier wafer 106. Further details of the present method and structures can be found more particularly below.

FIG. 17 is top view of a selective area bonding process with die expansion in two dimensions in an example. The substrate 901 is patterned with transferrable die 903. The carrier wafer 902 is patterned with bond pads 904 at both a second and fourth pitch that are larger than the die pitches on the substrate. After the first bonding, a subset of the laser die is transferred to the carrier. After the second bonding a complete row of die are transferred.

In an embodiment, a laser diode emitting in the ultra violet at 350 nm is grown epitaxially on GaN substrates. FIG. 4a shows a schematic cross section of the structure, which consists of an n-type buffer layer of GaN overlaying the substrate, a sacrificial region consisting of an $In_{0.1}Ga_{0.9}N/GaN$ multiquantum well structure, an $Al_{0.2}Ga_{0.8}N$ n-type cladding overlaying the sacrificial layers, an active region comprised of an $Al_{0.2}Ga_{0.8}N/GaN$ multiquantum well structure overlaid by an $Al_{0.3}Ga_{0.8}N$ electron blocking layer overlaid by an $Al_{0.2}Ga_{0.8}N$ p-type cladding region. The $Al_{0.2}Ga_{0.8}N$ cladding regions can vary in thickness from 50 to 250 nm. The sacrificial region InGaN wells can vary in number from 1 to 10 with well width varying from 1 to 6 nanometers such that the sacrificial layer absorbs light of wavelength longer than 405 nm. The active region wells are composed of GaN and the barriers of $Al_{0.2}Ga_{0.8}N$, which matches the composition and bandgap of the cladding.

In an embodiment, a laser diodes emitting in the ultra violet at 350 nm is grown epitaxially on GaN substrates using AlInGaN cladding. This has the advantage of allowing for the growth of thick cladding layers due to the closer lattice matching between GaN and various compositions of AlInGaN. FIG. 4b shows a schematic cross section of the structure, which consists of an n-type buffer layer of GaN overlaying the substrate, a sacrificial region consisting of an $In_{0.1}Ga_{0.9}N/GaN$ multiquantum well structure, an $(Al_{1-x}In_x)_y(GaN)_{1-y}$ where x=0.17±3 and y=0.3 n-type cladding overlaying the sacrificial layers, an active region comprised of an $Al_{0.2}Ga_{0.8}N/GaN$ multiquantum well structure overlaid by an $Al_{0.3}Ga_{0.8}N$ electron blocking layer overlaid by an $(Al_{1-x}In_xN)y(GaN)_{1-y}$ where x=0.17+3 and y=0.3 p-type cladding region. The AlInGaN cladding regions can vary in thickness from 50 to 250 nm. The sacrificial region InGaN wells can vary in number from 1 to 10 with well width varying from 1 to 6 nanometers such that the sacrificial layer absorbs light of wavelength longer than 405 nm. The active region wells are composed of GaN and the barriers of $Al_{0.2}Ga_{0.8}N$, which matches the composition and bandgap of the cladding.

In an embodiment, a laser diodes emitting in the ultra violet at 300 nm is grown epitaxially on GaN substrates. FIG. 4c shows a schematic cross section of the structure, which consists of an n-type buffer layer of GaN overlaying the substrate, a sacrificial region consisting of an $In_{0.1}Ga_{0.9}N/GaN$ multiquantum well structure, an $Al_{0.45}Ga_{0.55}N$ n-type cladding overlaying the sacrificial layers, an active region comprised of an $Al_{0.35}Ga_{0.65}N/Al_{0.45}Ga_{0.55}N$ multiquantum well structure overlaid by an $Al_{0.55}Ga_{0.45}N$ electron blocking layer overlaid by an $Al_{0.45}Ga_{0.55}N$ p-type cladding region. The $Al_{0.45}Ga_{0.55}N$ cladding regions can vary in thickness from 50 to 250 nm. The sacrificial region InGaN wells can vary in number from 1 to 10 with well width varying from 1 to 6 nanometers such that the sacrificial layer absorbs light of wavelength longer than 405 nm. The active region wells are composed of $Al_{0.45}Ga_{0.55}N$ and the barriers of $Al_{0.35}Ga_{0.65}N$, which matches the composition and bandgap of the cladding.

In an embodiment, a laser diodes emitting in the ultra violet at 300 nm is grown epitaxially on GaN substrates using AlInGaN cladding. This has the advantage of allowing for the growth of thick cladding layers due to the closer lattice matching between GaN and various compositions of AlInGaN. FIG. 4d shows a schematic cross section of the structure, which consists of an n-type buffer layer of GaN overlaying the substrate, a sacrificial region consisting of an $In_{0.1}Ga_{0.9}N/GaN$ multiquantum well structure, an $(Al_{1-x}In_xN)y(GaN)_{1-y}$ where x=0.17+3 and y=0.78 n-type cladding overlaying the sacrificial layers, an active region comprised of an $Al_{0.35}Ga_{0.65}N/Al_{0.45}Ga_{0.55}N$ multiquantum well structure overlaid by an $Al_{0.55}Ga_{0.45}N$ electron blocking layer overlaid by an $(Al_{1-x}In_xN)y(GaN)_{1-y}$ where x=0.17+3 and y=0.78 p-type cladding region. The AlInGaN cladding regions can vary in thickness from 50 to 250 nm.

The sacrificial region InGaN wells can vary in number from 1 to 10 with well width varying from 1 to 6 nanometers such that the sacrificial layer absorbs light of wavelength longer than 405 nm. The active region wells are composed of $Al_{0.35}Ga_{0.65}N$ and the barriers of $Al_{0.45}Ga_{0.55}N$, which matches the composition and bandgap of the cladding.

In an embodiment, a laser diode emitting in the ultra violet at 280 nm is grown epitaxially on GaN substrates. FIG. 4e shows a schematic cross section of the structure, which consists of an n-type buffer layer of GaN overlaying the substrate, a sacrificial region consisting of an $In_{0.1}Ga_{0.9}N/GaN$ multiquantum well structure, an $Al_{0.55}Ga_{0.35}N$ n-type cladding overlaying the sacrificial layers, an active region comprised of an $Al_{0.45}Ga_{0.55}N/Al_{0.55}Ga_{0.45}N$ multiquantum well structure overlaid by an $Al_{0.65}Ga_{0.35}N$ electron blocking layer overlaid by an $Al_{0.55}Ga_{0.35}N$ p-type cladding region. The $Al_{0.55}Ga_{0.35}N$ cladding regions can vary in thickness from 50 to 250 nm. The sacrificial region InGaN wells can vary in number from 1 to 10 with well width varying from 1 to 6 nanometers such that the sacrificial layer absorbs light of wavelength longer than 405 nm. The active region wells are composed of $Al_{0.45}Ga_{0.55}N$ and the barriers of $Al_{0.55}Ga_{0.45}N$, which matches the composition and bandgap of the cladding.

In an embodiment, a laser diodes emitting in the ultra violet at 280 nm is grown epitaxially on GaN substrates using AlInN cladding. This has the advantage of allowing for the growth of thick cladding layers due to the closer lattice matching between GaN and various compositions of AlInGaN. FIG. 4f shows a schematic cross section of the structure, which consists of an n-type buffer layer of GaN overlaying the substrate, a sacrificial region consisting of an $In_{0.1}Ga_{0.9}N/GaN$ multiquantum well structure, an $Al_{1-x}In_xN$ where x=0.17+3 n-type cladding overlaying the sacrificial layers, an active region comprised of an $Al_{0.45}Ga_{0.55}N/Al_{0.55}Ga_{0.45}N$ multiquantum well structure overlaid by an $Al_{0.65}Ga_{0.35}N$ electron blocking layer overlaid by an $Al_{1-x}In_xN$ where x=0.17+3 p-type cladding region. The AlInGaN cladding regions can vary in thickness from 50 to 250 nm. The sacrificial region InGaN wells can vary in number from 1 to 10 with well width varying from 1 to 6 nanometers such that the sacrificial layer absorbs light of wavelength longer than 405 nm. The active region wells are composed of $Al_{0.45}Ga_{0.55}N$ and the barriers of $Al_{0.55}Ga_{0.45}N$, which matches the composition and bandgap of the cladding.

Ultra-violet (UV) emitting optoelectronic devices are of increasing interest due to applications for example in imaging, material processing, and disinfecting of surfaces. There are, however, several challenges associated with UV emitters, especially for very short wavelength devices emitting in the UV-C band of wavelengths shorter than about 280 nm. In many cases, the epitaxial substrate material is highly absorbing of UV wavelengths. FIG. 18 shows a plot of semiconductor bandgap versus the lattice constant in the a-direction and c-direction of the AlInGaN material system along with two polytypes of SiC in an example. The three loci shown connected to the binary alloys AlN and GaN show the values for the various ternary alloys of AlGaN, AlInN, and InGaN. The area bounded by the loci defines the allowed values for the quaternary AlGaInN alloys. The wavelength and photon energy ranges for various bands of ultra-violet light are shown; comprising UV-A (315-400 nm), UV-B (280-315 nm), and UV-C(100-280 nm). For all but the longest wavelengths of the UV-A range both GaN as well as the various polytypes of SiC are absorbing of UV wavelengths. Sapphire is commonly used as a heteroepitaxial substrate for UV emitting LEDs grown using AlGaInN alloys, however it has the disadvantages of being both electrically insulating as well as having a relatively low thermal conductivity. Growth on SiC and sapphire for UV emitting devices can be especially challenging due to the inability to include relatively highly absorbing GaN layers which are commonly used to initiate growth on SiC and sapphire, and in which defect reduction mechanisms are well understood. For devices such as laser diodes, where achieving a very low density of extended defects such as threading dislocations in the epitaxial films is important for enabling high performance and high reliability operation of devices, one is constrained to growing on either bulk AlN or bulk GaN substrates. Threading dislocation densities for heteroepitaxially grown III-N films on substrates are typically 1E8 $cm^{-2}$ and above, whereas in bulk AlN and bulk GaN substrates dislocation densities well below 5E6 $cm^{-2}$ are common. Bulk GaN substrates are challenging for UV LEDs and LDs in that the GaN substrate can have a thickness greater than 300 microns or more while being relatively expensive when compared to heteroepitaxial substrates. Bulk AlN substrates are equally expensive as GaN, often have poor electrical conductivity, and are often also absorbing across most of the UV spectrum due to the high density of point defects typically found in bulk AlN relative to bulk GaN wafers.

Some embodiments comprise a method for fabricating a semiconductor optoelectronic device emitting wavelengths in the ultra-violet spectrum, fabricated from alloys of AlGaInN, including an epitaxial layer which is selectively removable, and in which the epitaxial device wafer is first patterned into a plurality of mesas, with one or more mesas being selectively released from the substrate, and with one or more of the released mesas being subsequently transferred to a carrier wafer. By using, for example, a selective etch process such as a photoelectrochemical (PEC) etch combined with a bonding process at least a portion of the epitaxial material is transferred to one or more carrier wafers. Subsequently, the carrier wafer with the bonded epitaxial material is subjected to processing steps to form optoelectronic devices emitting wavelengths in the ultraviolet spectrum.

Some embodiments involve a semiconductor device wafer composed of one or more sacrificial layers and one or more device layers overlying the surface region of a substrate wafer. The substrate wafer may comprise for example a bulk gallium and nitrogen containing material such as GaN, a bulk aluminum and nitrogen containing material such as AlN, or a heteroepitaxial substrate on which AlGaInN films can be grown. In the example of an AlN or GaN substrate, the substrate can be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the substrate surface orientation is configured with an offcut of less than about 10 degrees toward a c-direction, a-direction, and/or m-direction. Some embodiments also apply to heteroepitaxial growth of UV light emitting AlInGaN-based optoelectronic devices on substrate materials that may be absorbing of UV light, insulating, or of low thermal conductivity. Such materials may include but are not limited to SiC, sapphire, silicon, and gallium oxide.

In some embodiments, the optoelectronic device layers comprise an edge emitting laser (EEL or LD). In other embodiments, the optoelectronic device layers comprise a vertical cavity surface emitting laser (VCSEL). In other embodiments, the optoelectronic device layers comprise a light emitting diode (LED). In other embodiments the optoelectronic device layers comprise a superluminescent light emitting diode (SLED).

FIG. 19 shows a simplified schematic representation of the process flow in an example. An epitaxial device structure is provided comprising a substrate wafer 206, a buffer layer 205 comprising the initial layers of epitaxial growth and any layers needed to establish a sufficiently high quality film as characterized by extended or point defect density and surface roughness and morphology, an epitaxially-grown, selectively-removable sacrificial layer 204, an n-type cladding region 203, and active region 202 comprising light emitting structures such as one or more quantum wells and including quantum barrier layers, and a p-type cladding region 201 which includes p-type contact layers for establishing electrical contact to the device. Other layers such as electron blocking layers and separate confinement heterostructure layers may also be included. The epitaxial device wafer is patterned into a plurality of mesas using lithography and etching techniques. The etch depth between mesas is sufficiently deep to expose the selectively removable layer. A first region of bond media 208 is deposited on the p-type surface of the mesas and anchors 207 are provided to prevent the mesas from detaching from the epitaxial substrate. The sacrificial layer is then removed selectively to release the mesas from the epitaxial substrate. One or more mesas is then transferred to a carrier wafer 210 by bonding the first region of bond media 208 to a second region of bond media deposited on the carrier wafer. The anchors 207 are then broken to fully separate the epitaxial mesa from the epitaxial substrate. The bonding step may be repeated until all mesas are transferred to carrier wafers.

PEC etching is a process where AlGaInN films are etched in a relatively dilute etchant bath. Because the chemical etch process is enhanced by the presence of holes at the etched surface, the etch rate is enhanced significantly by the irradiation of the etched film with above bandgap light which enhances the etch rate by the production of electron-hole pairs. The selectivity of this etch can be enhanced by choosing a sacrificial layer material with a bandgap energy less than the photon energy of the light spectrum used to photoexcite the films while simultaneously choosing compositions for the cladding and active regions of the epitaxial device structure which have bandgap energies larger than the photon energy of the photoexcitation light spectrum. In this way, the photoexcitation provides significant enhancement of etch rate only in the sacrificial layer.

FIG. 20 shows a schematic representation of an example ultra-violet light emitting optoelectronic device structure grown on a bulk GaN substrate in accordance with an embodiment. The structure at least includes a so-called buffer layer, which includes the initial epitaxial layers grown on the substrate surface, an epitaxially grown sacrificial region which can be selectively removed, an n-type cladding region comprising one or more layers, an active region comprising one or more layers, and a p-type cladding region comprising one or more layers including a p-contact layer. A wider bandgap electron blocking layer may optionally be included. For long wavelength UV-A emission (e.g., longer than about 365 nm), the cladding layers can be GaN and light emitting layers can be InGaN alloys containing relatively low fractions of InN. For wavelengths shorter than about 365 nm this may not be advantageous as the thick GaN cladding will absorb light emitted from a UV LED or from the optical mode of a UV emitting laser diode. For devices emitting wavelengths shorter than about 365 nm, the device layers are likely to comprise various compositions of AlGaN, AlInN, and AlGaInN.

Epitaxial device structures grown on GaN substrates may have sacrificial layers which absorb light with photon energies less than the band-gap energy of GaN to ensure high selectivity between the GaN layers and the sacrificial layer. This can be achieved by using either a composition of InGaN for the sacrificial layer or quaternary AlGaInN alloy(s) with bandgap energies less than that of GaN. Similarly, a heteroepitaxial device wafer containing GaN buffer layers when grown on a heteroepitaxial substrates may also have InGaN or AlGaInN sacrificial layers which absorb light with photon energies less than the band-gap energy of GaN to ensure high selectivity between the GaN layers and the sacrificial layer.

FIG. 21 shows a schematic representation of an example ultra-violet light emitting optoelectronic device structure grown on a bulk AlN substrate in accordance with an embodiment. The structure at least includes a so-called buffer layer, which includes the initial epitaxial layers grown on the substrate surface, an epitaxially grown sacrificial region which can be selectively removed, an n-type cladding region comprising one or more layers, an active region comprising one or more layers, and a p-type cladding region comprising one or more layers including a p-contact layer. A wider bandgap electron blocking layer may optionally be included. Devices grown on AlN layers are likely to comprise various compositions of AlGaN, AlInN, and AlGaInN with lattice constants closer to AlN than GaN. Epitaxial device structures grown on AlN substrates may have sacrificial layers which absorb light with photon energies less than the band-gap energy of the narrowest bandgap material used in the structure, which is likely to be the light emitting layers of the device. In order to minimize the strain in the sacrificial layer, it may be advantageous to use the binary alloy GaN or a composition of AlGaN as the sacrificial layer as this would yield the minimal bandgap at any given lattice constant.

In an embodiment, a bulk GaN substrate is provided. In some embodiments the substrate surface orientation is configured with an offcut of less than about 10 degrees toward a c-direction, a-direction, and/or m-direction and having a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. An n-type doped GaN buffer layer is grown epitaxially on the GaN substrate. The GaN buffer layer can consist of a plurality of layers grown under different growth conditions. A sacrificial region is grown comprising one or more layers of $In_QGa_{1-Q}N$, where $Q \geq 0.01$. If the sacrificial region comprises a plurality of InGaN layers, they may be separated by barriers composed for example of GaN or AlGaN. An n-type cladding region is deposited, which may comprise a plurality of layers of various compositions of $Al_T In_S Ga_{1-T-S}N$, where $1.0 \geq T \geq 0.0$ and $0.2 \geq S \geq 0.0$ and $T+S \leq 1$. An active region is deposited, with the region comprising at least one or more quantum wells of composition $Al_J In_K Ga_{1-J-K}N$ and corresponding barriers of composition $Al_O In_P Ga_{1-O-P}N$, where $1.0 \geq J \geq 0.0$, $0.2 \geq K \geq 0.0$, $1.0 > O \geq 0 0$ $0.2 \geq P \geq 0.0$, $J+K \leq 1$ and $0+P \leq 1$. In some embodiments, the active region also contains separate confinement heterostructures on either side of the quantum wells with bandgap energies smaller than the bandgap energies of the quantum well material. In some embodiments, an electron blocking layer (EBL) is grown with a composition $Al_W In_Z Ga_{1-W-Z}N$, where the EBL bandgap energy is larger than that of the quantum barrier layers and $1.0 \geq W > 0.0$, $0.2 \geq Z > 0.0$, and $W+Z \leq 1$. Finally, a p-type cladding region is grown comprising at least one layer of composition $Al_X In_Y Ga_{1-X-Y} N$, where $1.0 \geq X \geq 0.0$, $0.2 \geq Y \geq 0.0$, and $X+Y \leq 1$.

In an embodiment, a bulk AlN substrate is provided. In some embodiments the substrate surface orientation is configured with an offcut of less than about 10 degrees toward a c-direction, a-direction, and/or m-direction and having a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. An n-type doped AlN buffer layer is grown epitaxially on the AlN substrate. The AlN buffer layer can consist of a plurality of layers grown under different growth conditions. A sacrificial region is grown comprising one or more layers of $Al_Q In_R Ga_{1-Q-R} N$, where $1.0 \geq Q \geq 0.0$, $0.2 \geq R > 0.0$, and $Q+R < 1$. If the sacrificial region comprises a plurality of $Al_Q In_R Ga_{1-Q-R} N$ layers, then they will be separated by barriers composed of AlN or AlGaInN. An n-type cladding region is deposited, which may comprise a plurality of layers of various compositions of $Al_T In_S Ga_{1-T-S} N$, where $1.0 \geq T \geq 0.0$ and $0.2 \geq S \geq 0.0$ and $T+S \leq 1$. An active region is deposited, with the region comprising at least one or more quantum wells of composition $Al_J In_K Ga_{1-J-K} N$ and corresponding barriers of composition $Al_O In_P Ga_{1-O-P} N$, where $1.0 \geq J \geq 0.0$, $0.2 \geq K \geq 0.0$, $1.0 \geq 0 \geq 0.0$, $0.2 \geq P > 0.0$, $J+K \leq 1$ and $O+P \leq 1$. In some embodiments, the active region also contains separate confinement heterostructures on either side of the quantum wells with bandgap energies smaller than the bandgap energies of the quantum well material. In some embodiments, an EBL is grown with a composition $Al_W In_Z Ga_{1-W-Z} N$, where the EBL bandgap energy is larger than that of the quantum barrier layers and $1.0 \geq W > 0.0$, $0.2 \geq Z > 0.0$, and $W+Z \leq 1$. Finally, a p-type cladding region is grown comprising at least one layer of composition $Al_X In_Y Ga_{1-X-Y} N$, where $1.0 \geq X > 0.0$, $0.2 \geq Y \geq 0.0$, and $X+Y \leq 1$.

In some embodiments, the epitaxial layers may not be fully strained to the substrate. In these cases, the relaxation may result in the formation of extended defects such as misfit dislocation and threading dislocations that extend through the epitaxial layers and intersect both the active region light emitting layers and the free surface of the epitaxial device wafer. Compositionally graded buffer regions may be used to produce layers with the minimum density of threading dislocations formed for any given degree of relaxation. These graded structures can be graded either with a composition that either varies smoothly with layer thickness, varies in a step-wise fashion whereby the buffer region comprises a plurality of layers of uniform composition that differ from adjacent layers, or a combination of smoothly varying composition with one or more instances of abrupt change in composition at the interfaces of two buffer layers. In some embodiments, compositionally graded structures may be comprised by a plurality compositions of $Al_T In_S Ga_{1-T-S} N$, where $1.0 \geq T \geq 0.0$ and $0.2 \geq S \geq 0.0$ and $T+S \leq 1$.

In some embodiments, an ultra-violet emitting LED or laser diode epitaxial device structure is grown on a bulk GaN or bulk AlN substrate. The growth is initiated on the bulk substrate and a graded n-type buffer layer is grown. Selectively removable sacrificial layers, n-type cladding, active regions and p-type cladding among other layers are grown on the n-type buffer in accordance with other embodiments. In an embodiment, the graded n-type buffer is a step-graded buffer which comprises a plurality of layers where each layer is of a different composition from adjacent layers and also has a corresponding lattice constant when fully relaxed that is different from adjacent layers. In some embodiments, the n-type step graded buffer comprises fewer than 5 layers. In some embodiments, the n-type step graded buffer comprises fewer than 10 layers. In other embodiments, the n-type step graded buffer comprises more than 10 layers. In some embodiments, the n-type graded buffer has a smoothly varying composition with no step-wise changes in composition. In some embodiments, the n-type graded buffer region is a hybrid that comprises a plurality of layers with at least one layer of uniform composition and at least two adjacent layers where there is a step-wise change in composition across the interface between the two layers. In some embodiments with a graded n-type buffer region, the grade starts with a first composition and ends with a second composition wherein the first composition corresponds to a fully-relaxed lattice constant that is different from the second composition.

The compositional grade of a graded n-type buffer region can be characterized by a first composition which is the composition of the n-type buffer at the interface with the substrate and a second composition, which is the composition of the buffer adjacent to the interface with the sacrificial region. When the substrate is a bulk GaN wafer, the first composition of the graded region may have a relaxed lattice constant that is substantially the same as the substrate. In an embodiment, the substrate is a bulk c-plane GaN wafer and the first composition of the graded buffer corresponds to a composition of $Al_T In_S Ga_{1-T-S} N$, where $T+S \leq 1$ that is substantially lattice matched to GaN with a fully-relaxed a-direction lattice constant of $0.319 \pm 0.001$ nm. In an embodiment, the substrate is a bulk c-plane AlN wafer and the first composition of the graded buffer will correspond to a composition of $Al_T In_S Ga_{1-T-S} N$, where $T+S \leq 1$ that is substantially lattice matched to AlN with a fully-relaxed a-direction lattice constant of $0.312 \pm 0.001$ nm. In embodiments, the second composition of the graded buffer corresponds to a composition of $Al_T In_S Ga_{1-T-S} N$, where $T+S \leq 1$ where the fully-relaxed a-direction lattice constant is equal to $0.317 \pm 0.001$ nm, $0.315 \pm 0.001$ nm, $0.313 \pm 0.001$ nm, or $0.312 \pm 0.001$ nm.

In an embodiment, the substrate is a bulk non-polar or semi-polar GaN wafer and the first composition of the graded buffer may correspond to a composition of $Al_T In_S Ga_{1-T-S} N$, where $T+S \leq 1$ that is substantially lattice matched to GaN with a fully-relaxed a-direction lattice constant of $0.319 \pm 0.002$ nm and a fully-relaxed c-direction lattice constant of $0.519 \pm 0.0015$. In an embodiment, the substrate is a bulk non-polar or semi-polar AlN wafer and the first composition of the graded buffer may correspond to a composition of $Al_T In_S Ga_{1-T-S} N$, where $T+S \leq 1$ that is substantially lattice matched to AlN with a fully-relaxed a-direction lattice constant of $0.312 \pm 0.001$ nm and a fully-relaxed c-direction lattice constant of $0.500 \pm 0.002$. In embodiments, the second composition of the graded buffer corresponds to a composition of $Al_T In_S Ga_{1-T-S} N$, where $T+S \leq 1$ where the fully-relaxed a-direction and c-direction lattice constants are equal to, respectively: $a = 0.317 \pm 0.001$ nm and $c = 0.5145 \pm 0.003$ nm, $0.315 \pm 0.001$ nm and $c = 0.508 \pm 0.003$ nm, $0.313 \pm 0.001$ nm and $c = 0.5035 \pm 0.003$ nm, or $0.312 \pm 0.001$ nm and $c = 0.500 \pm 0.002$ nm.

In some embodiments, the substrate is a heteroepitaxial substrate which may comprise one or more regions of material other than AlN, GaN, or alloys of AlGaInN. For example, in an embodiment, the substrate is a GaN template where GaN is grown on a silicon wafer, a SiC wafer, or a sapphire wafer. In another embodiment, the substrate is an AlN template where AlN layers have been grown on a silicon wafer, a SiC wafer, or a sapphire wafer. In some embodiments, the heteroepitaxial substrate is formed in a separate growth operation from the optoelectronic device. In other embodiments, the device layers and the layers initiating growth and establishing good film morphology are grown in the same growth operation and the growth initiation layers, coalescence layers and any layers grown to establish acceptable morphology comprise part of the buffer layer.

In an example, the present invention can be applied to a variety of applications, including defense and security, biomedical instrumentation and treatment, germicidal disinfection, water treatment, chemical curing, industrial cutting and shaping, industrial metrology, and materials processing.

In the field of defense and security, for example, UV lasers are used for remote biological and chemical agent detection. In this application, laser based Raman spectroscopy is utilized to measure molecular vibrations to quickly and accurately identify unknown substances. UV lasers have the optimal wavelength for Raman spectroscopy at stand-off distances, but the current UV-based tactical detection systems are large and expensive and have limited functionality. In addition to bio-chem agent detection, UV lasers are used for environmental sensing, atmosphere control and monitoring, pollution monitoring, and other ecological monitoring since a myriad of different compounds are detectable. Other applications within defense and security include forensics, detection of altered documents, counterfeit currency detection, and fingerprint detection. In these applications, the deep UV laser excites fluorescence in the samples, revealing information that is not detectable with visible illumination.

In biomedicine, UV lasers are used in medical diagnostics applications utilizing fluorescence spectroscopy and Raman spectroscopy to detect and characterize constituents of particular samples. Examples include confocal microscopes, spectrophotometers, flow cytometers, gel electrophoresis, and DNA analysis equipment. In addition to diagnostics, UV lasers are used in medical therapies and procedures because UV light is well absorbed by biological matter and organic compounds. Rather than burning or cutting material, pulsed UV lasers can deposit enough energy to disrupt the molecular bonds of the surface tissue, which effectively disintegrates into the air in a tightly controlled manner through ablation rather than burning. Thus UV lasers have the useful property that they can remove exceptionally fine layers of surface material with almost no heating or change to the remainder of the material, which is left intact. These properties make UV lasers well suited to precision micromachining organic material (including certain polymers and plastics), or delicate surgeries such as eye surgery LASIK. UV lasers also have applications in treating a variety of dermatological conditions including psoriasis, vitiligo, atopic dermatitis, alopecia areata and leukoderma, all of which have particular absorptions in the UV range.

Additionally, UV lasers can be used for germicidal disinfection applications deep UV light at particular wavelengths kill microorganisms in food, air, and water (purification). The UV laser light is effective in destroying the nucleic acids in these organisms so that their DNA is disrupted by the UV radiation, leaving them unable to perform vital cellular functions. The wavelength of UV that causes this effect is rare on Earth as the atmosphere blocks it. As a result, using UV laser devices in certain environments like circulating air or water systems creates a deadly effect on micro-organisms such as pathogens, viruses and molds that are in these environments. Coupled with a filtration system, UV lasers can remove harmful microorganisms from these environments. The application of UV light to disinfection has been an accepted practice since the mid-20th century. It has been used primarily in medical sanitation and sterile work facilities. Increasingly it was employed to sterilize drinking and wastewater, as the holding facilities were enclosed and could be circulated to ensure a higher exposure to the UV. In recent years UV sterilization has found renewed application in air sanitation.

In industrial applications, UV lasers are used in inspection and metrology since the imaging resolution increases with decreasing wavelength of the illumination source. Semiconductor wafer inspection equipment utilizes UV lasers for basic illumination as well as scattering and ellipsometry. Additionally, UV fluorescence is used in industrial inspection. Lasers in the UV range also permit various types of non-thermal ("cold") processing. These processes range from curing of materials such as epoxies, curing of paints and inks in industrial printing. UV lasers also enable the removal of sub-micrometer-thick layers of material, marking an object by UV photon induced color changes of the surface, surface processing including annealing, doping and planarization, Chemical Vapor Deposition (CVD), writing Bragg gratings into optical fibers, and the like. UV lasers are widely used in high-resolution photolithography machines, one of the critical technologies required for microelectronic chip manufacturing. Current state-of-the-art lithography tools use deep ultraviolet (DUV) light from the KrF and ArF excimer lasers with wavelengths of 248 and 193 nanometers (the dominant lithography technology today is thus also called "excimer laser lithography" which has enabled transistor feature sizes to shrink below 45 nanometers). Excimer laser lithography has thus played a critical role in the continued advance of the so-called Moore's law for the last 20 years.

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration such as those described in U.S. Publication No. 2010/0302464, which is incorporated herein by reference in its entirety.

In other embodiments, the present laser device can be configured in a variety of applications. Such applications include laser displays, metrology, communications, health care and surgery, information technology, and others. As an example, the present laser device can be provided in a laser display such as those described in U.S. Publication No. 2010/0302464, which is incorporated herein by reference in its entirety. Additionally, the present laser device can also include elements of co-pending U.S. Provisional Application No. 61/889,955 filed on Oct. 11, 2013, which is incorporated herein by reference in its entirety.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semipolar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention, which is defined by the appended claims.

What is claimed is:

1. A method for fabricating an ultraviolet laser diode device operable at a wavelength of less than 365 nm and greater than 200 nm, the method comprising:
   providing substrate member comprising gallium and nitrogen, the substrate member comprising a surface region;
   forming an epitaxial material overlying the surface region, the epitaxial material comprising:
      an n-type buffer layer overlying the surface region, the n-type buffer layer comprising gallium and nitrogen,
      an epitaxially grown sacrificial layer overlying the n-type buffer layer, the sacrificial layer comprising indium, gallium, and nitrogen and selected to absorb light with photon energies less than a band gap energy of the substrate member,
      an n-type cladding region overlying the sacrificial layer, the n-type cladding region comprising aluminum, indium, gallium, and nitrogen,
      an active region overlying the n-type cladding region, the active region comprising aluminum, indium, gallium, and nitrogen, the active region having at least one quantum well and barrier layers, and
      a p-type cladding region overlying the active region, the p-type cladding region comprising aluminum, indium, gallium, and nitrogen,
   patterning the epitaxial material to form epitaxial mesa regions and expose the sacrificial layer;
   depositing a bond media on at least one of the epitaxial mesa regions;
   bonding the bond media on the at least one of the epitaxial mesa regions to a handle substrate;
   subjecting the sacrificial layer to an energy source to initiate release of the substrate member and transfer the at least one of the epitaxial mesa regions to the handle substrate; and
   processing the at least one of the epitaxial mesa regions to form the ultraviolet laser diode device,
   wherein the n-type cladding region comprises a plurality of layers of various compositions of $Al_TIn_SGa_{1-T-S}N$, where $1.0 \geq T \geq 0.0$ and $0.2 \geq S \geq 0.0$ and $T+S \leq 1$.

2. The method of claim 1, further comprising forming anchors to prevent the epitaxial mesa regions from detaching from the substrate member, and breaking the anchors to separate the at least one of the epitaxial mesa regions from the substrate member.

3. The method of claim 1, wherein subjecting the sacrificial layer to the energy source includes using a photoelectrochemical (PEC) etching process to selectively remove the sacrificial layer.

4. The method of claim 1, wherein the substrate member is a bulk GaN substrate, and the surface region is configured with an offcut of less than about 10 degrees, and the surface region includes a {30-32}, {20-21}, {30-31}, {50-51}, {30-3-2}, {20-2-1}, {30-3-1}, {50-5-1}, {11-22}, or {10-1-1} orientation.

5. The method of claim 1, wherein the n-type buffer layer is epitaxially grown on the surface region.

6. The method of claim 1, wherein the sacrificial layer comprises one or more layers of $InQGa_{1-Q}N$, where $Q \geq 0.01$.

7. The method of claim 1, wherein the sacrificial layer includes a plurality of InGaN layers separated by barriers comprising gallium and nitrogen.

8. The method of claim 1, wherein the at least one quantum well comprises $Al_JIn_KGa_{1-J-K}N$ and the barrier layers comprise $Al_OIn_PGa_{1-O-P}N$, where $1.0 \geq J \geq 0.0$, $0.2 \geq K \geq 0.0$, $1.0 \geq O \geq 0.0$, $0.2 \geq P \geq 0.0$, $J+K \leq 1$ and $O+P \leq 1$.

9. The method of claim 1, wherein the p-type cladding region comprises at least one layer of $Al_XIn_YGa_{1-X-Y}N$, where $1.0 \geq X \geq 0.0$, $0.2 \geq Y \geq 0.0$, and $X+Y \leq 1$.

10. A method for fabricating an ultraviolet laser diode device operable at a wavelength of less than 365 nm and greater than 200 nm, the method comprising:
   providing substrate member comprising aluminum and nitrogen, the substrate member comprising a surface region;
   forming an epitaxial material overlying the surface region, the epitaxial material comprising:
      an n-type buffer layer overlying the surface region, the n-type buffer layer comprising aluminum and nitrogen,
      an epitaxially grown sacrificial layer overlying the n-type buffer layer, the sacrificial layer comprising aluminum, indium, gallium, and nitrogen and selected to absorb light with photon energies less than a band gap energy of a narrowest band gap material used in the epitaxial material,
      an n-type cladding region overlying the sacrificial layer, the n-type cladding region comprising aluminum, indium, gallium, and nitrogen,
      an active region overlying the n-type cladding region, the active region comprising aluminum, indium, gallium, and nitrogen, the active region having at least one quantum well and barrier layers, and
      a p-type cladding region overlying the active region, the p-type cladding region comprising aluminum, indium, gallium, and nitrogen,
   patterning the epitaxial material to form epitaxial mesa regions and expose the sacrificial layer;
   depositing a bond media on at least one of the epitaxial mesa regions;
   bonding the bond media on the at least one of the epitaxial mesa regions to a handle substrate;
   subjecting the sacrificial layer to an energy source to initiate release of the substrate member and transfer the at least one of the epitaxial mesa regions to the handle substrate; and
   processing the at least one of the epitaxial mesa regions to form the ultraviolet laser diode device.

11. The method of claim 10, further comprising forming anchors to prevent the epitaxial mesa regions from detaching from the substrate member, and breaking the anchors to separate the at least one of the epitaxial mesa regions from the substrate member.

12. The method of claim 10, wherein subjecting the sacrificial layer to the energy source includes using a photoelectrochemical (PEC) etching process to selectively remove the sacrificial layer.

13. The method of claim 10, wherein the substrate member is a bulk AlN substrate, and the surface region is configured with an offcut of less than about 10 degrees, and the surface region includes a {30-32}, {20-21}, {30-31}, {50-51}, {30-3-2}, {20-2-1}, {30-3-1}, {50-5-1}, {11-22}, or {10-1-1} orientation.

14. The method of claim 10, wherein the n-type buffer layer is epitaxially grown on the surface region.

15. The method of claim 10, wherein the sacrificial layer comprises one or more layers of $Al_Q In_R Ga_{1-Q-R} N$, where $1.0 \geq Q \geq 0.0$, $0.2 \geq R > 0.0$, and $Q+R \leq 1$.

16. The method of claim 10, wherein the sacrificial layer includes a plurality of AlInGaN layers separated by barriers comprising aluminum and nitrogen.

17. The method of claim 10, wherein the n-type cladding region comprises a plurality of layers of various compositions of $Al_T In_S Ga_{1-T-S} N$, where $1.0 \geq T \geq 0.0$ and $0.2 \geq S \geq 0.0$ and $T+S \leq 1$.

18. The method of claim 10, wherein the at least one quantum well comprises $Al_J In_K Ga_{1-J-K} N$ and the barrier layers comprise $Al_O In_P Ga_{1-O-P} N$, where $1.0 \geq J \geq 0.0$, $0.2 \geq K \geq 0.0$, $1.0 > 0\ 0.00\ 0.2 \geq P \geq 0.0$, $J+K \leq 1$ and $O+P \leq 1$.

19. The method of claim 10, wherein the p-type cladding region comprises at least one layer of $Al_X In_Y Ga_{1-X-Y} N$, where $1.0 \geq X \geq 0.0$, $0.2 \geq Y \geq 0.0$, and $X+Y \leq 1$.

\* \* \* \* \*